United States Patent
Yoshizawa

(10) Patent No.: US 9,166,573 B2
(45) Date of Patent: Oct. 20, 2015

(54) SEMICONDUCTOR DEVICE AND COMMAND CONTROL METHOD FOR THE SAME

(71) Applicant: Renesas Electronics Corporation, Kanagawa (JP)

(72) Inventor: Yutaka Yoshizawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 108 days.

(21) Appl. No.: 14/146,945

(22) Filed: Jan. 3, 2014

(65) Prior Publication Data

US 2014/0191796 A1 Jul. 10, 2014

(30) Foreign Application Priority Data

Jan. 7, 2013 (JP) ................................. 2013-000666

(51) Int. Cl.
*H03H 11/40* (2006.01)
*H03K 5/00* (2006.01)

(52) U.S. Cl.
CPC . *H03K 5/00* (2013.01); *H03H 11/40* (2013.01)

(58) Field of Classification Search
CPC ................................ H03H 11/40; H03K 5/00

USPC .......... 327/524, 560, 561, 562, 564, 565, 566
See application file for complete search history.

(56) References Cited

U.S. PATENT DOCUMENTS

| 4,446,440 A * | 5/1984 | Bell ................................ 330/10 |
| 6,226,562 B1 * | 5/2001 | Philpott ........................ 700/117 |
| 2004/0263231 A1 * | 12/2004 | Trafton et al. ................ 327/327 |
| 2005/0151680 A1 | 7/2005 | Kearney |

FOREIGN PATENT DOCUMENTS

JP 2007-531408 11/2007

* cited by examiner

*Primary Examiner* — William Hernandez
(74) *Attorney, Agent, or Firm* — Foley & Lardner LLP

(57) ABSTRACT

According to an aspect of the present invention, in a semiconductor device, a plurality of commands for specifying a circuit configuration of an analog front-end unit are transmitted from a processing unit to the analog front-end unit, an analysis is performed on the plurality of commands received by the analog front-end unit, and when a circuit configuration of the analog front-end unit which is to be updated and is determined according to the plurality of commands includes a forbidden condition that has been previously set, updating processing of the circuit configuration according to the plurality of commands is stopped.

20 Claims, 66 Drawing Sheets

EXAMPLE OF CHANGING TOPOLOGY (CIRCUIT CONFIGURATION) OF OPERATIONAL AMPLIFIER

EXAMPLE OF CHANGING PARAMETER (CIRCUIT CHARACTERISTICS) OF NON-INVERTING AMPLIFIER

| ADDRESS | REGISTER NAME | ATTRIBUTE | DATA | | | | | | | |
|---|---|---|---|---|---|---|---|---|---|---|
| | | | D7 | D6 | D5 | D4 | D3 | D2 | D1 | D0 |
| 00h | CIRCUIT FORMAT SETTING AMP1 | R/W | 113a | 113b | 113c | SW00 | SW10[1:0] | | SW11[1:0] | |
| 01h | CIRCUIT FORMAT SETTING AMP2 | R/W | 123a | 123b | 123c | | SW12[1:0] | | SW13[1:0] | |
| 02h | CIRCUIT FORMAT SETTING AMP3 | R/W | 143a | 143b | 143c | | SW14[1:0] | | SW15[1:0] | |

Fig. 23

<CIRCUIT FORMAT DATABASE FOR AMP1>

| CIRCUIT FORMAT | D7(113a) | D6(113b) | D5(113c) |
|---|---|---|---|
| INVERTING AMPLIFIER | 0 | 1 | 1 |
| NON-INVERTING AMPLIFIER | 0 | 1 | 0 |
| DIFFERENTIAL AMPLIFIER | 0 | 0 | 1 |
| I/V AMPLIFIER | 1 | 1 | 1 |

Fig. 24

<INVERTING AMPLIFIER>

<CONTENTS OF FORBIDDEN CONNECTION DATABASE FOR INVERTING AMPLIFIER>

| FORBIDDEN MODE | 5 LSBs OF COMMAND | ERROR CODE |
|---|---|---|
| SW00 TURNED ON | 1xxxx | 00h |
| SW10 SELECTS DAC INPUT | x11xx | 01h |
| SW11 SELECTS EXTERNAL INPUT | xxx01 | 02h |

<NON-INVERTING AMPLIFIER>

<CONTENTS OF FORBIDDEN CONNECTION DATABASE FOR NON-INVERTING AMPLIFIER>

| FORBIDDEN MODE | 5 LSBs OF COMMAND | ERROR CODE |
|---|---|---|
| SW00 TURNED ON | 1xxxx | 10h |
| SW10 SELECTS EXTERNAL INPUT | x01xx | 11h |
| SW11 SELECTS DAC INPUT | xxx11 | 12h |

<DIFFERENTIAL (SUBTRACTING) AMPLIFIER>

<CONTENTS OF FORBIDDEN CONNECTION DATABASE FOR SUBSTRACTING (DIFFERENTIAL) AMPLIFIER>

| FORBIDDEN MODE | 5 LSBs OF COMMAND | ERROR CODE |
|---|---|---|
| SW00 TURNED ON | 1xxxx | 20h |
| SW10 SELECTS DAC INPUT | x11xx | 21h |
| SW11 SELECTS DAC INPUT | xxx11 | 22h |

<CONTENTS OF FORBIDDEN CONNECTION DATABASE FOR I/V AMPLIFIER>

| FORBIDDEN MODE | 5 LSBs OF COMMAND | ERROR CODE |
|---|---|---|
| SW00 TURNED ON | 1xxxx | 30h |
| SW10 SELECTS DAC INPUT | x11xx | 31h |
| SW11 SELECTS EXTERNAL INPUT | xxx01 | 32h |

| ADDRESS | REGISTER NAME | ATTRIBUTE | DATA | | | | | | | | |
|---|---|---|---|---|---|---|---|---|---|---|---|
| | | | D8 | D7 | D6 | D5 | D4 | D3 | D2 | D1 | D0 |
| 00h | CIRCUIT FORMAT SETTING AMP1 | R/W | 113a | 113b | 113c | 113d | SW00 | SW10[1:0] | | SW11[1:0] | |
| 01h | CIRCUIT FORMAT SETTING AMP2 | R/W | 123a | 123b | 123c | 123d | | SW12[1:0] | | SW13[1:0] | |
| 02h | CIRCUIT FORMAT SETTING AMP3 | R/W | 143a | 143b | 143c | 143d | | SW14[1:0] | | SW15[1:0] | |

Fig. 33

<CIRCUIT FORMAT DATABASE FOR AMP1 INCLUDING SUMMING AMPLIFIER EXPECTED VALUES>

| CIRCUIT FORMAT | D8(113a) | D7(113b) | D6(113c) | D5(113d) |
|---|---|---|---|---|
| SUMMING AMPLIFIER | 0 | 0 | 1 | 1 |
| INVERTING AMPLIFIER | 0 | 1 | 1 | 0 |
| NON-INVERTING AMPLIFIER | 0 | 1 | 0 | 0 |
| DIFFERENTIAL AMPLIFIER | 0 | 0 | 1 | 0 |
| I/V AMPLIFIER | 1 | 1 | 1 | 0 |

Fig. 34

<SUMMING AMPLIFIER>

<CONTENTS OF FORBIDDEN CONNECTION DATABASE FOR SUMMING AMPLIFIER>

| FORBIDDEN MODE | 5 LSBs OF COMMAND | ERROR CODE |
|---|---|---|
| SW00 TURNED ON | 1xxxx | 40h |
| SW10 SELECTS DAC INPUT | x11xx | 41h |
| SW11 SELECTS DAC INPUT | xxx11 | 42h |

<CIRCUIT FORMAT DATABASE INCLUDING INSTRUMENTATION AMPLIFIER EXPECTED VALUES>

| CIRCUIT FORMAT | CIRCUIT FORMAT SETTING AMP3 | | | CIRCUIT FORMAT SETTING AMP2 | | | CIRCUIT FORMAT SETTING AMP1 | | | |
|---|---|---|---|---|---|---|---|---|---|---|
| | D7(143a) | D6(143b) | D5(143c) | D7(123a) | D6(123b) | D5(123c) | D7(113a) | D6(113b) | D5(113c) | D4(SW00) |
| INSTRUMENTATION AMPLIFIER x3ch | 0 | 0 | 1 | 0 | 1 | 0 | 0 | 1 | 0 | 1 |
| INVERTING AMPLIFIER x3ch | 0 | 1 | 1 | 0 | 1 | 1 | 0 | 1 | 1 | 0 |
| NON-INVERTING AMPLIFIER x3ch | 0 | 1 | 0 | 0 | 1 | 0 | 0 | 1 | 0 | 0 |
| DIFFERENTIAL AMPLIFIER x3ch | 0 | 0 | 1 | 0 | 0 | 1 | 0 | 0 | 1 | 0 |
| I/V AMPLIFIER x3ch | 1 | 1 | 1 | 1 | 1 | 1 | 1 | 1 | 1 | 0 |
| I/V AMPLIFIER x2ch INVERTING AMPLIFIER x1ch | 0 | 1 | 1 | 0 | 1 | 1 | 0 | 1 | 1 | 0 |
| DIFFERENTIAL AMPLIFIER x1ch NON-INVERTING AMPLIFIER x2ch | 0 | 0 | 0 | 0 | 0 | 0 | 0 | 0 | 0 | 0 |

Fig. 36

<CONTENTS OF FORBIDDEN CONNECTION DATABASE FOR INSTRUMENTATION AMPLIFIER>

| AMPLIFIER | FORBIDDEN MODE | 5 LSBs OF COMMAND | ERROR CODE |
|---|---|---|---|
| AMP1 | SW00 TURNED OFF | 1xxxx | 50h |
| | SW10 SELECTS EXTERNAL INPUT | x01xx | 51h |
| | SW10 SELECTS DAC INPUT | x11xx | 52h |
| | SW11 SELECTS DAC INPUT | xxx11 | 53h |
| AMP2 | SW12 SELECTS EXTERNAL INPUT | x01xx | 54h |
| | SW12 SELECTS DAC INPUT | x11xx | 55h |
| | SW13 SELECTS DAC INPUT | xxx11 | 56h |
| AMP3 | SW14 SELECTS DAC INPUT | x11xx | 57h |
| | SW14 SELECTS EXTERNAL INPUT | x01xx | 58h |
| | SW15 SELECTS DAC INPUT | xxx11 | 59h |
| | SW15 SELECTS EXTERNAL INPUT | xxx01 | 60h |

Fig. 37B

| ADDRESS | REGISTER NAME | ATTRIBUTE | DATA | | | | | | | |
|---|---|---|---|---|---|---|---|---|---|---|
| | | | D7 | D6 | D5 | D4 | D3 | D2 | D1 | D0 |
| 00h | CIRCUIT FORMAT SETTING | R/W | CONFIG | | | 0 | 0 | 0 | 0 | 0 |
| 01h | SWITCH SETTING 1 | R/W | SW10[1:0] | | SW11[1:0] | | SW12[1:0] | | SW13[1:0] | |
| 02h | SWITCH SETTING 2 | R/W | SW14[1:0] | | SW15[1:0] | | 0 | 0 | 0 | 0 |

Fig. 39

<CONTENTS OF CIRCUIT FORMAT SETTING COMMAND>

| CIRCUIT FORMAT | CONFIG | | |
|---|---|---|---|
| | D7 | D6 | D5 |
| INVERTING AMPLIFIER | 0 | 0 | 1 |
| NON-INVERTING AMPLIFIER | 0 | 1 | 0 |
| DIFFERENTIAL AMPLIFIER | 0 | 1 | 1 |
| I/V AMPLIFIER | 1 | 0 | 0 |
| SUMMING AMPLIFIER | 1 | 0 | 1 |
| INSTRUMENTATION AMPLIFIER | 1 | 1 | 0 |

Fig. 40

| ADDRESS | REGISTER NAME | ATTRIBUTE | DATA | | | | | | | | | |
|---|---|---|---|---|---|---|---|---|---|---|---|---|
| | | | D9 | D8 | D7 | D6 | D5 | D4 | D3 | D2 | D1 | D0 |
| 00h | CIRCUIT FORMAT SETTING AMP1 | R/W | 113a | 113b | | 113c[2:0] | | SW00 | SW10[1:0] | | SW11[1:0] | |
| 01h | CIRCUIT FORMAT SETTING AMP2 | R/W | 123a | 123b | | 123c[2:0] | | | SW12[1:0] | | SW13[1:0] | |
| 02h | CIRCUIT FORMAT SETTING AMP3 | R/W | 143a | 143b | | 143c[2:0] | | | SW14[1:0] | | SW15[1:0] | |

Fig. 42

<CIRCUIT FORMAT DATABASE FOR AMP1>

| CIRCUIT FORMAT | 113a | 113b | 113c | | |
|---|---|---|---|---|---|
| | D9 | D8 | D7 | D6 | D5 |
| INVERTING AMPLIFIER | 0 | 1 | 1 | 1 | 1 |
| NON-INVERTING AMPLIFIER | 0 | 1 | 0 | 0 | 0 |

Fig. 43

| TERMINAL NAME | TERMINAL FUNCTION | SENSOR CONNECTION TERMINAL BY CIRCUIT FORMAT (CONNECTED TO ✓) | | | | |
|---|---|---|---|---|---|---|
| | | NON-INVERTING AMPLIFIER | INVERTING AMPLIFIER | DIFFERENTIAL AMPLIFIER | I/V AMPLIFIER | INSTRUMENTATION AMPLIFIER |
| MPXIN10 | AMP1 (−) | | ✓ | ✓ | ✓ | |
| MPXIN20 | AMP1 (+) | ✓ | | ✓ | ✓ | ✓ |
| MPXIN30 | AMP2 (−) | | ✓ | ✓ | ✓ | |
| MPXIN40 | AMP2 (+) | ✓ | | ✓ | | ✓ |
| MPXIN50 | AMP3 (−) | | ✓ | ✓ | | |
| MPXIN60 | AMP3 (+) | ✓ | | | | |

Fig. 51

SEMICONDUCTOR DEVICE AND COMMAND CONTROL METHOD FOR THE SAME

CROSS-REFERENCE TO RELATED APPLICATIONS

This application is based upon and claims the benefit of priority from Japanese patent application No. 2013-000666, filed on Jan. 7, 2013, the disclosure of which is incorporated herein in its entirety by reference.

BACKGROUND

The present invention relates to a semiconductor device and a command control method for the same and, particularly, to a semiconductor device including an analog circuit group having a reconfigurable circuit configuration and a command control method for the same.

In recent years, proposals have been made for programmable semiconductor devices which programmably switch the operation range of circuits or a circuit configuration. An example of such a programmable semiconductor device is disclosed in Published Japanese Translation of PCT International Publication for Patent Application, No. 2007-531408.

Published Japanese Translation of PCT International Publication for Patent Application, No. 2007-531408 discloses an analog-to-digital converter that is capable of programmably switching an input voltage range. This analog-to-digital converter, according to the data input from a serial port, selects which bits of the CapDAC array to sample on an analog input signal.

However, the inventor has found a problem in Published Japanese Translation of PCT International Publication for Patent Application, No. 2007-531408 that it is unable to authenticate values of data input from the serial port, and the circuit cannot be configured to handle the case of data corruption.

Other issues and new features will be apparent from the description in the specification and attached drawings.

According to an aspect of the present invention, in a semiconductor device, a plurality of commands for specifying a circuit configuration of an analog front-end unit are transmitted from a processing unit to the analog front-end unit, an analysis is performed on the plurality of commands received by the analog front-end unit, and when a circuit configuration of the analog front-end unit which is to be updated and is determined according to the plurality of commands includes a forbidden condition that has been previously set, updating processing of the circuit configuration according to the plurality of commands is stopped.

Note that implementations of the device according to the above-mentioned aspect in the form of a system and a method, and a program for causing a computer to execute a part of processing as the device, and the like may also be effective as aspects of the present invention.

According to the above-mentioned aspect, it is possible to prevent incorrect setting of the circuit that is caused by an error included in the plurality of commands for specifying the circuit configuration.

BRIEF DESCRIPTION OF THE DRAWINGS

The above and other aspects, advantages and features will be more apparent from the following description of certain embodiments taken in conjunction with the accompanying drawings, in which:

FIG. 23 is table for explaining commands handled by the semiconductor device according to the first embodiment;

FIG. 24 is a table for explaining contents of a circuit format database used in the semiconductor device according to the first embodiment;

FIG. 33 is a table for explaining commands handled by the semiconductor device according to a second embodiment;

FIG. 34 is a table for explaining contents of a circuit format database used in the semiconductor device according to the second embodiment;

FIG. 36 is a table for explaining contents of a circuit format database used in the semiconductor device according to a third embodiment;

FIG. 37B is a table for explaining prohibition conditions of the semiconductor device according to the third embodiment;

FIG. 39 is a table for explaining commands handled by the semiconductor device according to the fourth embodiment;

FIG. 40 is a table for explaining contents of a circuit format database used in the semiconductor device according to the fourth embodiment;

FIG. 42 is a table for explaining commands handled by the semiconductor device according to the fifth embodiment;

FIG. 43 is a table for explaining contents of a circuit format database used in the semiconductor device according to the fifth embodiment;

FIG. 51 is a table for explaining a terminal configuration database that specifies correspondence between use terminals and circuit formats of the semiconductor device according to the eighth embodiment;

DETAILED DESCRIPTION

Figure 1:
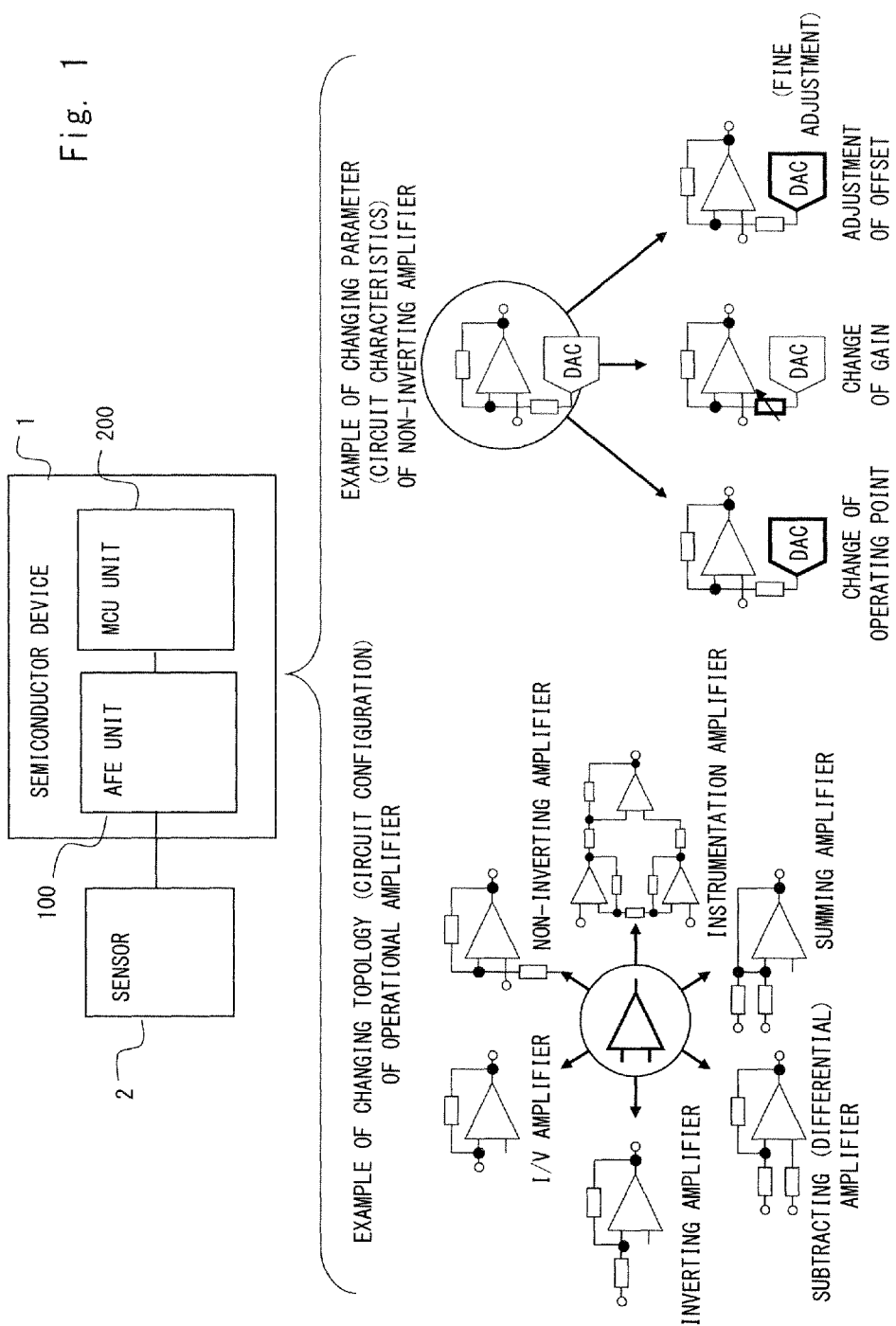
FIG. 1 is a configuration diagram of a sensor system according to a first embodiment.

For clarity of the explanation, the following description and drawings are omitted and simplified as appropriate. Each element in the drawings illustrated as functional blocks for performing various processes can be composed of a CPU, a memory, and other circuit as hardware, or achieved by programs loaded into a memory as software. Therefore, those skilled in the art would understand that these functional blocks can be achieved only by hardware, software, or a combination thereof, and it is not limited to any of them. Note that in the drawings, the same components are denoted by the same reference numerals, and repeated explanation shall be omitted as necessary.

Hereinafter, embodiments are explained with reference to the drawings. Explained below in this embodiment are a configuration and a method for changing a circuit format and a circuit configuration in a semiconductor device with a reconfigurable circuit format and a reconfigurable circuit configuration. Note that in the following explanation, in an analog front-end unit, a change in the circuit format enables analog functional circuits to implement different functions, and a change in the circuit configuration enables circuit characteristics and input/output signals of the analog functional circuits to be switched.

For easier understanding of the semiconductor device according to this embodiment, firstly the semiconductor device according to this embodiment is explained. FIG. 1 shows a configuration of a sensor system including a semiconductor device according to this embodiment.

As shown in FIG. 1, this sensor system includes a sensor 2 and a semiconductor device 1 that is connected to the sensor.

As the sensor 2, various sensors such as a current output sensor that outputs a current in accordance with a detection result, a voltage output sensor that outputs a voltage in accordance with a detection result, and a sensor that outputs a faint differential signal in accordance with a detection result may be used.

The semiconductor device 1 includes a processing unit (e.g., MCU unit 200) and an analog front-end unit (e.g., AFE unit 100). The semiconductor device 1 is a SoC (System-on-a-chip) on which a semiconductor chip of the MCU unit 200 and a semiconductor chip of the AFE unit 100 are integrated into one semiconductor device, for example. Note that the semiconductor device 1 may be a semiconductor device integrated into one chip including the MCU unit 200 and the AFE unit 100. Alternatively, there may be a semiconductor device including only the MCU unit 200 and a semiconductor device including only the AFE unit 100. Hereinafter, a device including both the AFE unit 100 and the MCU unit 200 may be referred to as the semiconductor device 1, and a device including only the AFE unit 100 may be also referred to as the semiconductor device 1.

The MCU unit (processing unit) 200 is a microcontroller that converts a measurement signal (detection signal) of the sensor 2 that is input through the AFE unit 100 from analog to digital and performs control processing in accordance with a detection result. Further, the MCU unit 200 outputs a command for changing the settings of the configuration and characteristics of the AFE unit 100 to the AFE unit 100.

The AFE unit (analog input unit) 100 is an analog circuit that performs analog front-end processing such as amplification and filtering on the measurement signal that is output from the sensor 2 to generate a signal that is processable by the MCU unit 200. Further, the AFE unit 100 can change in its topology (circuit format and circuit configuration) and parameter (circuit characteristics) as shown in FIG. 1.

As shown in the FIG. 1, it is possible to change from the configuration of an operational amplifier circuit to an I/V amplifier, a subtracting (differential) amplifier, a summing amplifier, an inverting amplifier, a non-inverting amplifier, and an instrumentation amplifier. Further, as shown in a parameter example of a non-inverting amplifier, a change of operating point, a change of gain, and adjustment of offset can be made.

Figure 2:
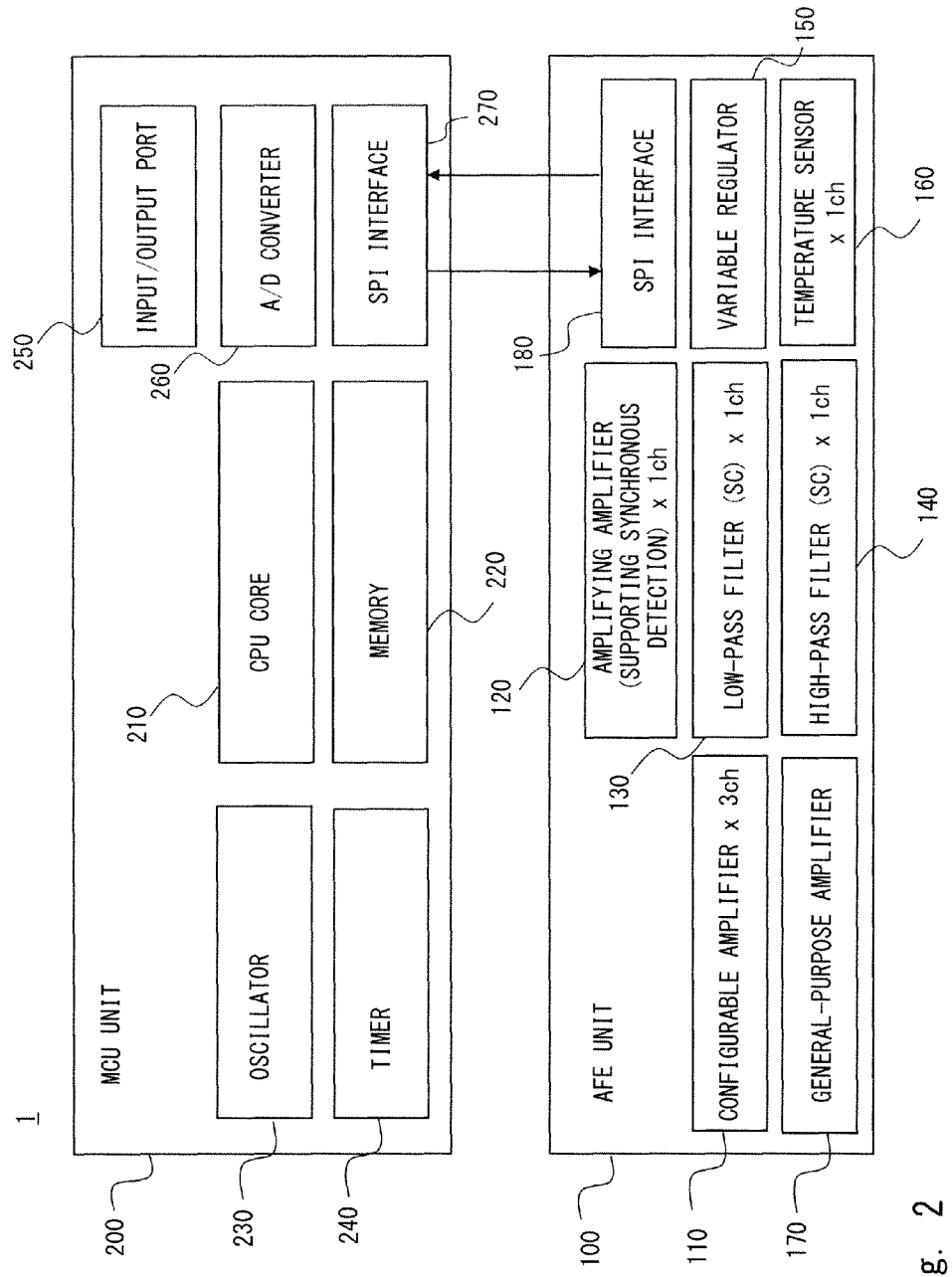
FIG. 2 is a circuit block diagram of a semiconductor device according to the first embodiment.

FIG. 2 shows a circuit block of the semiconductor device 1. As shown in FIG. 2, the MCU unit 200 includes a CPU core 210, a memory 220, an oscillator 230, a timer 240, an input/output port 250, an A/D converter 260, and a communication interface (e.g., SPI (Serial Peripheral Interface) 270). Note that the MCU unit 200 includes other circuits for implementing the function of a microcontroller, such a DMA and various arithmetic circuits, for example.

The CPU core 210 executes a program stored to the memory 220 and performs control processing according to the program. The memory 220 stores the program to be executed by the CPU core 210 and various data. The memory 220 stores, as one of the various data, a plurality of commands that specify a circuit format and a circuit configuration of a circuit composed of a plurality of analog circuit elements that are included in the AFE unit 100. The oscillator 230 generates an operating clock of the MCU unit 200 and further supplies the clock to the AFE unit 100 according to need. The timer 240 is used for the control operation of the MCU unit 200.

The input/output port 250 is an interface for inputting and outputting data or the like to and from external devices of the semiconductor device 1, and it is connectable to an external computer device or the like as described later, for example.

The A/D converter 260 converts a measurement signal of the sensor 2 that is input through the AFE unit 100 from analog to digital. The power of the A/D converter 260 is supplied from the AFE unit 100.

The SPI (Serial Peripheral Interface) interface 270 is an interface for inputting and outputting data or the like to and from the AFE unit 100. Note that the SPI interface 270 is a general-purpose serial interface, and another microcontroller or microcomputer can connect to the AFE unit 100 if it supports SPI.

The semiconductor device 1 shown in FIG. 2 has a configuration compatible with general-purpose applications. To be specific, a complete AFE circuit for sensor is mounted to allow connection with sensors of various types and characteristics. Specifically, the AFE unit 100 includes a configurable amplifier 110, a gain amplifier supporting synchronous detection (which is also referred to hereinafter as a gain amplifier) 120, a Switched Capacitor (SC) low-pass filter (hereinafter as a low-pass filter) 130, a SC high-pass filter (hereinafter as a high-pass filter) 140, a variable regulator 150, a temperature sensor 160, a general-purpose amplifier 170, and an SPI interface 180.

The configurable amplifier 110 is an amplification circuit that amplifies a signal which is input from the outside such as the sensor 2, and its circuit format, characteristics and operation can be set according to control from the MCU unit 200 (e.g., command transmitted from the MCU unit 200). The configurable amplifier 110 includes 3ch amplifiers, which are, three amplifiers. Many different circuit configurations can be implemented by the three amplifiers.

The gain amplifier 120 is an amplification circuit supporting synchronous detection that amplifies an output of the configurable amplifier 110 and a signal input from the outside such as the sensor 2, and its characteristics and operation can be set according to control from the MCU unit 200.

The low-pass filter 130 is an SC filter that removes high-frequency components of outputs of the configurable amplifier 110 and the gain amplifier 120 and signals input from the outside such as the sensor 2, and allows low-frequency components thereof to pass through, and its characteristics and operation can be set according to control from the MCU unit 200. The high-pass filter 140 is an SC filter that removes low-frequency components of outputs of the configurable amplifier 110 and the gain amplifier 120 and signals input from the outside such as the sensor 2, and allows high-frequency components thereof to pass through, and its characteristics and operation can be set according to control from the MCU unit 200.

The variable regulator 150 is a variable voltage source that supplies a voltage to the A/D converter 260 of the MCU unit 200, and its characteristics and operation can be set according to control from the MCU unit 200. The temperature sensor 160 is a sensor that measures the temperature of the semiconductor device 1, and its operation can be set according to control from the MCU unit 200.

The general-purpose amplifier 170 is an amplifier that amplifies a signal that is input from the outside such as the sensor 2, and its operation can be set according to control from the MCU unit 200. The SPI interface 180 is an interface for inputting and outputting data or the like to and from the MCU unit 200 and is connected to the SPI interface 270 of the MCU unit 200 through an SPI bus. Note that when the semiconductor device 1 does not include the MCU unit 200, the SPI interface 180 is connected to an external terminal of the semiconductor device 1, and an external microcontroller, the AFE unit 100 is connected to an external microcontroller and an external microcontroller through the external terminal.

Figure 3:
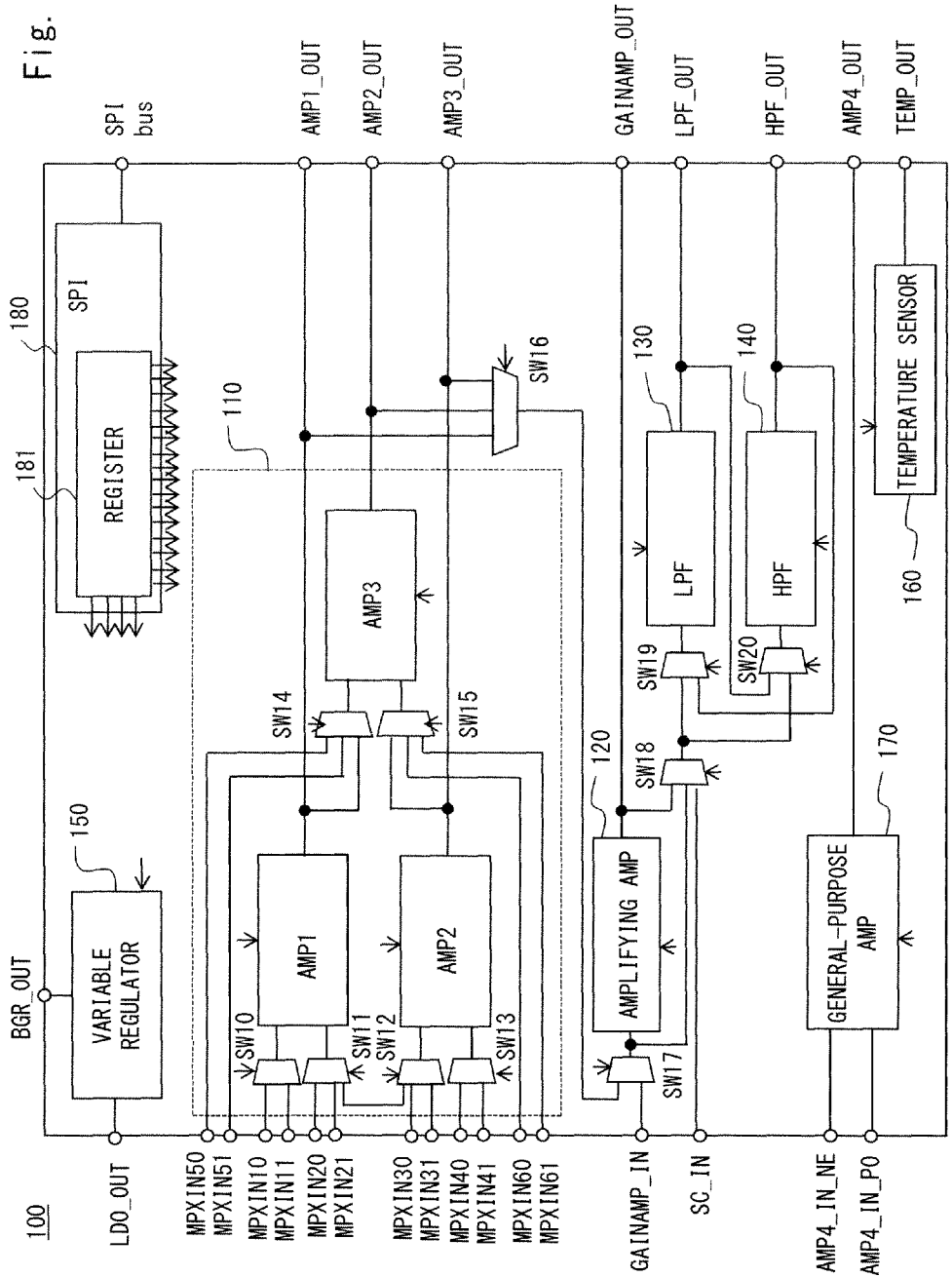
FIG. 3 is a diagram showing connections of circuits in the semiconductor device according to the first embodiment.

The configuration of the AFE unit 100 in the semiconductor device 1 is described in detail hereinafter. FIG. 3 shows connections of circuits in the AFE unit 100. The AFE unit 100 includes a plurality of analog circuit elements (e.g., an amplifier, a resistor, a capacitor or the like) and a switching circuit group (e.g., switching circuit including a switch and a multiplexer) that switches the connection state between the plurality of analog circuit elements.

The SPI interface 180 is connected to external terminals (CS, SCLK, SDO, SDI) that are connected to the SPI bus and includes a register (control register) 181. The configuration information (command) for changing the configuration and characteristics of the circuit is input from the MCU unit 200 through the SPI interface and stored to the register 181. The register 181 is connected to the respective circuits in the AFE unit 100, and the configuration and characteristics of the respective circuits in the AFE unit 100 are set according to the configuration information in the register 181.

The configurable amplifier 110 includes separate amplifiers AMP1, AMP2 and AMP3, and switches SW10 to SW15 for switching input and output of amplifiers are connected.

In the separate amplifier AMP1, one input terminal is connected to MPXIN10 or MPXIN11 through the switch SW10, the other input terminal is connected to MPXIN20 or MPXIN21 through the switch SW11, and the output terminal is connected to AMP1_OUT. Likewise, in the separate amplifier AMP2, one input terminal is connected to MPXIN30 or MPXIN31 through the switch SW12, the other input terminal is connected to MPXIN40 or MPXIN41 through the switch SW13, and the output terminal is connected to AMP2_OUT.

Further, in the separate amplifier AMP3, one input terminal is connected to MPXIN50, MPXIN51 or the output terminal of the AMP1 through the switch SW14, the other input terminal is connected to MPXIN60, MPXIN61 or the output terminal of the AMP2 through the switch SW15, and the output terminal is connected to AMP3_OUT. The output terminals of the AMP1 to AMP3 are connected also to the gain amplifier 120, the low-pass filter 130 and the high-pass filter 140.

In the configurable amplifier 110, the switches SW10 to SW15 are switched according to the set value of the register 181, and thereby the connections of the AMP1 to AMP3 are changed, and the internal circuit format and characteristics are also changed as described later.

Figure 4:
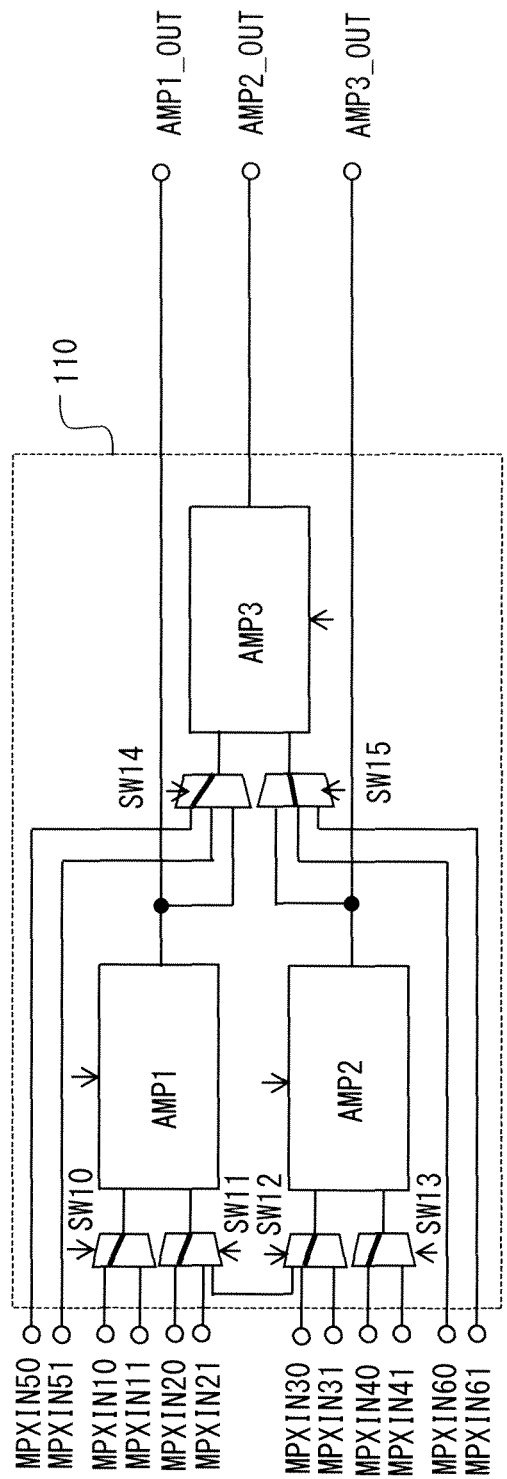
FIG. 4 is a diagram showing an example of connection of a circuit in the semiconductor device according to the first embodiment.
Figure 5:
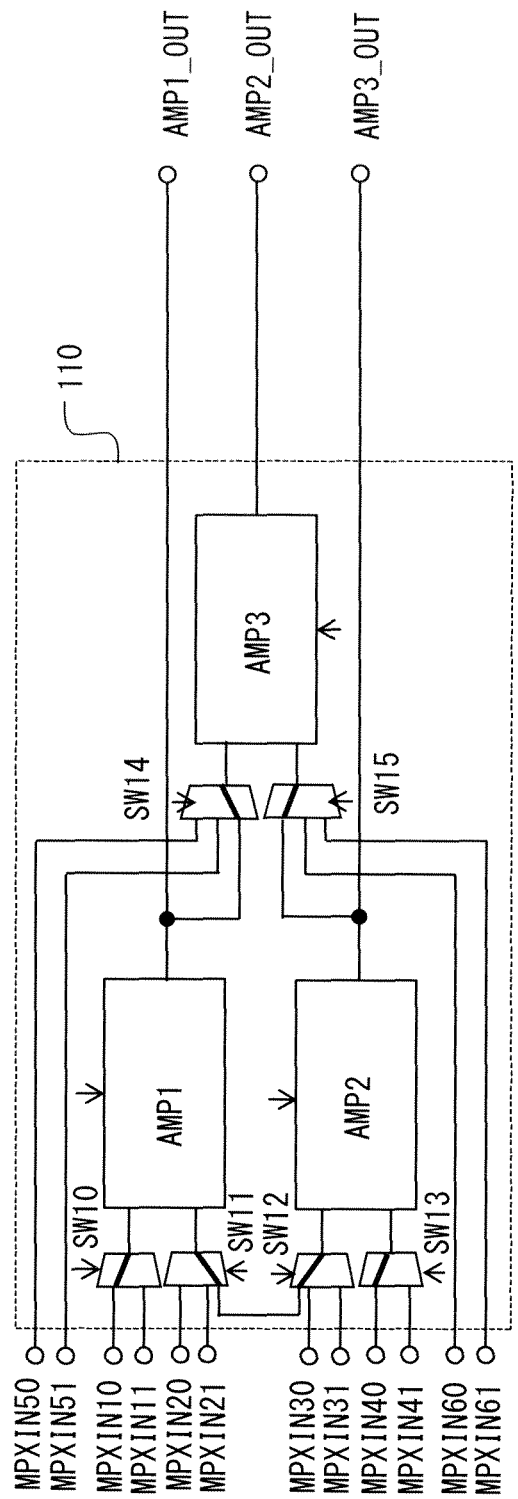
FIG. 5 is a diagram showing an example of connection of a circuit in the semiconductor device according to the first embodiment.

FIGS. 4 and 5 are examples of switching the connections of the AMP1 to AMP3 by the switches SW10 to SW15. In FIG. 4, by the setting of the register 181, the switches SW10 and SW11 are switched to connect the input terminals of the AMP1 to the MPXIN10 and MPXIN20, the switches SW12 and SW13 are switched to connect the input terminals of the AMP2 to the MPXIN30 and MPXIN40, and the switches SW14 and SW15 are switched to connect the input terminals of the AMP3 to the MPXIN50 and MPXIN60. In these connections, the AMP1, AMP2 and AMP3 can operate as independent amplifiers.

In FIG. 5, by the setting of the register 181, the switch SW10 is switched to connect one input terminal of the AMP1 to the MPXIN10, the switch SW13 is switched to connect one input terminal of the AMP2 to the MPXIN40, the switches SW11 and SW12 are switched to connect the other input terminal of the AMP1 to the other input terminal of the AMP2, the switches SW14 and SW15 are switched to connect one input terminal of the AMP3 to the output terminal of the AMP1 and connect the other input terminal of the AMP3 to the output terminal of the AMP2. In these connections, an instrumentation amplifier connecting the AMP1 to AMP3 can be configured.

Further, as shown in FIG. 3, switches SW16 and SW17 for switching input are connected to the gain amplifier 120. In the gain amplifier 120, the input terminal is connected to the output terminals of the AMP1 to AMP3 through the switches SW16 and SW17 or connected to GAINAMP_IN through the switch SW17, and the output terminal is connected to GAIN-AMP_OUT. The output terminal of the gain amplifier 120 is connected also to the low-pass filter 130 and the high-pass filter 140. Note that the switch SW16 may be used to switch the connection between the output terminals of the AMP1 to AMP3, external terminals, and the gain amplifiers.

Switches SW18 and SW19 for switching input are connected to the low-pass filter 130, and switches SW18 and SW20 for switching input are connected to the high-pass filter 140. In the low-pass filter 130, the input terminal is connected to the output terminals of the AMP1 to AMP3, the output terminal of the gain amplifier 120 or SC_IN through the switches SW16, SW17, SW18, and SW19, or connected to the output terminal of the gain amplifier 120 through the switch SW19, and the output terminal is connected to LPF_OUT. In the high-pass filter 140, the input terminal is connected to the output terminals of the AMP1 to AMP3, the output terminal of the gain amplifier 120 or SC_IN through the switches SW16, SW17, SW18, and SW19, or connected to the output terminal of the low-pass filter 130 through the switch SW19, and the output terminal is connected to HPF_OUT. Note that a switch may be provided between the output terminals of the low-pass filter 130 and the high-pass filter 140 and the external terminals to switch the connection between the output terminals of the low-pass filter 130 and the high-pass filter 140, the external terminals, and SW19 and SW20.

In the gain amplifier 120, the low-pass filter 130 and the high-pass filter 140, the switches SW16 to SW20 are switched according to the set value of the register 181, and the connections of the gain amplifier 120, the low-pass filter 130 and the high-pass filter 140 are changed, and the internal characteristics are also changed as described later.

Figure 6:
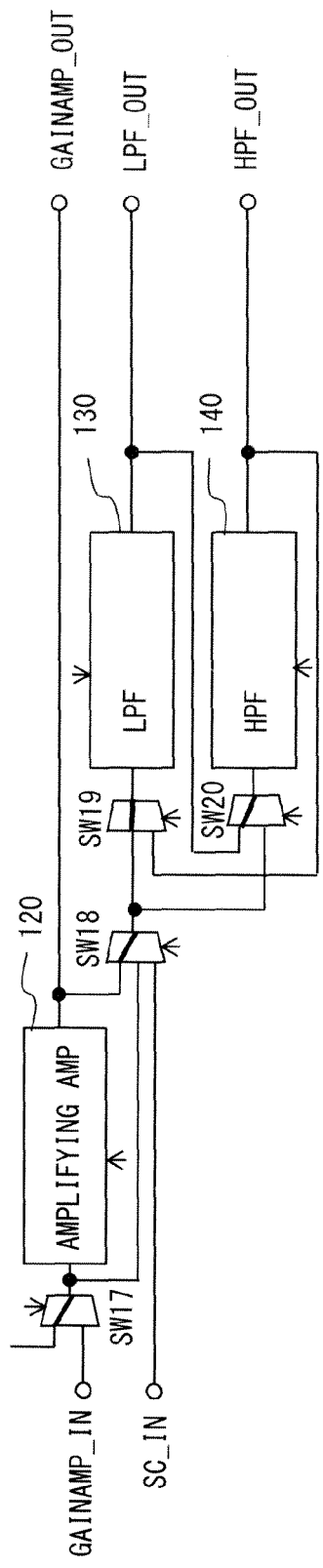
FIG. 6 is a diagram showing an example of connection of a circuit in the semiconductor device according to the first embodiment.
Figure 7:
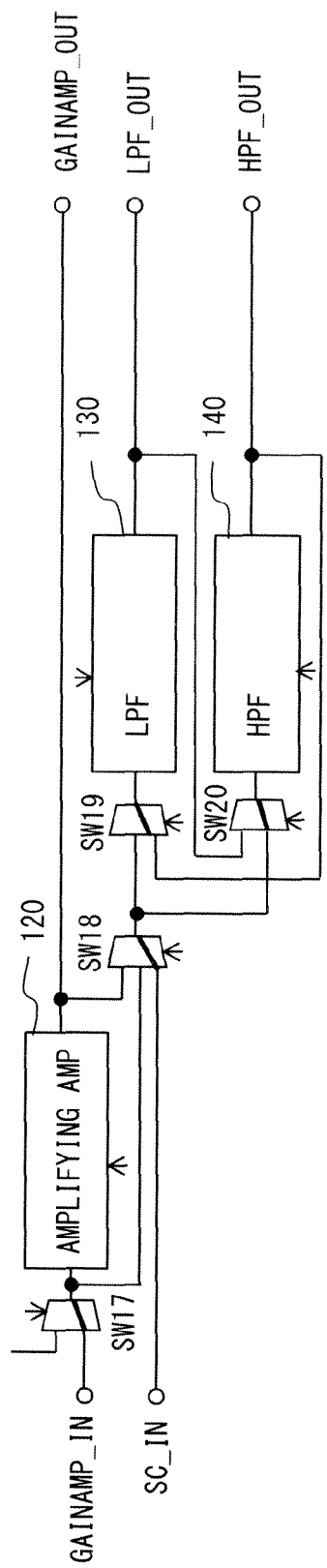
FIG. 7 is a diagram showing an example of connection of a circuit in the semiconductor device according to the first embodiment.

FIGS. 6 and 7 are examples of switching the connections of the gain amplifier 120, the low-pass filter 130 and the high-pass filter 140 by the switches SW17 to SW20. In FIG. 6, by the setting of the register 181, the switch SW17 is switched to connect the input terminal of the gain amplifier 120 to any output terminal of the AMP1 to AMP3, the switches SW18 and SW19 are switched to connect the input terminal of the low-pass filter 130 to the output terminal of the gain amplifier 120, and the switch SW20 is switched to connect the input terminal of the high-pass filter 140 to the output terminal of the low-pass filter 130. In this switching, a circuit in which any one of the AMP1 to AMP3, the gain amplifier 120, the low-pass filter 130 and the high-pass filter 140 are connected in this order can be formed.

In FIG. 7, by the setting of the register 181, the switch SW17 is switched to connect the input terminal of the gain amplifier 120 to GAINAMP_IN, the switches SW18 and SW20 are switched to connect the input terminal of the high-pass filter 140 to SC_IN, and the switch SW19 is switched to connect the input terminal of the low-pass filter 130 to the output terminal of the high-pass filter 140. In this switching, the gain amplifier 120 can operate as a single independent amplifier, and a circuit in which the high-pass filter 140 and the low-pass filter 130 are connected in this order can be formed.

Further, as shown in FIG. 3, in the variable regulator 150, the output terminal is connected to BGR_OUT and LDO_OUT. The characteristics of the variable regulator 150 are changed as described later according to the set value of the register 181.

In the temperature sensor 160, the output terminal is connected to TEMP_OUT. The characteristics of the temperature sensor 160 are changed as described later according to the set value of the register 181.

In the general-purpose amplifier 170, one input terminal is connected to AMP4_IN_NE, the other input terminal is connected to AMP4_IN_PO, and the output terminal is connected to AMP4_OUT. The general-purpose amplifier is formed by one operational amplifier, and the power on/off is set according to the set value of the register 181.

A specific circuit configuration of the configurable amplifier 110 is described hereinafter with reference to FIGS. 8 to 14.

The configurable amplifier 110 is an amplifier for amplifying a sensor output signal, and its topology (circuit format) and parameter (circuit characteristics) can be changed according to the setting of the control register. As a change in characteristics, the gain can be set to be variable. For example, in the case of using the separate amplifiers independently of one another, the gain can be set in units of 2 dB from 6 dB to 46 dB, and in the case of using them as an instrumentation amplifier, the gain can be set in units of 2 dB from 20 dB to 60 dB. Further, the slew rate can be set to be variable, and the power on/off can be switched by power-off mode.

Figure 8:
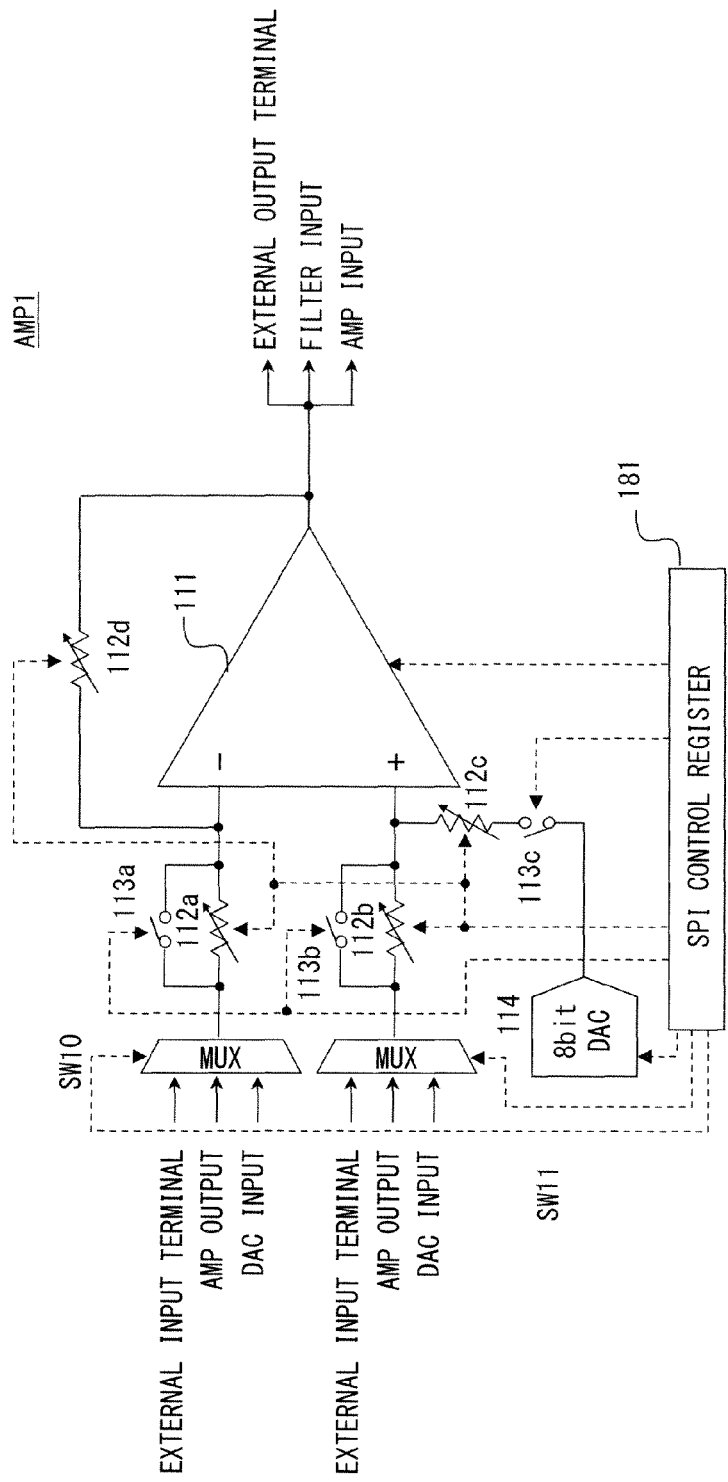
FIG. 8 is a circuit diagram showing a circuit configuration of the semiconductor device according to the first embodiment.

FIG. 8 shows a circuit configuration of a separate amplifier AMP1 of the configurable amplifier 110. The AMP2 and AMP3 have the same configuration.

As shown in FIG. 8, the separate amplifier AMP1 includes an operational amplifier 111 and further includes variable resistors 112a to 112d that are connected to the terminals of the respective variable resistors 112a to 112d, circuit format control switches (e.g., switches 113a to 113c), and a DAC 114 that are connected to terminals of the operational amplifier 111, and multiplexers (switches) SW10 and SW11 are connected to the AMP1 as shown in FIG. 3.

According to the set value of the register 181, the input of the operational amplifier 111 can be switched by the multiplexers SW10 and SW11, the presence or absence of the variable resistors (input resistors) 112a and 112b can be switched by the switches 113a and 113b, and the connection of the DAC 114 can be switched by the switch 113c. Note that the output of the operational amplifier 111 is switched for connection with the gain amplifier 120, the low-pass filter 130 and the high-pass filter 140 by the switches SW16, SW17 and SW18 as shown in FIG. 3. Further, the gain, operating point, offset and the like of the AMP1 can be changed by changing the resistance values of the variable resistors 112a, 112b, 112c and 112d and the setting of the DAC 114 according to the set value of the register 181. Further, the power on/off can be controlled according to the set value of the register 181. Furthermore, the slew rate can be controlled by changing the operation mode of the operation amplifier to a high-speed mode, a middle-speed mode, or a low-speed mode according to the set value of the register 181.

An I/V amplifier, an inverting amplifier, a subtracting (differential) amplifier, a non-inverting amplifier, and a summing amplifier can be formed by switching of the switches and multiplexers.

Figure 9:
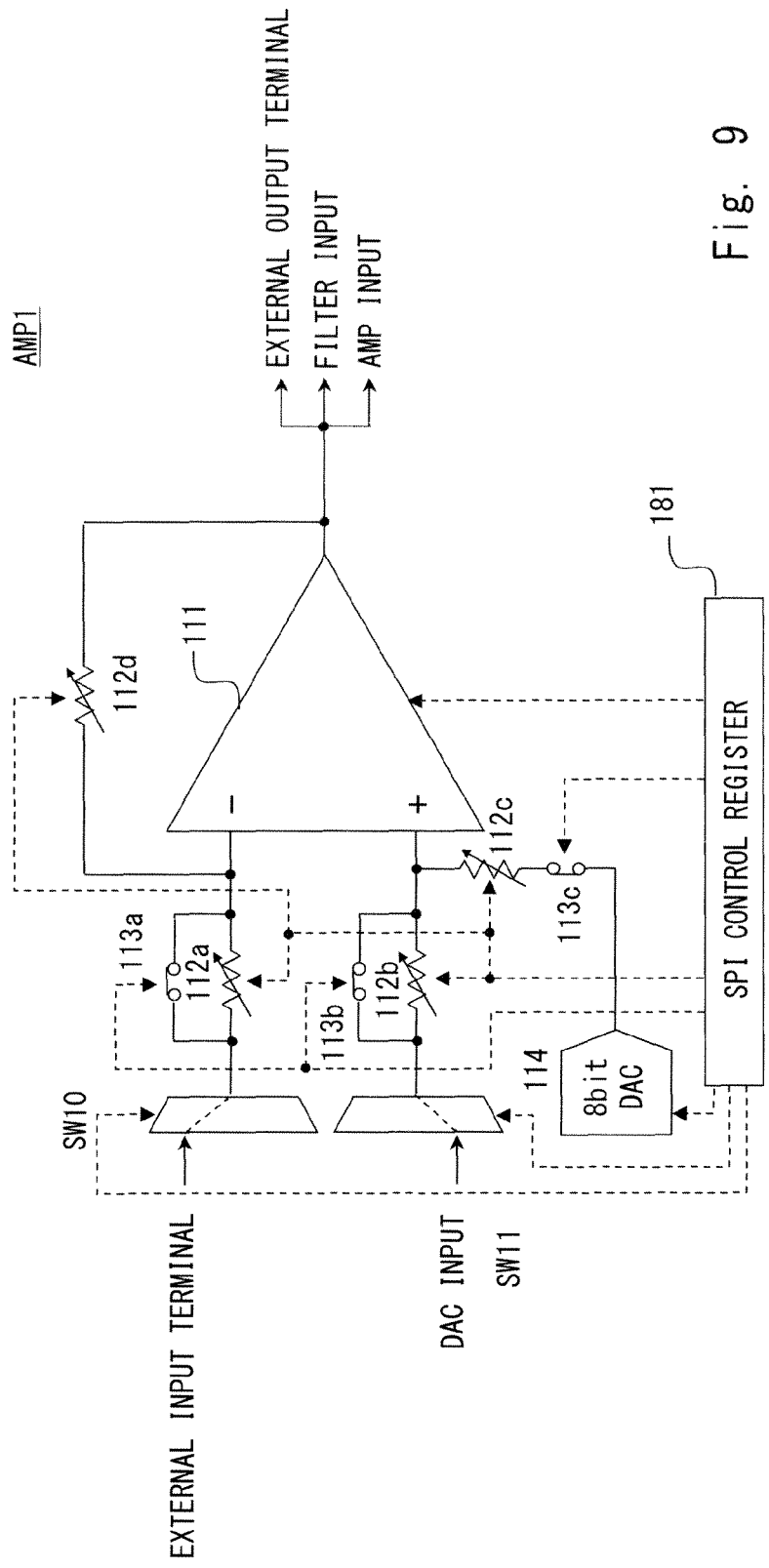
FIG. 9 is a circuit diagram showing an example of configuration change of the semiconductor device according to the first embodiment.

FIG. 9 shows an example of forming an I/V amplifier. According to the setting of the register 181, the multiplexer SW10 is switched to connect the external input terminal (MPXIN10) to the inverting input terminal, the switch 113a is turned on, and the variable resistor 112a is short-circuited. Further, the multiplexer SW11 is switched to connect the DAC input to the non-inverting input terminal, the switch 113b is turned on, the variable resistor 112b is short-circuited, and the switch 113b is turned on. In such connections, an I/V amplifier is formed. Further, by the setting of the register 181, the resistance value of the variable resistor 112d is changed to set the gain of the amplifier. When a signal of a current-type sensor is input from the external input terminal, the I/V amplifier converts the input current into a voltage and outputs the voltage.

Figure 10:
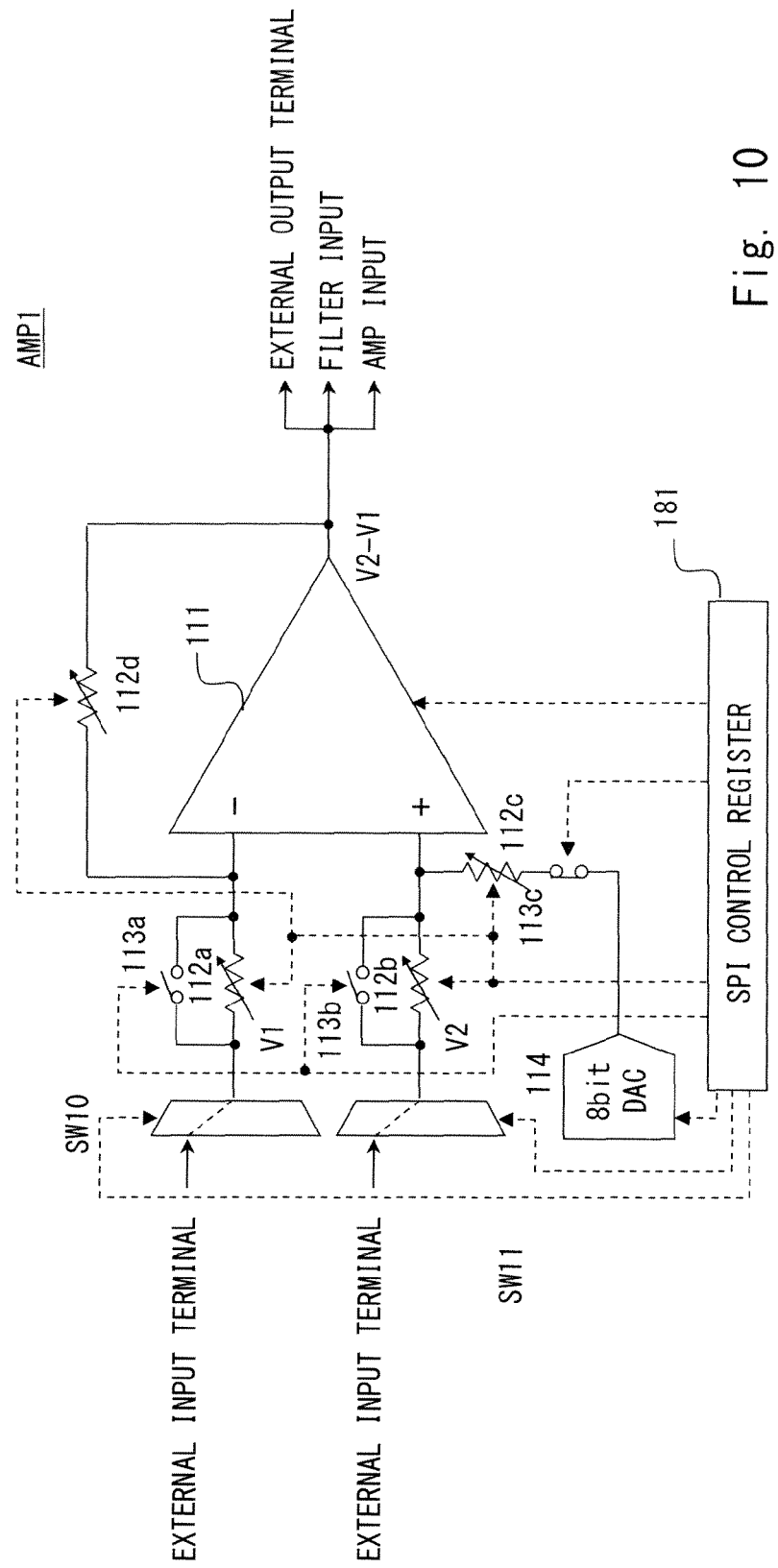
FIG. 10 is a circuit diagram showing an example of configuration change of the semiconductor device according to the first embodiment.

FIG. 10 is an example of forming a subtracting (differential) amplifier. According to the setting of the register 181, the multiplexers SW10 and SW11 are switched to connect the external input terminal (MPXIN10) to the inverting input terminal and connect the external input terminal (MPXIN20) to the non-inverting input terminal. In addition, the switches 113a and 113b are turned off, and the switch 113c is turned on. In such connections, a subtracting amplifier is formed. Further, by the setting of the register 181, the resistance values of the variable resistors 112a, 112b, 112c, and 112d are changed to set the gain of the amplifier. When two signals (V1, V2) are input from the external input terminals, the subtracting amplifier outputs a voltage (V2−V1) obtained by subtracting one input voltage from the other input voltage.

Figure 11:
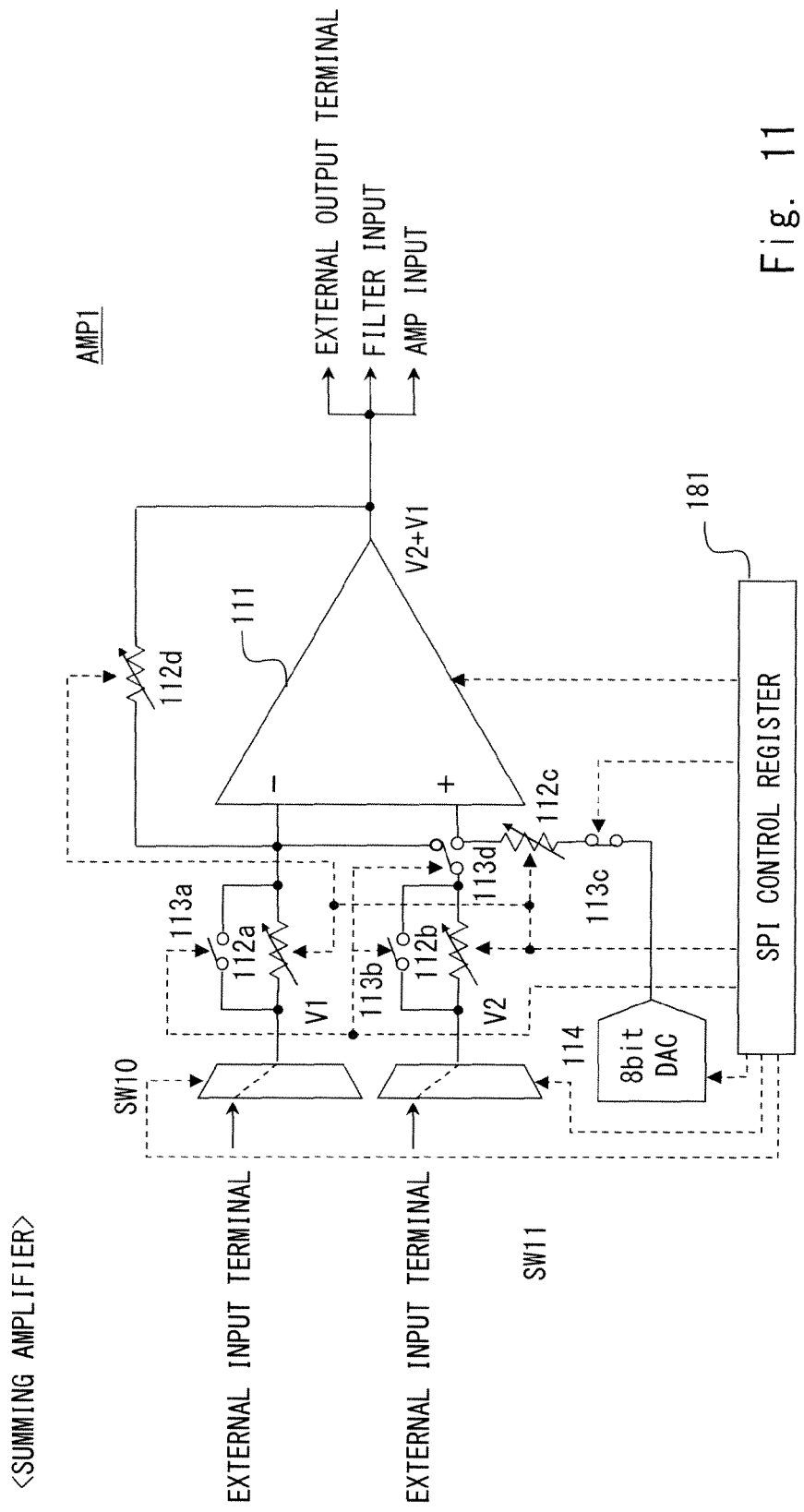
FIG. 11 is a circuit diagram showing an example of configuration change of the semiconductor device according to the first embodiment.

FIG. 11 shows an example of forming a summing amplifier. It is assumed that a switch 113d is placed between the variable resistor 112b and a positive input. According to the setting of the register 181, the multiplexers SW10 and SW11 and the switch 113d are switched to connect the external input terminal (MPXIN10) and the external input terminal (MPXIN20) to the inverting input terminal. In addition, the switches 113a and 113b are turned off, and the switch 113c is turned on. In such connections, a summing amplifier is formed. Further, by the setting of the register 181, the resistance values of the variable resistors 112a, 112b and 112d are changed to set the gain of the amplifier. When two signals (V1, V2) are input from the external input terminals, the summing amplifier outputs a voltage (V1+V2) obtained by summing one input voltage and the other input voltage.

Figure 12:
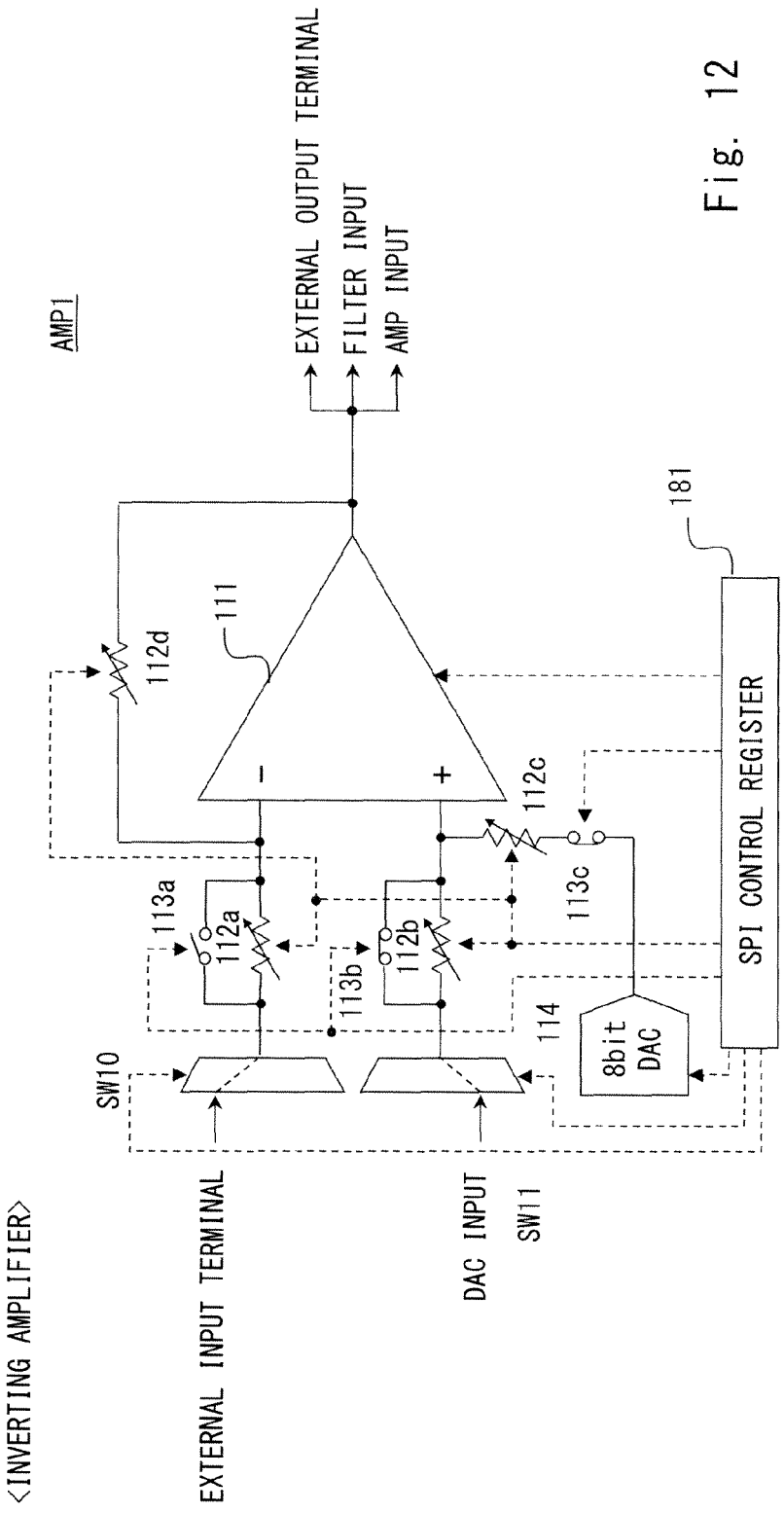
FIG. 12 is a circuit diagram showing an example of configuration change of the semiconductor device according to the first embodiment.

FIG. 12 shows an example of forming an inverting amplifier. According to the setting of the register, the multiplexer SW10 is switched to connect the external input terminal (MPXIN10) to the inverting input terminal, the switch 113c is turned on to connect the output of the DAC 114 to the non-inverting input terminal. In addition, the switch 113a is turned off, and the switches 113b and 113c are turned on. In such connections, an inverting amplifier is formed. Further, by the setting of the register 181, the resistance values of the variable resistors 112a and 112d are changed to set the gain of the amplifier, and the output voltage of the DAC is changed to adjust the operating point and offset of the amplifier. When a signal of a voltage-type sensor is input from the external input terminal, the inverting amplifier outputs a voltage generated by inverting amplification of the input voltage.

Figure 13:
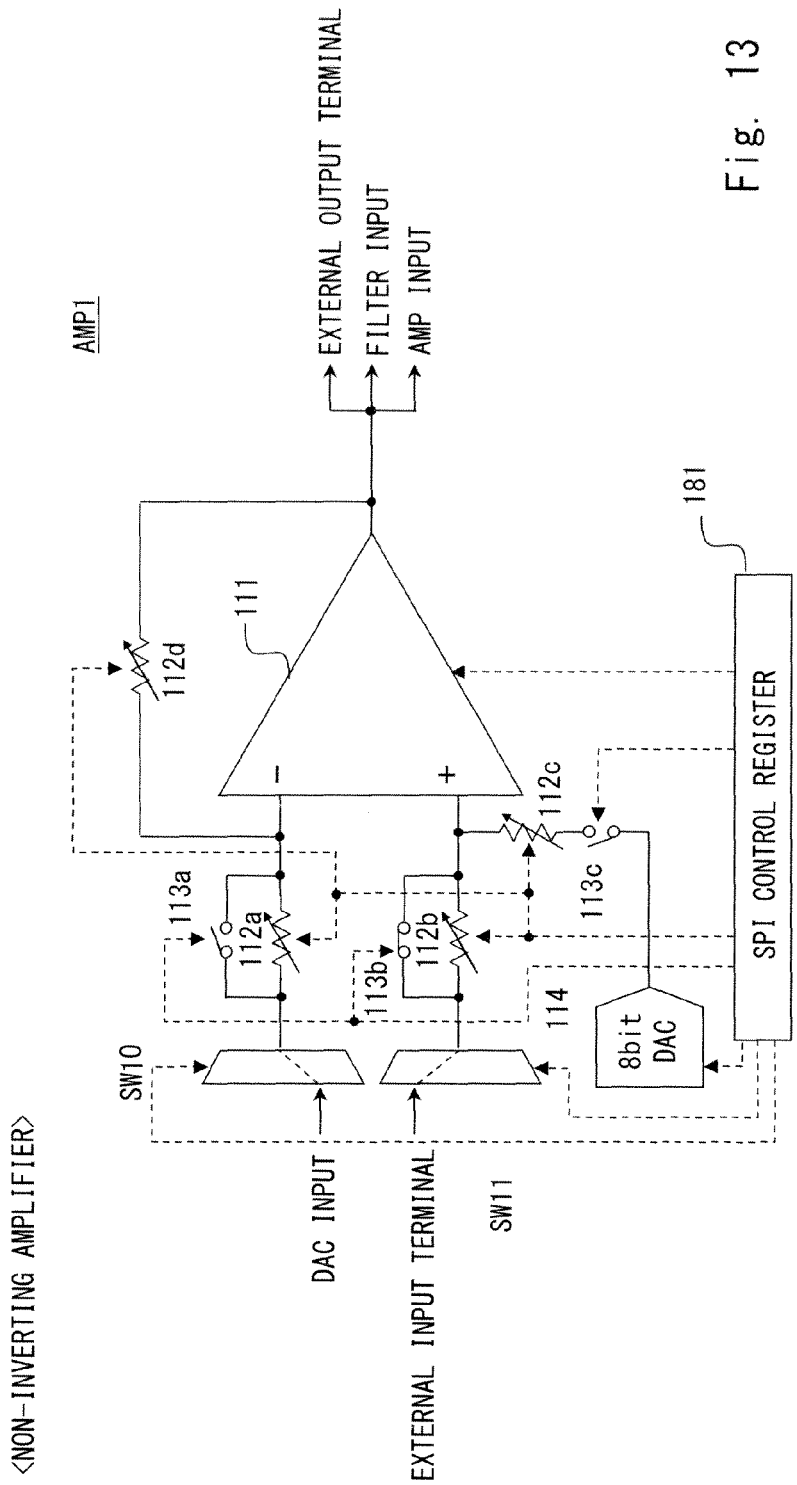
FIG. 13 is a circuit diagram showing an example of configuration change of the semiconductor device according to the first embodiment.

FIG. 13 shows an example of forming a non-inverting amplifier. According to the setting of the register, the multiplexer SW10 is switched to connect the output of the DAC 114 to the inverting input terminal, and the multiplexer SW11 is switched to connect the external input terminal (MPXIN20) to the non-inverting input terminal. In addition, the switches 113a and 113c are turned off, and the switch 113b is turned on. In such connections, a non-inverting amplifier is formed. Further, by the setting of the register 181, the resistance values of the variable resistors 112a and 112d are changed to set the gain of the amplifier, and the output voltage of the DAC is changed to adjust the operating point and offset of the amplifier. When a signal of a voltage-type sensor is input from the external input terminal, the non-inverting amplifier outputs a voltage generated by non-inverting amplification of the input voltage (which is in-phase with the input).

Figure 14:
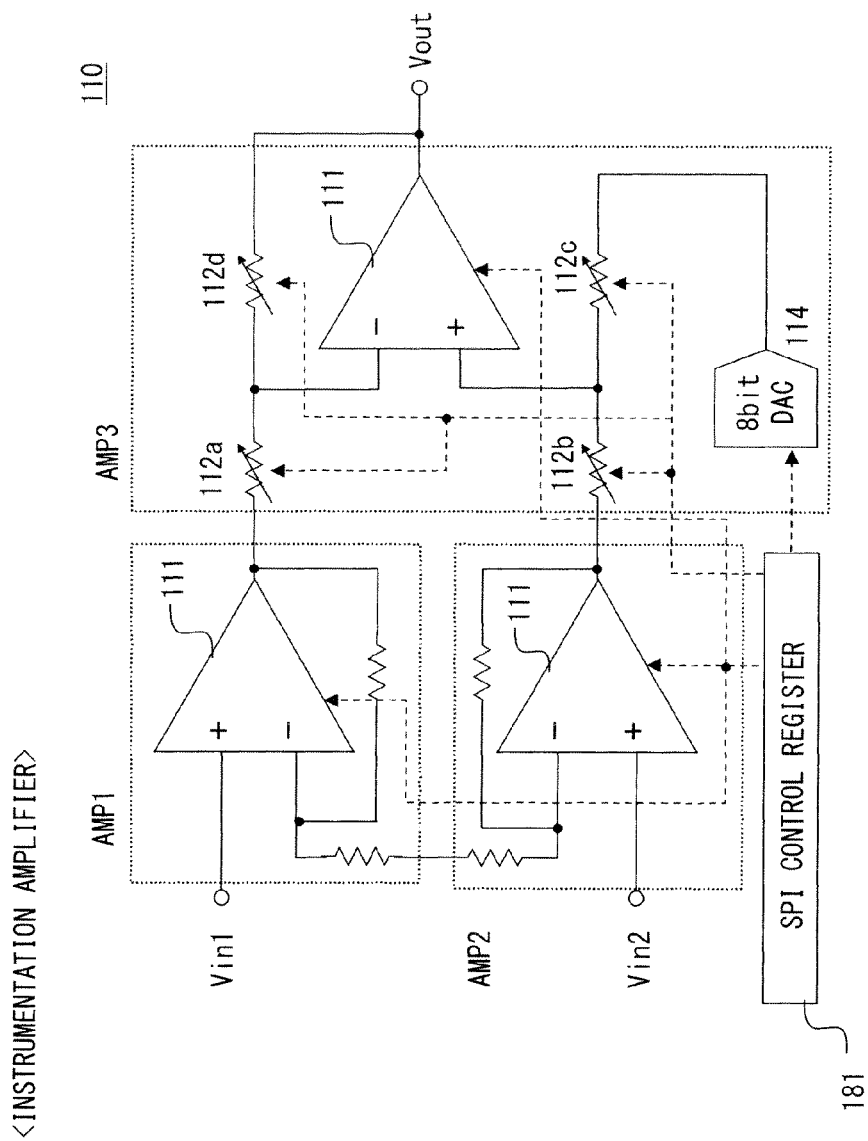
FIG. 14 is a circuit diagram showing an example of configuration change of the semiconductor device according to the first embodiment.

FIG. 14 shows an example of forming an instrumentation amplifier using the AMP1 to AMP3. As shown in FIG. 5, according to the setting of the register 181, the AMP1 to AMP3 are connected by the multiplexers (switches) SW10 and SW15 and a switch SW00 that is not shown in FIG. 5, and thereby the instrumentation amplifier of FIG. 14 can be formed. Note that, although the switches are not illustrated, the switch 113b is turned on and the variable resistor 112b is short-circuited, and the switches 113a and 113c are turned off in the AMP1. In the AMP2, the switch 113b is turned on and the variable resistor 112b is short-circuited, and the switches 123a and 123c are turned off. In the AMP3, the switch 113c is turned on and the DAC 114 is connected to the non-inverting input terminal, and the switches 143a and 143b are turned off.

Further, by the setting of the register 181, the resistance values of the variable resistors 112a to 112d of the AMP3 are changed to set the gain of the instrumentation amplifier, and the output voltage of the DAC 114 is changed to adjust the operating point and offset of the instrumentation amplifier. When a faint differential signal is input from the external input terminal, the instrumentation amplifier outputs a voltage generated by non-inverting amplification in the AMP1 and AMP2 and differential amplification in the AMP3 on the differential signal.

A specific circuit configuration of other circuits in the AFE unit 100 is described hereinafter with reference to FIGS. 15 to 20.

Figure 15:
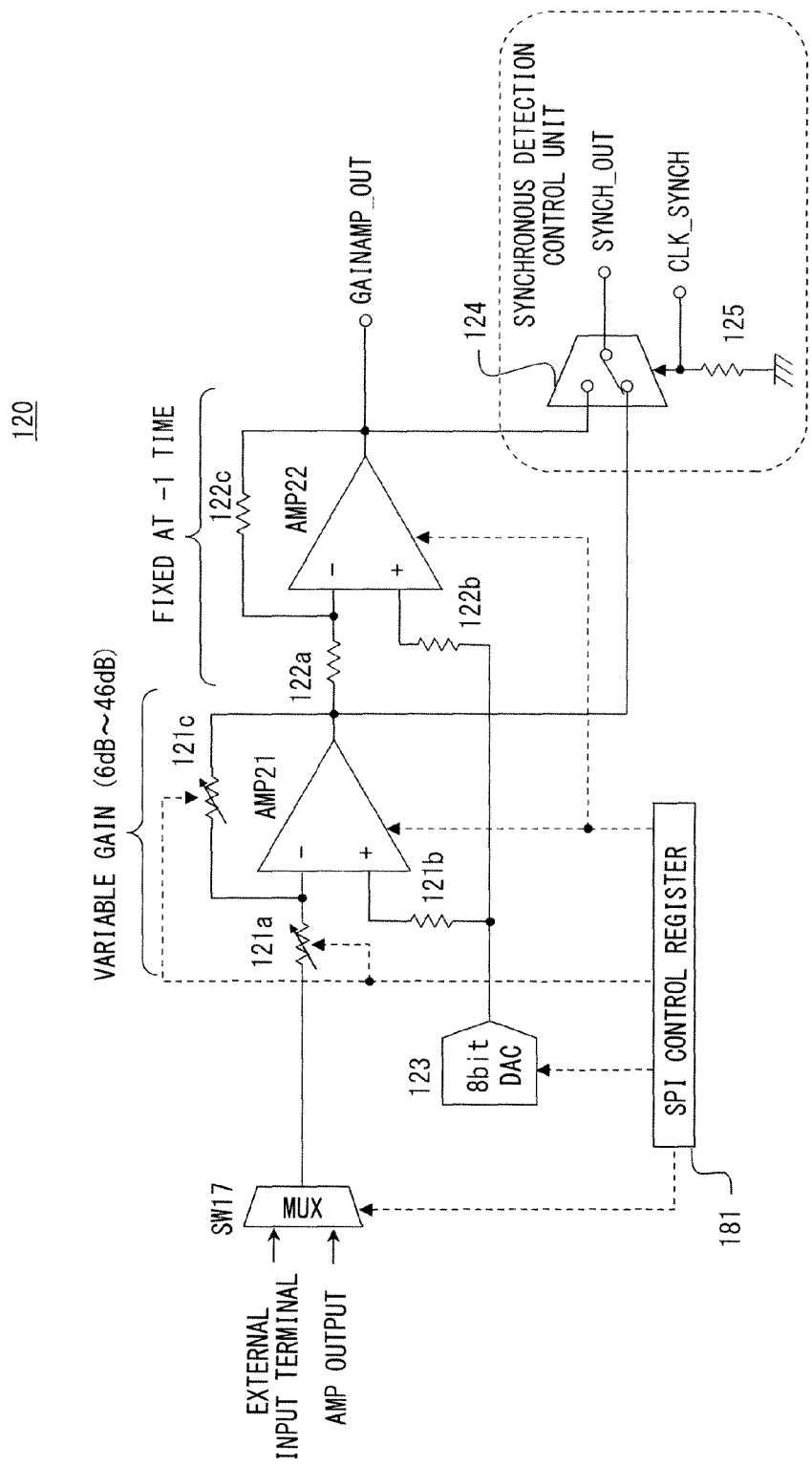
FIG. 15 is a circuit diagram showing a circuit configuration of the semiconductor device according to the first embodiment.

FIG. 15 shows a circuit configuration of the gain amplifier 120. The gain amplifier 120 supports the synchronous detection function and performs the amplification and synchronous detection of input signals. As a change in characteristics, the gain amplifier 120 can set the gain to be variable. For example, the gain can be set in units of 2 dB from 6 dB to 46 dB. Further, the power on/off can be switched by power-off mode.

As shown in FIG. 15, the gain amplifier 120 includes operational amplifiers AMP21 and AMP22 and further includes variable resistors 121a and 121c, fixed resistors 121b, 122a, 122b and 122c, and a DAC 123 that are connected to terminals of the operational amplifiers AMP21 and AMP22. Further, a multiplexer (switch) SW17 is connected to the variable resistor 121a as shown in FIG. 3. The gain amplifier 120 further includes a synchronous detection switch 124 and a fixed resistor 125 as a synchronous detection control unit for performing synchronous detection.

According to the set value of the register 181, the multiplexer SW17 is controlled to switch the input of the gain amplifier 120. Further, by changing the resistance values of the variable resistors 121a and 121c and the setting of the DAC 123 according to the set value of the register 181, the gain of the AMP21, the operating point and offset of the AMP21 and AMP22 and the like can be changed. Further, the power on/off of the operational amplifiers AMP21 and AMP22 can be controlled according to the set value of the register 181.

In the gain amplifier 120, when a signal is input from the AMP1 to AMP3 or the external input terminal, a signal generated by inverting amplification in the AMP21 and inverting amplification in the AMP22 is output to GAINAMP_OUT. Further, a synchronous clock CLK_SYNCH is input from the MCU unit 200, the connection of the synchronous detection switch 124 is switched at the timing of the synchronous clock CLK_SYNCH, and the output signal of any of the AMP21 and the AMP22 is output to SYNCH_OUT.

Figure 16:
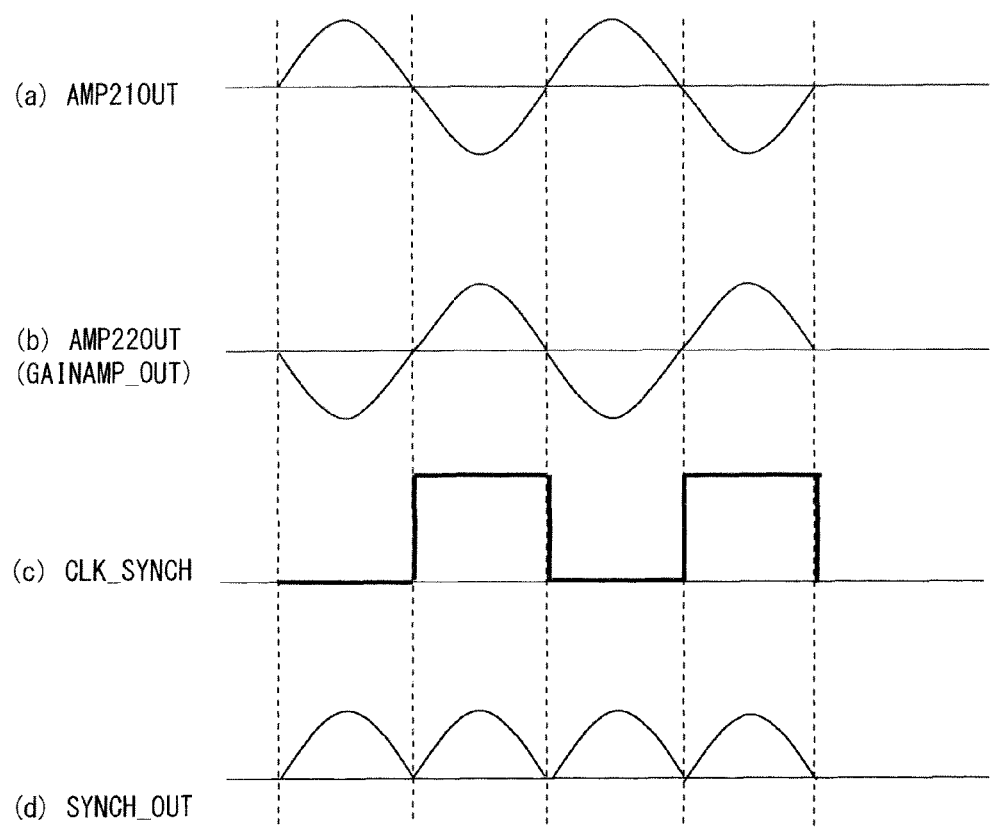
FIG. 16 is a timing chart showing an operation of circuits in the semiconductor device according to the first embodiment.

FIG. 16 is a timing chart showing the output operation of the gain amplifier 120. As shown in part (a) of FIG. 16, the AMP21 outputs the inverting signal of the input signal and, as shown in part (b) of FIG. 16, the AMP22 outputs the further inverting signal. The output signal of the AMP22 is output as the output of the gain amplifier 120 to GAINAMP_OUT.

The MCU unit 200 is connected to GAINAMP_OUT and generates a clock according to a signal of GAINAMP_OUT. In this example, as shown in part (c) of FIG. 16, when GAINAMP_OUT is Higher level than a reference value, CLK_SYNCH at High level is generated. Then, the synchronous clock CLK_SYNCH is supplied to the gain amplifier 120.

The synchronous detection switch 124 switches over a connection of SYNCH_OUT between the AMP21 and AMP22 according to CLK_SYNCK. When the clock CLK_SYNCK is at Low level, a connection is made to the AMP21 to output the output of the AMP21 to SYNCH_OUT, and when the clock CLK_SYNCK is at High level, a connection is made to the AMP22 to output the output of the AMP22 to SYNCH_OUT. Then, as shown in part (d) of FIG. 16, synchronous detection is made and a full-wave rectified signal is output from SYNCH_OUT.

Figure 17:
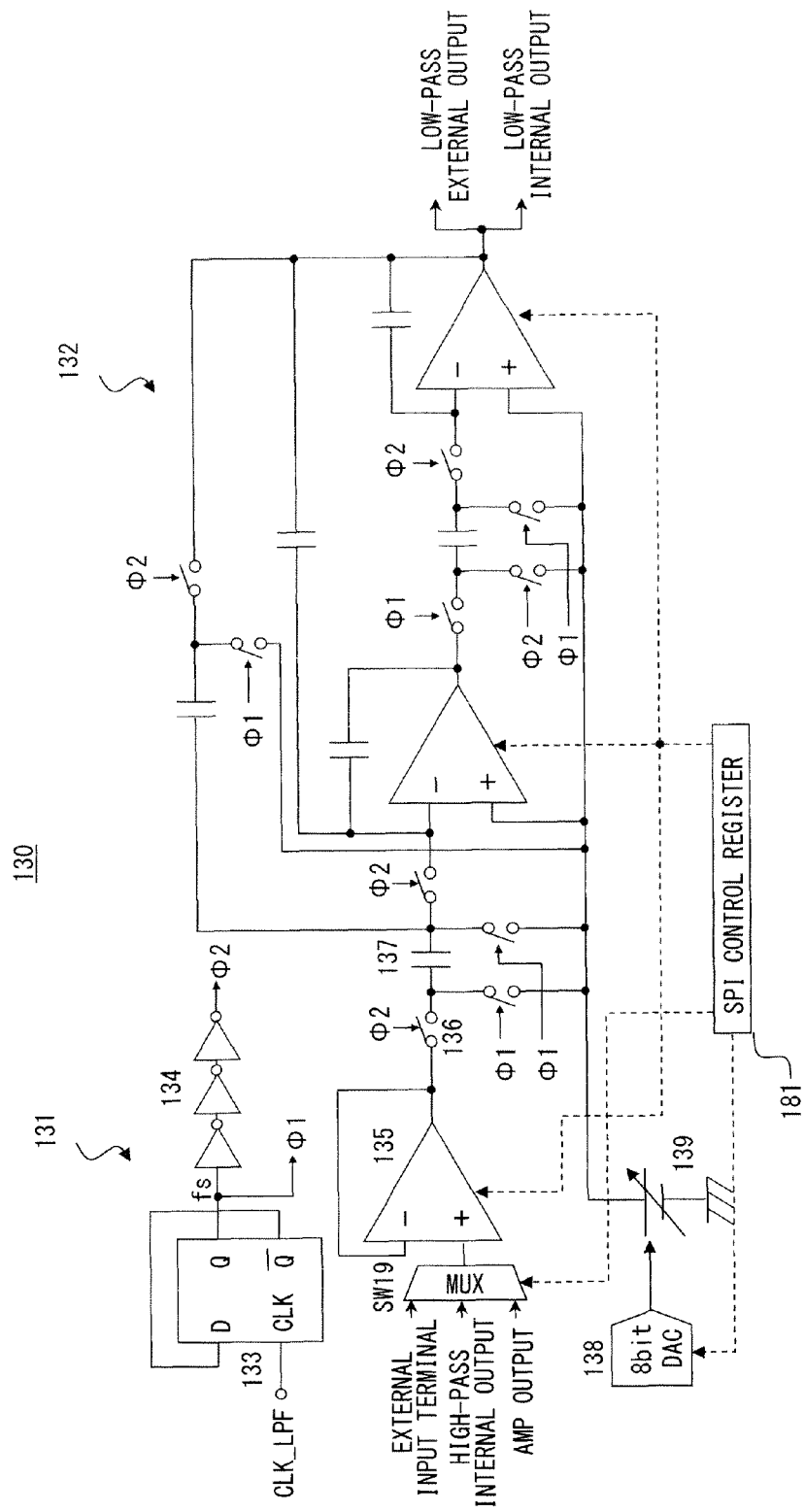
FIG. 17 is a circuit diagram showing a circuit configuration of the semiconductor device according to the first embodiment.

FIG. 17 shows a circuit configuration of the low-pass filter 130. The low-pass filter 130 is a SC (Switched Capacitor) low-pass filter with a variable cutoff frequency and used for filtering of an input signal.

The characteristics of the low-pass filter 130 are that a Q value is a fixed value, which is 0.702, for example. As a change in characteristics, the cutoff frequency fc can be set to be variable. For example, it can be set from 9 Hz to 900 Hz. Further, the power on/off can be switched by power-off mode.

As shown in FIG. 17, the low-pass filter 130 includes a switching signal generation unit 131 that generates a switching signal and a filtering unit 132 that filters an input signal according to the switching signal.

The switching signal generation unit 131 includes a flip-flop 133 and a plurality of inverters 134. The filtering unit 132 includes a plurality of operational amplifiers 135 and further includes a plurality of switches 136 connected to the plurality of operational amplifiers 135, a capacitor 137, and a variable power supply 139 that is controlled by a DAC 138. Further, a multiplexer (switch) SW19 is connected as shown in FIG. 3.

According to the set value of the register 181, the multiplexer SW19 is controlled to switch the input of the low-pass filter 130. Further, according to the set value of the register 181, the setting of the DAC 138 is changed to control the variable power supply 139 to thereby change the operating point, offset and the like of the amplifier. Further, according to the set value of the register 181, the on/off of the power supply of the low-pass filter 130 can be controlled.

In the low-pass filter 130, the clock CLK_LPF is input to the switching signal generation unit 131 from the outside, and switching signals Φ1 and Φ2 are generated by the flip-flop 133 and the inverters 134. In the filtering unit 132, when a signal is input from the external input terminal, the gain amplifier 120 or the like, the signal is output through three operational amplifiers 135 and, at that time, the switches 136 are turned on/off by the switching signals Φ1 and Φ2, and a connection of the capacitor 137 is switched. Consequently, a signal after removing higher frequency components than the cutoff frequency of the input signal is output.

The cutoff frequency can be changed by the clock CLK_LPF that is input from the outside by the MCU unit 200. To be specific, the cutoff frequency is fc=0.009×fs. In this formula, fs=(½)×f(f is the frequency of CLK_LPF).

Figure 18:
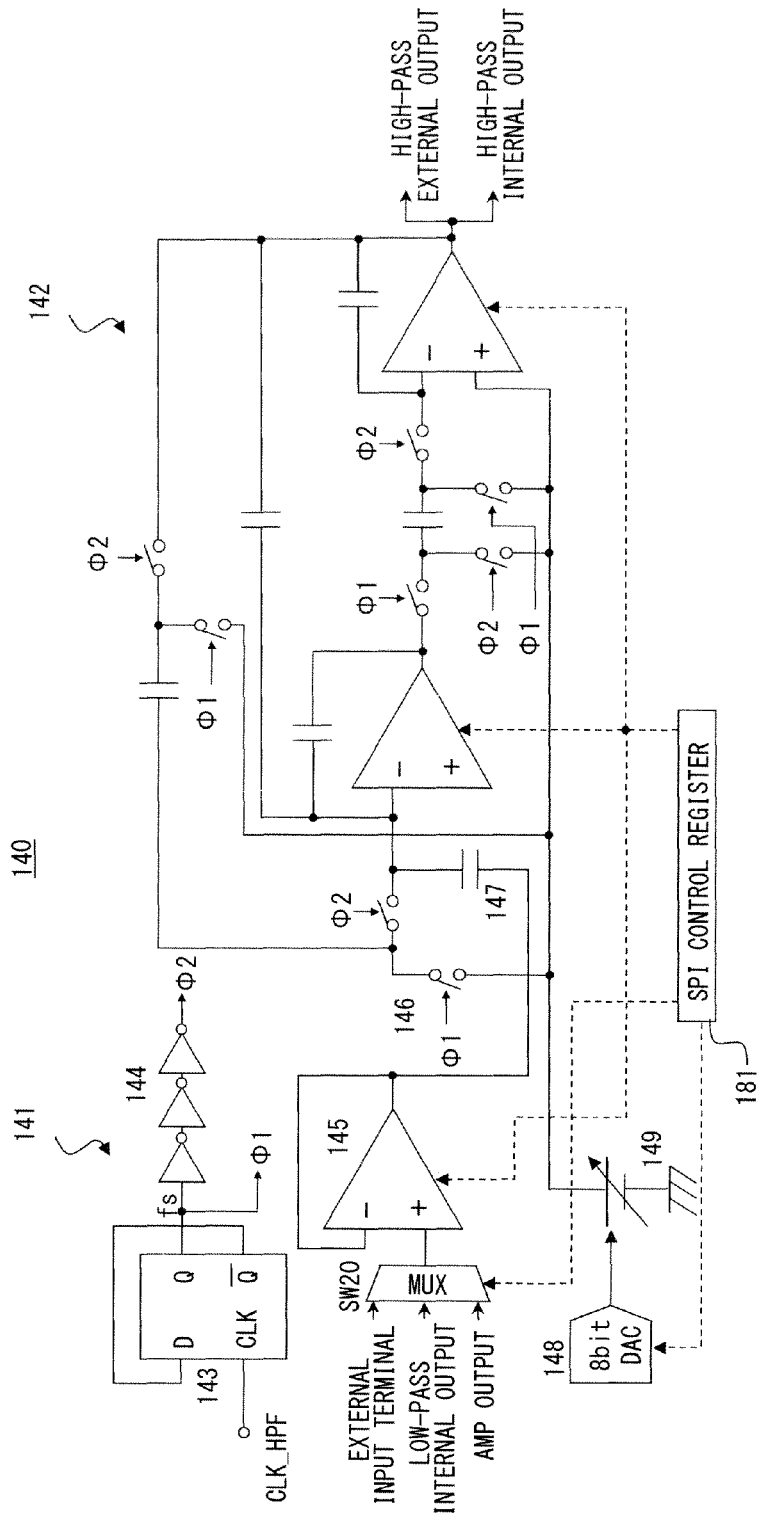
FIG. 18 is a circuit diagram showing a circuit configuration of the semiconductor device according to the first embodiment.

FIG. 18 shows a circuit configuration of the high-pass filter 140. The high-pass filter 140 is a SC high-pass filter with a variable cutoff frequency and used for filtering of an input signal.

The characteristics of the high-pass filter 140 are that a Q value is a fixed value, which is 0.702, for example. As a change in characteristics, the cutoff frequency fc can be set to be variable. For example, it can be set from 8 Hz to 800 Hz. Further, the power on/off can be switched by power-off mode.

As shown in FIG. 18, the high-pass filter 140 includes a switching signal generation unit 141 that generates a switching signal and a filtering unit 142 that filters an input signal according to the switching signal.

The switching signal generation unit 141 includes a flip-flop 143 and a plurality of inverters 144. The filtering unit 142 includes a plurality of operational amplifiers 145 and further includes a plurality of switches 146 connected to the plurality of operational amplifiers 145, a capacitor 147, and a variable power supply 149 that is controlled by a DAC 148. Further, a multiplexer (switch) SW20 is connected as shown in FIG. 3.

According to the set value of the register 181, the multiplexer SW20 is controlled to switch the input of the high-pass filter 140. Further, according to the set value of the register 181, the setting of the DAC 148 is changed to control the variable power supply 149 to thereby change the operating point, offset and the like of the amplifier. Further, according to the set value of the register 181, the on/off of the power supply of the high-pass filter 140 can be controlled.

In the high-pass filter 140, the clock CLK_HPF is input to the switching signal generation unit 141 from the outside, and switching signals Φ1 and Φ2 are generated by the flip-flop 143 and the inverters 144. In the filtering unit 142, when a signal is input from the external input terminal, the gain amplifier 120 or the like, the signal is output through three operational amplifiers 145 and, at that time, the switches 146 are turned on/off by the switching signals Φ1 and Φ2, and a connection of the capacitor 147 is switched. Consequently, a signal after removing lower frequency components than the cutoff frequency of the input signal is output.

The cutoff frequency can be changed by the clock CLK_HPF that is input from the outside by the MCU unit 200. To be specific, the cutoff frequency is fc=0.008×fs. In this formula, fs=(½)×f(f is the frequency of CLK_HPF).

Figure 19:
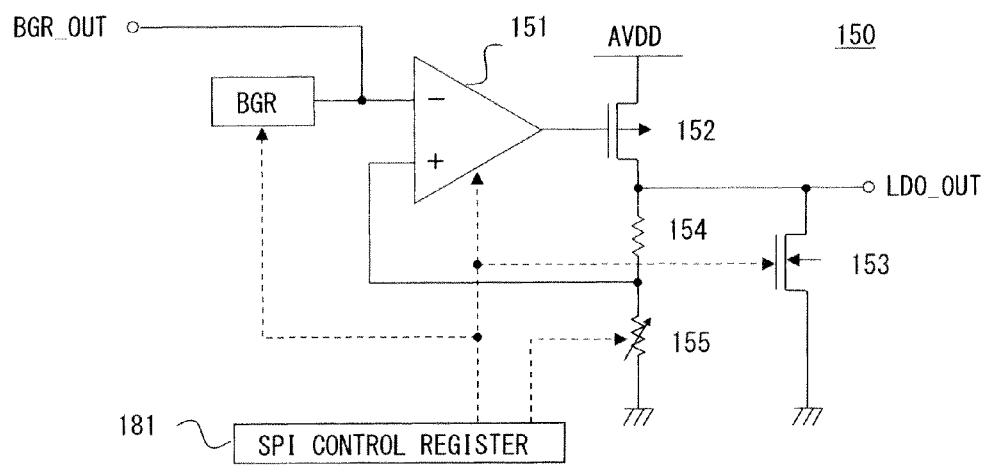
FIG. 19 is a circuit diagram showing a circuit configuration of the semiconductor device according to the first embodiment.

FIG. 19 shows a circuit configuration of the variable regulator 150. The variable regulator 150 is a regulator that makes the output voltage variable, and it is a reference power supply generation circuit of the A/D converter 260 of the MCU unit 200. For example, as a change in characteristics, the variable regulator 150 can set the output voltage in units of 0.1 V from 2.0 V to 3.3 V with an accuracy of ±5%. Further, an output current of the variable regulator 150 is 15 mA. The variable regulator 150 can control on/off of the output power supply.

As shown in FIG. 19, the variable regulator 150 includes an operational amplifier 151 and further includes a band gap reference BGR that is connected to the input side of the operational amplifier 151, and transistors 152 and 153, a fixed resistor 154, and a variable resistor 155 that are connected to the output side of the operational amplifier 151.

According to the set value of the register 181, the voltage of the BGR is set, and the output voltage can be changed by changing resistance value of the variable resistor 155. Further, according to the set value of the register 181, the power on/off of the operational amplifier 151 and the on/off of the transistor 153 are switched, and the start and stop of output of the output voltage are controlled.

In the variable regulator 150, the voltage of the BGR is output from BGR_OUT. The operational amplifier 151 operates in accordance with the voltage of the BGR and the voltage of the variable resistor 155 to control the transistor 152, and the voltage corresponding to the ratio of the fixed resistor 154 and the variable resistor 155 is output.

Figure 20:
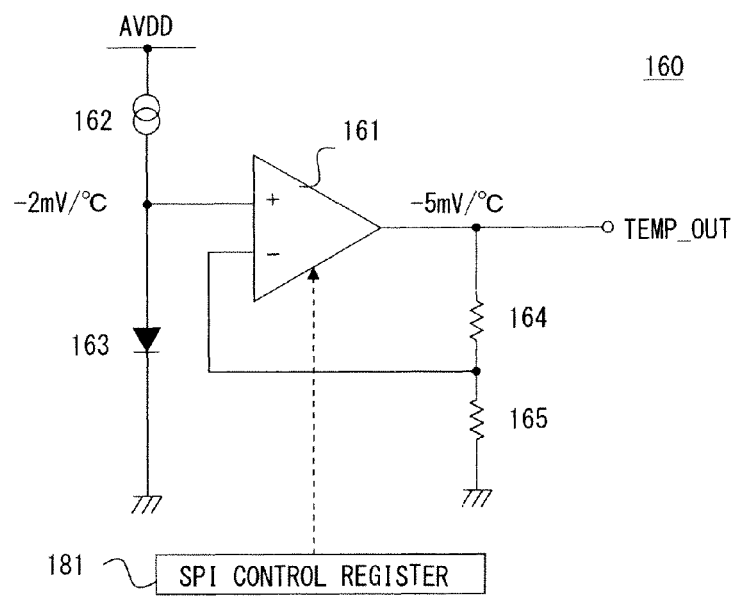
FIG. 20 is a circuit diagram showing a circuit configuration of the semiconductor device according to the first embodiment.

FIG. 20 shows a circuit configuration of the temperature sensor 160. The temperature sensor 160 is a sensor that measures the temperature of the semiconductor device 1, and it can be used for the MCU unit 200 to make correction of the temperature characteristics or the like based on the measurement result. For example, as the characteristics of the temperature sensor 160, the output temperature coefficient is −5 mV/° C. Further, the power on/off can be switched by power-off mode.

As shown in FIG. 20, the temperature sensor 160 includes an operational amplifier 161 and further includes a current source 162 and a diode 163 that are connected to the input side of the operational amplifier 161, and fixed resistors 164 and 165 that are connected to the output side of the operational amplifier 161. The power supply of the operational amplifier 161 can be turned on/off according to the set value of the register 181.

In the temperature sensor 160, the voltage of the diode 163 changes at −2 mV/?C according to the temperature, and the operational amplifier 161 makes non-inverting amplification of the voltage and outputs it as −5 mV/° C.

As described above, the semiconductor device 1 can set the circuit configuration and characteristics of the AFE unit 100 inside the semiconductor device 1 to be variable. Therefore, one semiconductor allows connection with various sensors and thus can be used for many application systems (applications).

For example, when the circuit configuration of the configurable amplifier 110 is set as a non-inverting amplifier, it allows connection with a voltage output sensor and thus can be used for an application system using an infrared sensor, a temperature sensor, a magnetic sensor or the like. As an example, it can be used for a digital camera with an infrared sensor, a printer with a temperature sensor, a tablet terminal with a magnetic sensor, an air conditioner with an infrared sensor and the like.

Further, when the circuit configuration of the configurable amplifier 110 is set as an instrumentation amplifier, it allows connection with a faint differential output sensor and thus can be used for an application system using a pressure sensor, a gyro sensor, a shock sensor or the like. As an example, it can be used for a blood-pressure meter with a pressure sensor, a scale with a pressure sensor, a mobile phone with a gyro sensor, a liquid crystal television with a shock sensor and the like.

Further, when the circuit configuration of the configurable amplifier 110 is set as an I/V amplifier, it allows connection with a current output sensor and thus can be used for an application system using a photodiode, a presence sensor, an infrared sensor or the like. As an example, it can be used for a digital camera with a photodiode, a monitoring camera with a presence sensor, a toilet seat with a presence sensor, a barcode reader with an infrared sensor and the like.

As described above, in the semiconductor device 1 of the first embodiment, the circuit format and the circuit configuration of the analog circuit elements provided in the AFE unit can be changed. In the semiconductor device 1, a plurality of circuit setting commands (hereinafter merely referred to as commands) stored to the memory 220 included in the MCU unit 200 are transmitted to the AFE unit 100. Then, the semiconductor device 1 updates circuit configuration control values stored to the register 181 (hereinafter referred to as the control register 181) according to the commands received by the AFE unit 100 to thereby update the circuit format and the circuit configuration of the AFE unit. Before updating the circuit configuration control values by the plurality of received commands, the semiconductor device 1 performs error detection processing to check whether an invalid path is included in the circuit configuration of the analog functional circuits which is to be updated and is determined by the plurality of received commands. This enables the semiconductor device 1 to prevent a malfunction of the AFE unit generated due to failures such as destruction of a value of the commands stored to the memory 220 or destruction of a value of the command at the time of transmitting the command.

Hereinafter, a configuration and a method for detecting an error in the commands by the semiconductor device 1 of the first embodiment are described in more detail. Further, an example is explained below in which a configuration for detecting an error in the commands is provided inside the communication interface of the AFE unit 100 (e.g., inside the SPI interface 180). However the configuration for detecting an error in the commands may be provided in any unit as long as it is inside the AFE unit 100.

Figure 21:
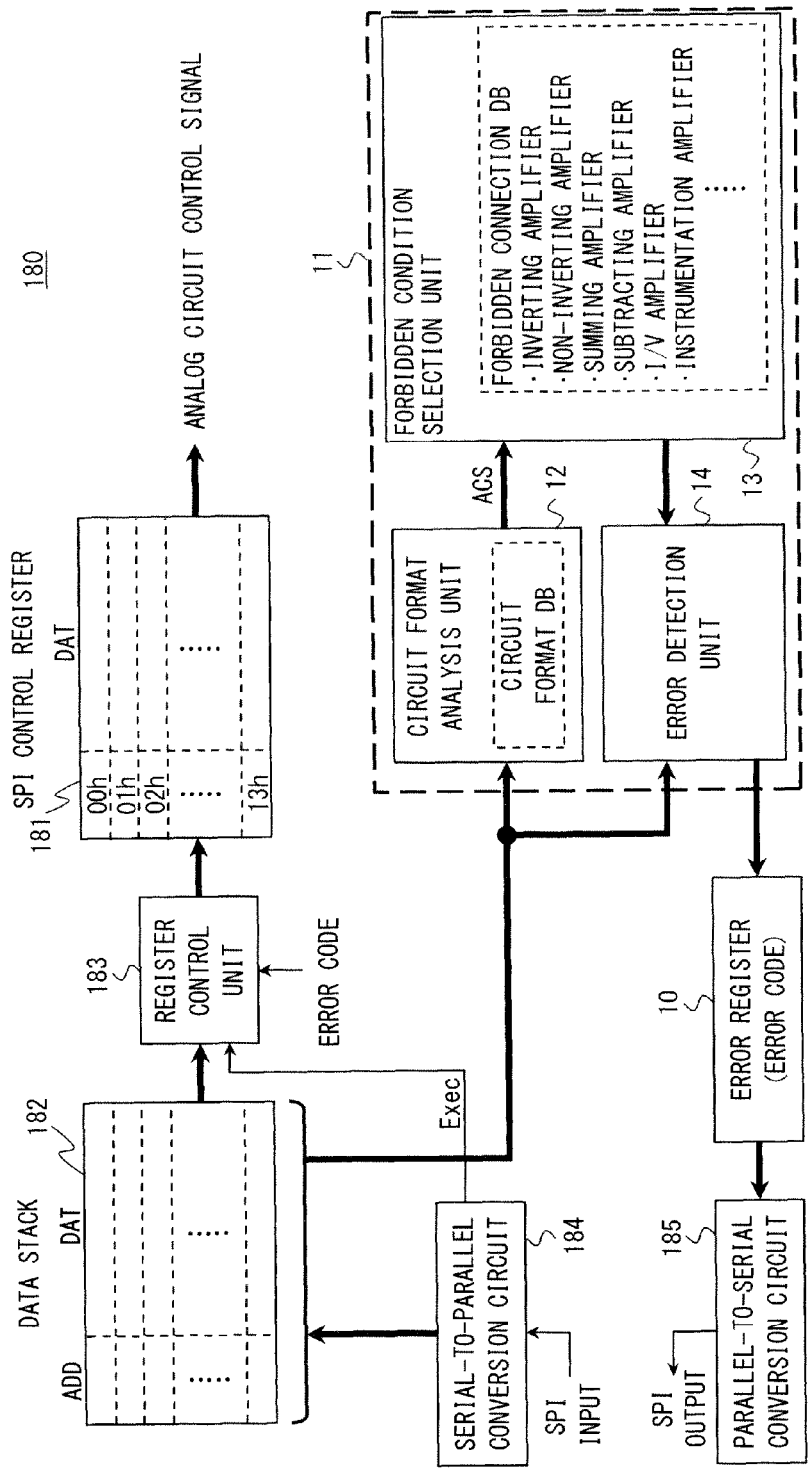
FIG. 21 is a block diagram showing an SPI interface of the semiconductor device according to the first embodiment.

FIG. 21 is a detailed block diagram of the SPI interface 180 of the semiconductor device 1 according to the first embodiment. As shown in FIG. 21, the SPI interface 180 includes the control register 181, a data stack 182, a register control unit 183, a serial-to-parallel conversion circuit 184, an error register 10, and a circuit configuration error detection unit 11.

The control register 181 is the register shown in FIG. 3 and the like. The control register 181 stores the circuit configuration control values that specify a current configuration of the plurality of analog functional circuits. In the control register 181, addresses of regions to store the circuit configuration control values are specified in advance as circuit configuration data DAT. The circuit configuration control value corresponding to one address is a value for controlling an open/closed state of a predetermined switching circuit or a value specifying a characteristic value of a predetermined circuit element such as a variable resistor. For example, the circuit configuration control value stored to an address "00h" controls the connection state of the switches 113a, 113b, and SW00 and the multiplexers SW10 and SW11.

The data stack 182 stores the plurality of commands transmitted from the MCU unit 200. At this time, the data stack 182 stores the commands in order of receipt. The data stack 182 stores address data ADD and the circuit configuration data DAT included in the commands. The plurality of commands here specify at least circuit format setting values that specify the circuit format of the plurality of analog functional circuits. Further, the circuit configuration data DAT includes circuit format setting values that specify the circuit format of the plurality of analog functional circuits and circuit configuration setting values that specify circuit characteristics and the like of the analog functional circuits.

In response to a command execution instruction Exec transmitted from the MCU unit 200, the register control unit 183 updates the circuit configuration control values of the control register 181 by the circuit configuration data DAT included in the plurality of respective commands stored to the data stack 182. When an error code stored to the error register 10 indicates a normal value meaning that there is no error in the circuit configuration of the analog functional circuit which is to be updated and is determined by the plurality of commands stored to the data stack 182, the register control unit 183 updates the circuit configuration control values of the control register 181. On the contrary, when an error code stored to the error register 10 indicates an error value meaning that there is an error in the circuit configuration of the analog functional circuit which is to be updated, the register control unit 103 stops updating the circuit configuration control values.

The serial-to-parallel conversion circuit 184 receives an SPI input signal (signal including CS, SCLK, and SDI), converts input data SDI, which is serial data, into parallel data, and supplies the parallel data to the data stack 182. The input data SDI is a signal in which an operation instruction, the address data ADD, and the circuit configuration data DAT are arranged in series.

A parallel-to-serial conversion circuit 185 converts parallel data supplied from a memory or a register in the AFE unit 100 into serial data, and outputs an SPI output signal (signal including SDO).

In the semiconductor device 1, when a received operation instruction is a write instruction, the serial-to-parallel conversion circuit 184 writes the address data ADD and the circuit configuration data DAT included in the input data SDI in the stack 182. In the semiconductor device 1, when a received operation instruction is a read instruction, data is read from a register or a memory specified by the address data ADD included in the input data, and the parallel-to-serial conversion circuit 185 outputs the read data. In the semiconductor device 1, when a received operation instruction is a command execution instruction, a command execution instruction Exec is supplied to the register control unit 183.

The error register 10 stores error codes. The circuit configuration error detection unit 11 updates values of the error codes. When the circuit configuration of the analog functional circuit which is to be updated and is determined by the plurality of commands stored to the data stack 182 has an invalid configuration included in forbidden conditions, the error code will have an error value (e.g., 00h and 10h). Conversely, when the circuit configuration of the analog functional circuit which is to be updated and is determined by the plurality of commands stored to the data stack 182 does not have an invalid configuration included in the forbidden conditions, the error code will have a normal value (e.g., FFh). In the first embodiment, the error code is transmitted to the MCU unit 200 in response to a request from the MCU unit 200.

When the circuit configuration of the analog functional circuit which is to be updated and is determined by the plurality of commands stored to the data stack 182 includes a circuit configuration satisfying the forbidden conditions that have been previously set, the circuit configuration error detection unit 11 generates an error code having an error value indicating that the circuit configuration which is to be updated violates the forbidden conditions. Conversely, when the circuit configuration which is to be updated and is determined by the plurality of commands stored to the data stack 182 does not include a circuit configuration that satisfies the forbidden conditions that have been previously set, the circuit configuration error detection unit 11 generates an error code having a normal value.

To be more specific, the circuit configuration error detection unit 11 includes a first circuit format analysis unit (e.g., circuit format analysis unit 12), a forbidden condition selection unit 13, and an error detection unit 14. The plurality of commands handled by the semiconductor device 1 of the first embodiment includes circuit format setting values that specify the circuit format of the analog functional circuit which is to be updated. That is, the circuit format setting value constitutes a part of a circuit format setting command. The circuit format setting command also includes a circuit configuration setting value that specifies an input signal to be supplied to the analog functional circuit. Note that the circuit configuration data is composed of values including the circuit format setting value and the circuit configuration setting value. Further, the plurality of commands also include other circuit configuration setting values that specify circuit characteristics of the analog functional circuit.

The circuit format analysis unit 12 refers to the plurality of commands stored to the data stack 182, identifies the circuit format of the analog functional circuit which is to be updated, and outputs a circuit format signal ACS indicating the identified circuit format which is to be updated. Specifically, the circuit format setting command includes the circuit configuration setting values that specify open/closed states of the switches 113*a* to 113*c*, 123*a* to 123*c*, 143*a* to 143*c*, and SW00. In this embodiment, the circuit format setting command includes the circuit configuration setting values indicating signals selected by the multiplexers SW10 to SW15. Further, the circuit format analysis unit 12 includes a circuit format database that specifies, for respective circuit configurations, expected values of the open/closed states of the switches 113*a* to 113*c*, 123*a* to 123*c*, 143*a* to 143*c*, and SW00 (switches 123*a* to 123*c*, 143*a* to 143*c*, and SW00 to SW02 are described later). Then, the circuit format analysis unit 12 compares the circuit format setting values included in the circuit format setting commands with the expected values included in the circuit format configuration database, and identifies a circuit format corresponding to the expected values that match the circuit format setting values as the circuit format which is to be updated.

The forbidden condition selection unit 13 selects forbidden conditions corresponding to the circuit format identified by the circuit format analysis unit 12 from a plurality of forbidden conditions describing forbidden connection states for the respective circuit formats. To be more specific, the forbidden condition selection unit 13 includes a forbidden connection database including the forbidden conditions for the respective circuit formats. The forbidden condition selection unit 13 selects the forbidden conditions corresponding to the circuit format which is to be updated from the forbidden connection database. At this time, the forbidden condition selection unit 13 selects the forbidden conditions that correspond to the circuit format indicated by the circuit format signal ACS. Moreover, the forbidden condition selection unit 13 notifies the error detection unit 14 of the selected forbidden conditions by a forbidden condition notification signal.

Note that in the first embodiment, the forbidden conditions include a setting condition in which the circuits fail to normally operate due to incorrect setting values of the multiplexers SW10 and SW11 and the switch SW00. However, the forbidden conditions are not limited to the above conditions, but may include various conditions that hinder a circuit from normally operating.

The error detection unit 14 refers to the plurality of commands stored to the data stack 182, and when the circuit configuration of the analog functional circuit which is to be updated includes a connection condition satisfying the forbidden conditions that are selected by the forbidden condition selection unit 13, the error detection unit 14 generates an error code having an error value indicating that the circuit configuration which is to be updated violates the forbidden conditions. To be more specific, the error detection unit 14 refers to the plurality of commands stored to the data stack 182 and evaluates whether or not there is a circuit configuration that matches the forbidden conditions indicated by the forbidden condition notification signal. If there is a circuit configuration that matches the forbidden conditions, the error detection unit 14 sets an error value for the error code.

Figure 22:
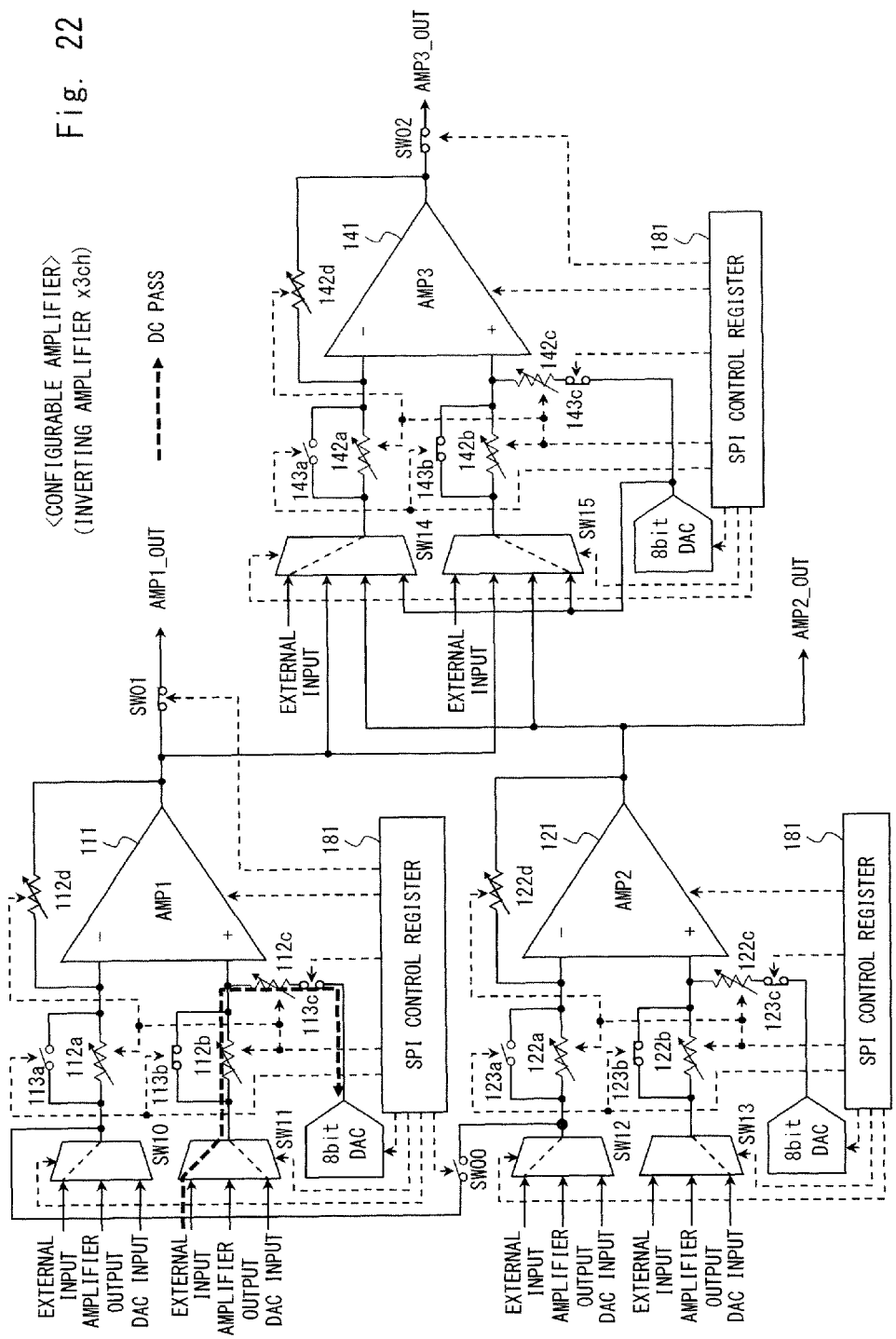
FIG. 22 is a circuit diagram showing a configurable amplifier of the semiconductor device according to the first embodiment.

Next, an operation of the semiconductor device 1 of the first embodiment is explained with a specific example. Here, the configurable amplifier 110 in the AFE unit 100 is explained as one of circuits to be controlled in the semiconductor device 1 of the first embodiment. A specific circuit configuration of the configurable amplifier 110 is shown in FIG. 22. In the example shown in FIG. 22, the separate amplifiers AMP1 to AMP3 are respectively configured as inverting amplifiers, forming a 3ch inverting amplifier.

As shown in FIG. 22, the configurable amplifier 110 includes the separate amplifiers AMP1 to AMP3. The configurable amplifier 110 can realize five types of circuit configurations, which are: an inverting amplifier, a non-inverting amplifier, a subtracting (differential) amplifier, an I/V amplifier, and an instrumentation amplifier, by switching connection destinations of the multiplexers SW10 to SW15 and the open/closed states of the switches 113*a* to 113*c*, 123*a* to 123*c*, and 143*a* to 143*c*. Note that a summing amplifier can be implemented by providing switches 112*d*, 122*d*, and 142*d* for switching connections of respective one ends of the resistors 112*b*, 122*b*, and 142*b* to a positive input terminal or a negative input terminal of the respective amplifiers. Further, the separate amplifiers AMP1 to AMP3 of the configurable amplifier 110 have almost the same circuit configuration. Therefore, in FIG. 22, registers and switches of the separate amplifiers AMP2 and AMP3 corresponding to variable resistors and switches associated with the separate amplifier AMP1 are denoted according to the same rule as the separate amplifier AMP1. For example, variable resistors corresponding to the variable resistor 112*a* are denoted by 122*a* and 142*a*.

Furthermore, in FIG. 22, a signal path that is one of the forbidden conditions is indicated by a thick broken line. The forbidden condition shown in FIG. 22 is a condition that leads to a circuit configuration value in which when the circuit format of the analog functional circuit (e.g., separate amplifier AMP1) is an inverting amplifier, the multiplexer SW11 selects an external output.

Next, FIG. 23 is a table for explaining commands handled by the semiconductor device 1 of the first embodiment. The table shown in FIG. 23 shows only the circuit format setting commands that specify the circuit format and the circuit configuration of the separate amplifiers AMP1 to AMP3 that constitute the configurable amplifier 110. Note that commands supplied to the analog front-end unit 100 includes a command for setting circuit characteristics such as a command for setting a gain of the separate amplifier, a command for setting characteristics of a filter, and a command for setting power on/off.

As shown in FIG. 23, the circuit format setting command includes an address value as the address data ADD and 8-bit data of the circuit format setting values and the circuit configuration setting values. To be more specific, three MSBs of the 8-bit data are the circuit format setting values, and five LSBs are the circuit configuration setting values. The input data SDI that is input via the SPI interface includes the address value and the 8-bit data. The address values in the table shown in FIG. 23 indicate addresses in the control register 181.

The example shown in FIG. 23 illustrates the circuit format setting commands that specify the circuit formats of the separate amplifiers AMP1 to AMP3. The circuit format setting command that specifies the circuit format of the separate amplifier AMP1 specifies an address 00h and includes the circuit format setting values that specify the open/closed states of the switches 113*a* to 113*c*, the circuit configuration value that specifies an open/closed state of the switch SW00, and the circuit configuration setting values that specify input signals to be selected by the multiplexers SW10 and SW11. The circuit format setting command that specifies the circuit format of the separate amplifier AMP2 specifies an address 01h and includes the circuit format setting values that specify the open/closed states of the switches 123a to 123c and the circuit configuration setting values that specify input signals to be selected by the multiplexers SW12 and SW13. The circuit format setting command that specifies the circuit format of the separate amplifier AMP3 specifies an address 02h and includes the circuit format setting values that specify the open/closed states of the switches 143a to 143c and the circuit configuration setting values that specify input signals to be selected by the multiplexers SW14 and SW15.

FIG. 24 is a table for explaining contents of the circuit format database. FIG. 24 only shows the circuit format database corresponding to the separate amplifier AMP1. However, similar databases are provided for the separate amplifiers AMP2, AMP3 and the like. As shown in FIG. 24, the circuit format database of the separate amplifier AMP1 includes expected values of three MSBs of the setting values stored to the data stack 182. The expected values are different for each circuit format. Further, the circuit format database specifies the circuit format corresponding to the expected values.

The circuit format analysis unit 12 refers to the circuit format database, compares the circuit format setting values included in the circuit format setting commands shown in FIG. 23 with the expected values stored to the circuit format database, and identifies the circuit format corresponding to the expected values that match the circuit format setting values as the circuit format of the analog functional circuit (e.g., separate amplifier AMP1) which is to be updated. For example, when the switch 113a is turned off, and the switches 113b and 113c are turned on, the circuit format analysis unit 12 identifies that the circuit format of the separate amplifier AMP1 which is to be updated is an inverting amplifier.

Next, a connection forbidden database including the forbidden conditions used by the semiconductor device 1 of the first embodiment is explained. In the first embodiment, a connection state including a signal path that causes an abnormal current to be generated in an external input terminal and a connection that hinders circuits from normally operating shall be a forbidden condition. Therefore, the connection forbidden database used in the first embodiment includes the forbidden conditions describing, for each circuit configuration, the open/closed states of the switches in which forbidden signal paths are formed Specific examples of the forbidden conditions are shown in FIGS. 25 to 28, and the forbidden conditions are explained below. Note that the forbidden connection databases of the first embodiment shown in FIGS. 25 to 28 define error codes corresponding to abnormal states. Note that in this embodiment, the forbidden conditions include a direct current path condition specifying a connection state of a switching circuit group that has the potentials in which a direct current could flow through a signal path included in the analog functional circuit which is to be updated. The error detection unit 14 stores an error code corresponding to a detected error to the error register 10 as an error value.

Figure 25:
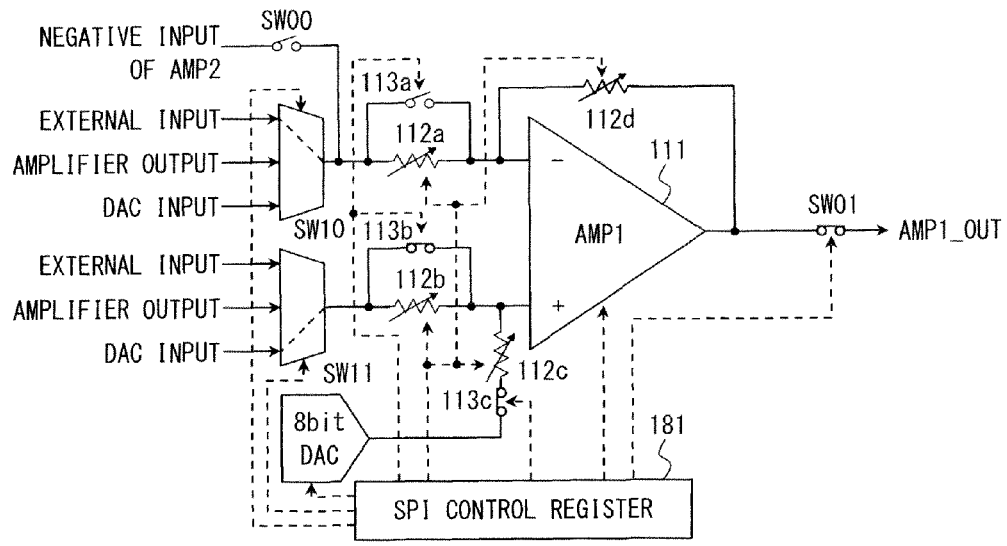
FIG. 25 is a circuit diagram and a table for explaining prohibition conditions for the semiconductor device according to the first embodiment.

Firstly, FIG. 25 is a circuit diagram and a table for explaining the forbidden conditions when the circuit format of the separate amplifier AMP1 is an inverting amplifier. As shown in FIG. 25, when the circuit format is an inverting amplifier, in the normal state, the multiplexer SW10 selects an external input, and the multiplexer SW11 selects a DAC input. Further, in the normal state, the switch 113a is turned off, and the switches 113b and 113c are turned on.

The forbidden conditions describe the open/closed states of the switches that change from the normal state in which the switches are opened/closed in the manner stated above to the abnormal state. In the example shown in FIG. 25, three forbidden conditions are described. When five LSBs of the circuit format setting command are 1xxxx (x means "don't care"), the multiplexer SW00 is turned on, thereby generating a failure in which a signal from the separate amplifier AMP2 routes around. In this case, the error detection circuit 14 outputs 00h as the error code. When five LSBs of the circuit format setting command are x11xx, the multiplexer SW10 selects a DAC input, thereby generating a failure of having no input to the inverting amplifier. In this case, the error detection circuit 14 outputs 01h as the error code. When five LSBs of the circuit format setting commands are xxx01, the multiplexer SW11 selects an external input, thereby generating a failure in which a DC path through which a direct current flows is formed between an external terminal and the DAC 114 and causing an abnormal current to flow. In this case, the error detection circuit 14 outputs 02h as the error code.

Figure 26:
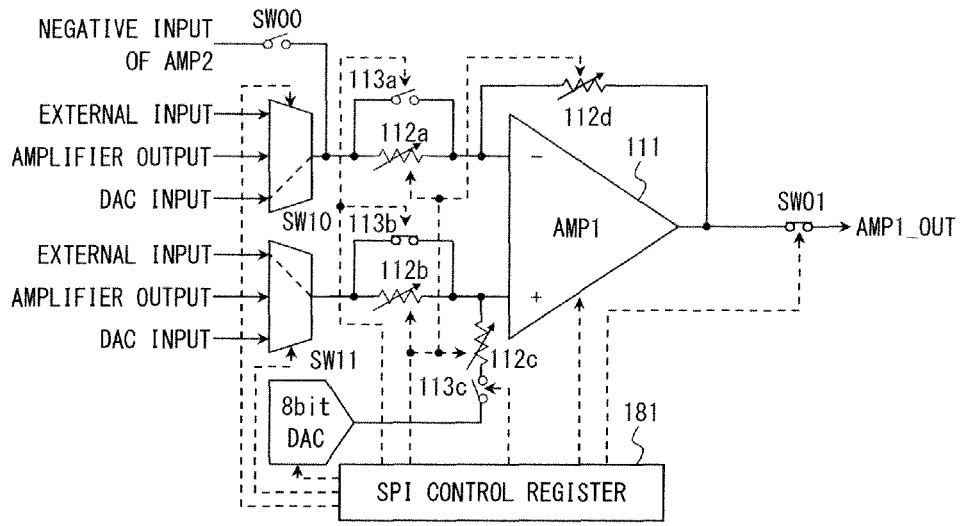
FIG. 26 is a circuit diagram and a table for explaining prohibition conditions for the semiconductor device according to the first embodiment.

Next, FIG. 26 is a circuit diagram and a table for explaining the forbidden conditions when the circuit format of the separate amplifier AMP1 is a non-inverting amplifier. As shown in FIG. 26, when the circuit format is a non-inverting amplifier, in the normal state, the multiplexer SW10 selects a DAC input, and the multiplexer SW11 selects an external input. Further, in the normal state, the switches 113a and 113c are turned off, and the switch 113b is turned on.

The forbidden conditions describe the open/closed states of the switches that change from the normal state in which the switches are opened/closed to the abnormal state in the manner stated above. In the example shown in FIG. 26, three forbidden conditions are described. When five LSBs of the circuit format setting command are 1xxxx, the multiplexer SW00 is turned on, thereby generating a failure in which a signal from the separate amplifier AMP2 routes around. In this case, the error detection circuit 14 outputs 10h as the error code. When five LSBs of the circuit format setting command are x01xx, the multiplexer SW10 selects an external input, thereby generating a failure of an unstable reference voltage. In this case, the error detection circuit 14 outputs 11h as the error code. When five LSBs of the circuit format setting command are xxx11, the multiplexer SW11 selects a DAC output, thereby generating a failure of having no input signal. In this case, the error detection circuit 14 outputs 12h as the error code.

Figure 27:
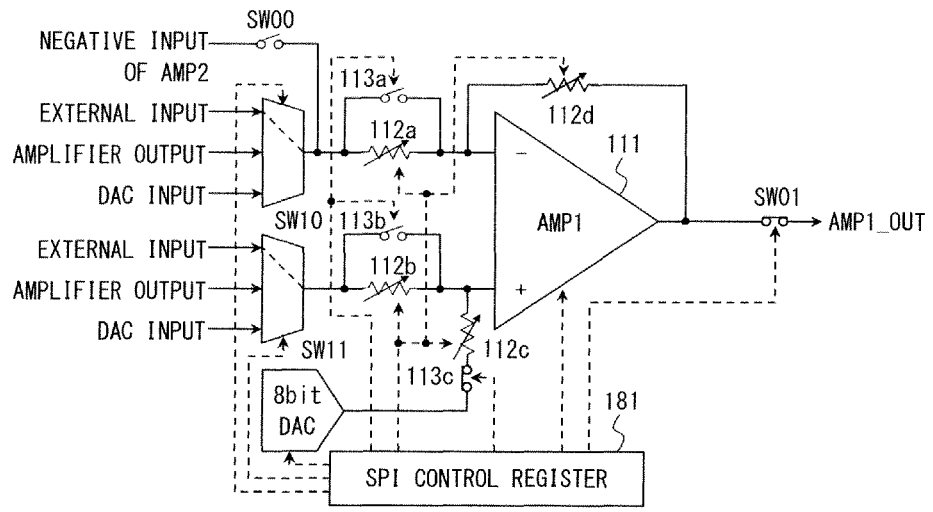
FIG. 27 is a circuit diagram and a table for explaining prohibition conditions for the semiconductor device according to the first embodiment.

Next, FIG. 27 is a circuit diagram and a table for explaining the forbidden conditions when the circuit format of the separate amplifier AMP1 is a differential amplifier. As shown in FIG. 27, when the circuit format is a differential amplifier, in the normal state, the multiplexers SW10 and SW1 select external inputs. Further, in the normal state, the switches 113a and 113b are turned off, and the switch 113c is turned on.

The forbidden conditions describe the open/closed states of the switches that change from the normal state in which the switches are opened/closed to the abnormal state in the manner stated above. In the example shown in FIG. 27, three forbidden conditions are described. When five LSBs of the circuit format setting command are 1xxxx, the multiplexer SW00 is turned on, thereby generating a failure in which a signal from the separate amplifier AMP2 routes around. In this case, the error detection circuit 14 outputs 20h as the error code. When five LSBs of the circuit format setting command are x11xx, the multiplexer SW10 selects a DAC input, thereby generating a failure of the circuit not functioning as a differential amplifier. In this case, the error detection circuit 14 outputs 21h as the error code. When five LSBs of the circuit format setting command are xxx11, the multiplexer SW11 selects a DAC input, thereby generating a failure of the circuit not functioning as a differential amplifier. In this case, the error detection circuit 14 outputs 22h as the error code.

Figure 28:
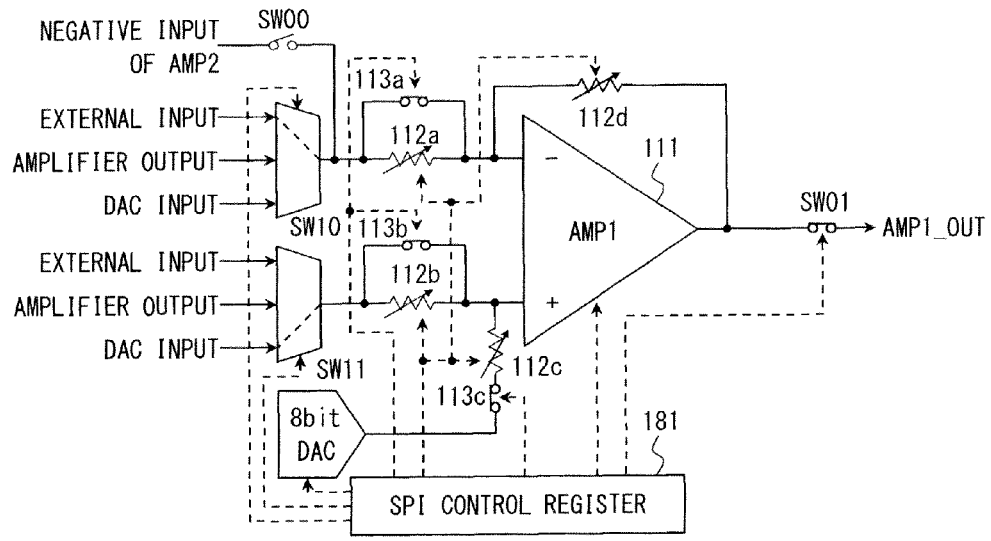
FIG. 28 is a circuit diagram and a table for explaining prohibition conditions for the semiconductor device according to the first embodiment.

Next, FIG. 27 is a circuit diagram and a table for explaining the forbidden conditions when the circuit format of the separate amplifier AMP1 is an I/V amplifier. As shown in FIG. 28, when the circuit format is an I/V amplifier, in the normal state, the multiplexer SW10 selects an external input, and the multiplexer SW11 selects a DAC input. Further, in the normal state, the switches 113$a$ to 113$c$ are turned on.

The forbidden conditions describe the open/closed states of the switches that change from the normal state in which the switches are opened/closed to the abnormal state in the manner stated above. In the example shown in FIG. 28, three forbidden conditions are described. When five LSBs of the circuit format setting command are 1xxxx, the multiplexer SW00 is turned on, thereby generating a failure in which a signal from the separate amplifier AMP2 routes around. In this case, the error detection circuit 14 outputs 30h as the error code. When five LSBs of the circuit format setting command are x11xx, the multiplexer SW10 selects a DAC input, thereby generating a failure of having no input signal. In this case, the error detection circuit 14 outputs 31h as the error code. When five LSBs of the circuit format setting command are xxx01, the multiplexer SW10 selects an external input, thereby generating a failure in which an abnormal current flows. In this case, the error detection circuit 14 outputs 32h as the error code.

Note that in the above explanation, three forbidden conditions are shown for the respective circuit formats, however the forbidden conditions are not limited to the conditions shown in FIGS. 25 to 28, and instead various configurations that could cause a failure can be specified. Moreover, in FIGS. 25 to 28, the forbidden conditions shown in FIGS. 25 to 28 are set also to the separate amplifiers AMP2 and AMP3.

Next, an operation of the SPI interface 180 of the first embodiment is explained. Firstly, FIG. 29 is a timing chart showing communication timings of the SPI interface 180.

The SPI interface 180 is an interface between the MCU unit 200 and the AFE unit 100 and performs setting of the AFE unit 100, which is writing in the control register 181, reading of data stored to the register inside the AFE unit 100, and execution of updating processing of the circuit configuration according to the written commands. Here, an SPI clock frequency is 10 MHz, the amount of communication data is 16 bits, and the communication direction is MSB.

Figure 29:
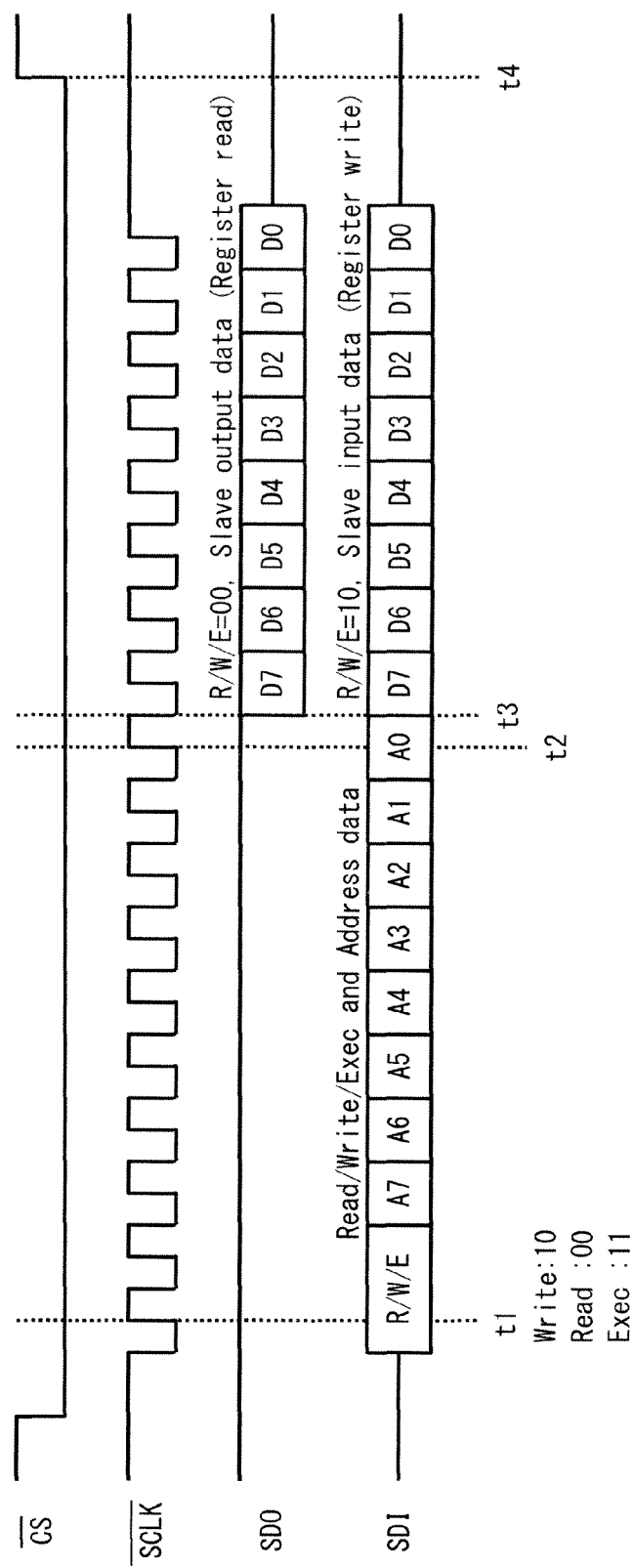
FIG. 29 is a timing chart showing communication timings of the semiconductor device according to the first embodiment.

As shown in FIG. 29, in the SPI interface 180, a chip select CS (inverting signal), a serial clock SCLK (inverting signal), and a serial data input SDI are input from the MCU unit 200 to the AFE unit 100, and a serial data output SDO is output from the AFE unit 100 to the MCU unit 200.

In the SPI interface 180, when the chip select CS becomes low level, each bit is input/output in synchronization with the serial clock SCLK. The MCU unit 200 sets a bit indicating a read instruction, a write instruction, or a command execution instruction of the register 181 to R/W/E, and sets addresses in the control register 181 to be read or written to A1 to A6.

When R/W/E is a write instruction (e.g., 00), the MCU unit 200 sets data to be written in the register to D0 to D7. When R/W/E is a read instruction (e.g., 10), the AFE unit 200 sets data to be read from the register in the AFE unit 100 to D0 to D7. When R/W/E is a command execution instruction (e.g., 11), the MCU unit 200 does not particularly set A0 to A7 and D0 to D7.

When R/W/E and A1 to A6 are input by the SDI, the AFE unit 100 starts sampling the SDI in timing (t1) at the rising edge of the clock SCLK, and latches an instruction and address at the timing (t2). After the timing t2, the transmission data is set with one bit shift in the timing (timing t3) at the falling edge of the clock SCLK of D7 to D0. Further, the AFE unit 100 latches the data in timing (t4) of the chip select CS.

Figure 30:
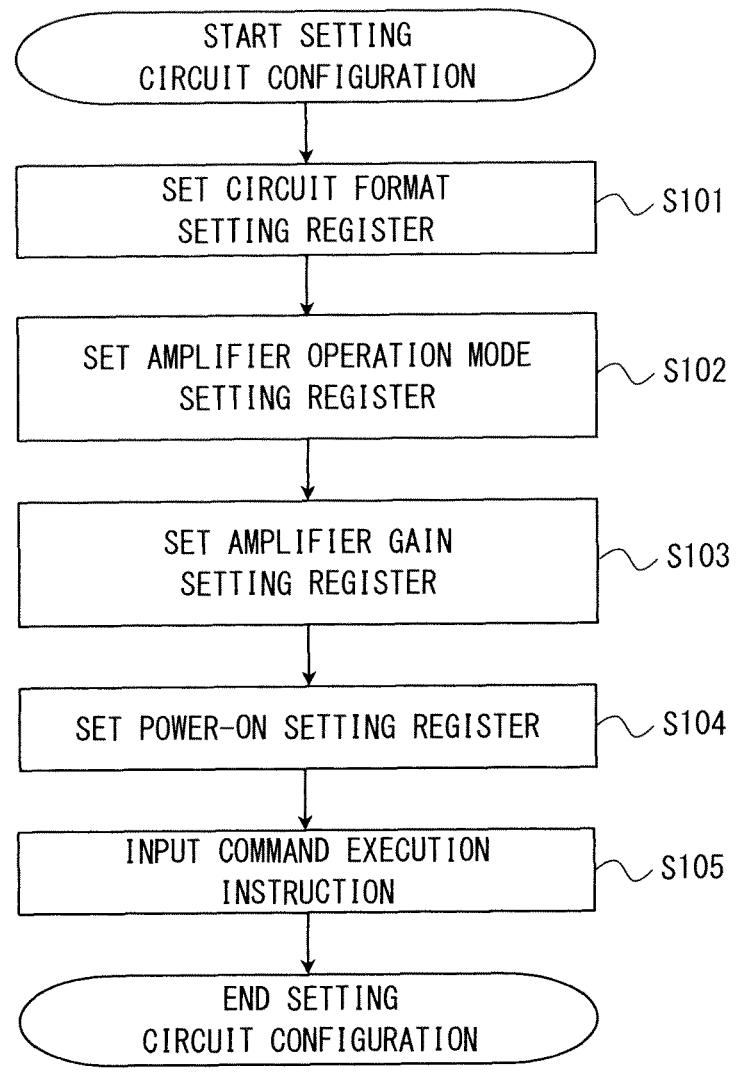
FIG. 30 is a flowchart showing a command transmission procedure of the semiconductor device according to the first embodiment.

The semiconductor device 1 of the first embodiment transmits the commands one by one from the MCU unit 200 to the AFE unit 100 according to the timing chart shown in FIG. 29. The semiconductor device 1 of the first embodiment sets one circuit configuration using a plurality of commands. FIG. 30 is a flowchart showing a command transmission procedure of the semiconductor device 1. The flowchart of FIG. 30 shows a procedure for implementing the separate amplifier AMP1 as an inverting amplifier. In implementation of other circuit configurations in the AFE unit 100, the commands to be transmitted differ for each circuit configuration, however the circuit configurations are the same in the point that a plurality of commands are required to realize one circuit configuration.

As shown in FIG. 30, in order to implement the separate amplifier AMP1 as an inverting amplifier, the MCU unit 200 transmits the commands one by one in Steps S101 to S105, respectively. In Step S101, the circuit format setting command is transmitted to set a circuit format setting register. In Step S102, an amplifier operation mode setting command is transmitted to set an amplifier operation mode setting register. In Step S103, an amplifier gain setting command is transmitted to set an amplifier gain setting register. In Step S104, a power-on setting command is transmitted to set a power-on setting register. Further, the command execution instruction is input in Step S105. Then, the AFE unit 100 updates the circuit configuration with the circuit configuration according to the commands input in Steps S101 to S104.

In the semiconductor device 1, a transmission sequence of the commands is specified for each circuit format. This is because that the commands are stored to the data stack 182 in order of receipt, and the circuit configuration control values of the control register 181 are updated according to the received commands in order of storage to the data stack 182.

Further, the circuit format analysis unit 12 monitors the commands stored to the data stack 182 at any time, and in response to an input of the circuit format setting value by the circuit format setting command, identifies the circuit format of the analog functional circuit which is to be updated. Thus, the error detection unit 14 can complete the error detection processing at the time when the command execution instruction is input. Moreover, as the error detection processing is completed at the time when the command execution instruction is input, it is possible to update the circuit format without delay from an input timing of the command execution instruction.

Figure 31:
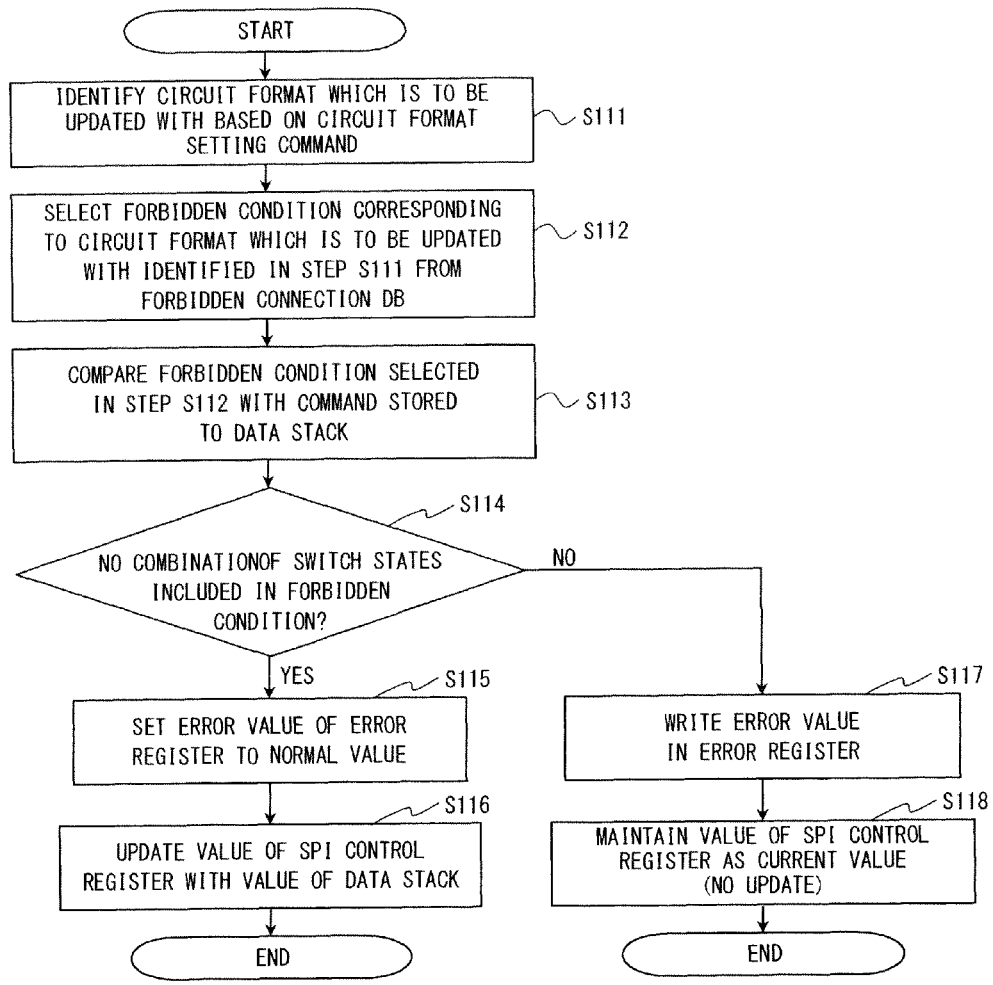
FIG. 31 is a flowchart showing an operation of the SPI interface of the semiconductor device according to the first embodiment.

Next, an operation of the SPI interface 180 of the first embodiment is explained. FIG. 31 is a flowchart showing the operation of the SPI interface 180. Note that the semiconductor device 1 executes a command reception step for receiving the commands at the same time as performing processing of the flowchart shown in FIG. 31.

Then, as shown in FIG. 31, in the SPI interface 180, the circuit format analysis unit 12 refers to the address values of the commands stored to the data stack 182 and reads the circuit format setting values. Next, in Step S111, the circuit format analysis unit 12 identifies the circuit format which is to be updated according to the circuit format setting values specified by the circuit format setting command. Next, in Step S112, the forbidden condition selection unit 13 selects, from the connection forbidden database, the forbidden conditions corresponding to the circuit format which is to be updated and has been identified. Next, in Step S113, the error detection unit 14 compares the forbidden conditions selected in Step S112 with the circuit format setting values stored to the data stack 182. Next, in Step S114, the error detection unit 14 evaluates whether or not the circuit configuration included in the forbidden conditions is included in the circuit configuration derived from the circuit configuration setting values stored to the data stack 182.

Then, when the evaluation step of Step S114 evaluates that there is a signal path matching the circuit configuration indicated in the forbidden conditions in the circuit configuration which is to be updated (NO in Step S114), the error detection unit 14 writes an error value (e.g., 00h) in the error register as the error code in Step S117. Further, when the error code has an error value, in Step S118, the register control unit 183 maintains the circuit configuration control values of the control register 181 as current values. That is, in Step S118, the register control unit 183 will not update the circuit configuration control values of the control register 181 with the circuit format setting values and the circuit configuration setting values that are stored to the data stack 182.

Conversely, when the evaluation step of Step S114 evaluates that there is no circuit configuration indicated in the forbidden conditions that matches the circuit configuration which is to be updated (YES in Step S114), the error detection unit 14 writes a normal value (e.g., FFh) in the error register as the error code. Then, in Step S116, the register control unit 183 updates the circuit configuration control values of the control register 181 with the circuit format setting values and the circuit configuration setting values that are stored to the data stack 182.

In the above explanation, the processing of Steps S111 to S115 and S117 are an error evaluation step by the circuit configuration error detection unit 11. That is, in the error evaluation step, when the circuit configuration which is to be updated and is determined by the plurality of commands received by the AFE unit 100 satisfies the forbidden conditions that have been previously set, the error code having the error value is generated, in which the error value indicates that the circuit configuration which is to be updated satisfies the forbidden conditions and will be in an error state. Further, the processing of Step S118 is a circuit setting forbidden step. That is, in the circuit setting forbidden step, when the error code has the error value, the circuit configuration control values are maintained the same irrespective of the plurality of commands. Furthermore, the processing of S116 is a circuit setting updating step. That is, in the circuit setting updating step, when the error code is the normal value indicating that the circuit configuration of the analog functional circuit which is to be updated does not satisfy the forbidden conditions, the circuit configuration control values that specify the current circuit configuration of the analog functional circuits are updated using the plurality of commands.

The error evaluation step includes a plurality of steps. More specifically, Step S111 is a first circuit format analysis step by the circuit format analysis unit 12. In the first circuit format analysis step, the circuit format of the analog functional circuit to be updated is identified according to the circuit format setting values included in the plurality of commands received by the analog front-end unit. Step S112 is a forbidden condition selection step by the forbidden condition selection unit 13. In the forbidden condition selection step, the forbidden conditions corresponding to the circuit format identified in the circuit format analysis step are selected from the plurality of forbidden conditions that describe forbidden connection states for the respective circuit formats. Note that in the first embodiment, in the forbidden condition selection step, the forbidden conditions are selected from the connection forbidden database according to the circuit format which is to be updated and is identified in the first circuit format analysis step. Steps S113, S114, and S117 are an error detection step by the error detection unit 14. In the error detection step, the plurality of commands stored to the data stack 182 are referred to, and when the circuit configuration of the analog functional circuits which is to be updated includes a connection state that satisfies the forbidden conditions selected in the forbidden condition selection step, the error code having the error value indicating that the circuit configuration which is to be updated violates the forbidden conditions is generated.

Figure 32:
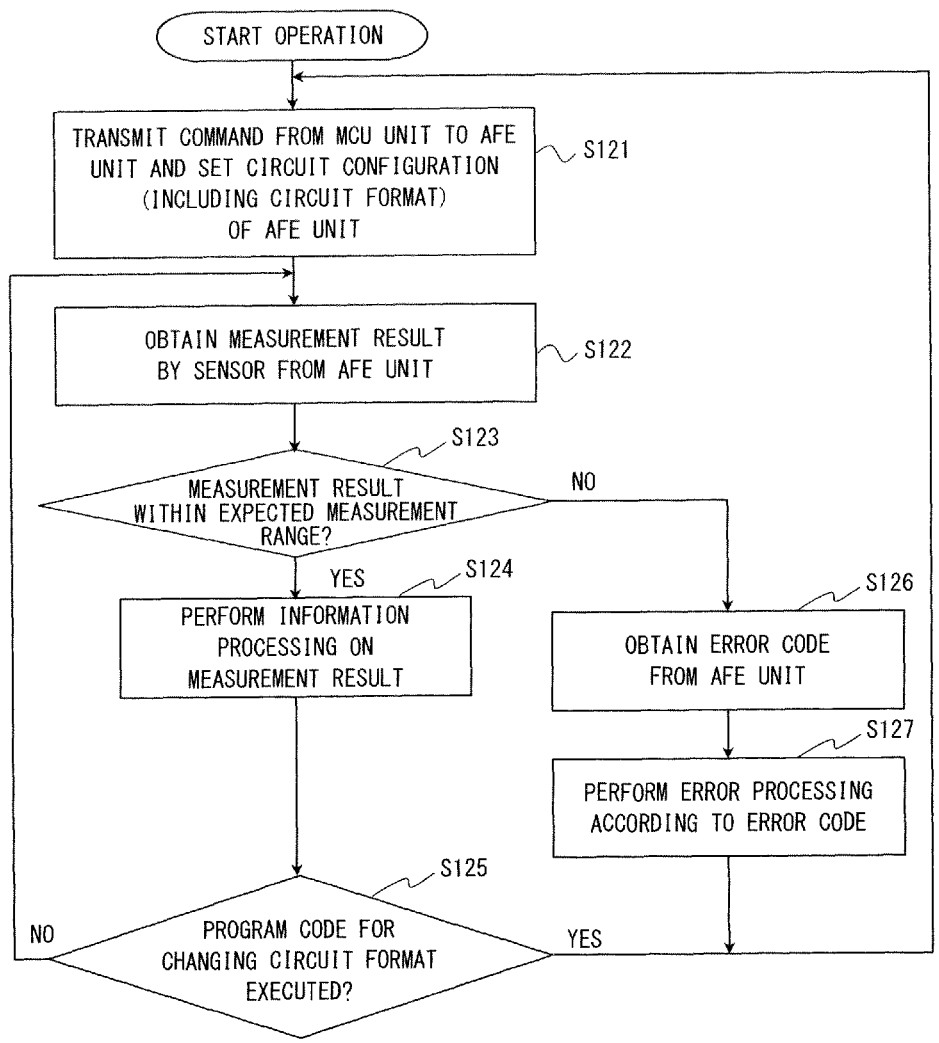
FIG. 32 is a flowchart showing an operation of the semiconductor device according to the first embodiment.

Next, an entire operation of the semiconductor device 1 of the first embodiment is explained. FIG. 32 is a flowchart showing the operation of the semiconductor device 1 according to the first embodiment.

As shown in FIG. 32, in the semiconductor device 1, in Step S121, the commands are transmitted from the MCU unit 200 to the AFE unit 100, and the circuit configuration including the circuit format of the AFE unit 100 is set. This determines the circuit format and the circuit configuration of the AFE unit 100. In Step S122, a measurement result by a sensor is obtained from the AFE unit 100.

After that, in Step S123, the MCU unit 200 compares the obtained measurement result with an expected measurement range and evaluates whether or not the measurement result is within the expected measurement range. In the evaluation of Step S123, when the measurement result is within the expected measurement range (YES in Step S123), in Step S124, the MCU unit 200 performs information processing on the measurement result. Then, in Step S125, the MCU unit 200 evaluates whether or not a program code for changing the circuit configuration has been executed by a CPU of the MCU unit 200. In Step S125, when the MCU unit 200 evaluates that the program code for changing the circuit configuration has not been executed (NO in Step S125), the MCU unit 200 continues to obtain the measurement result from the AFE unit 100. Conversely, in Step S125, when the MCU unit 200 evaluates that the program code for changing the circuit configuration has been executed (YES in Step S125), the MCU unit 200 performs setting processing of the circuit configuration of Step S121 again.

Conversely, when the measurement result is not within the expected measurement range (NO in Step S123), the MCU unit 200 obtains the error code from the AFE unit 100 in Step S126. Then, in Step S127, the MCU unit 200 performs error processing according to the obtained error code. In the example shown in FIG. 32, the MCU unit 200 performs the setting processing of the circuit configuration of Step S121 again as the error processing.

As stated above, the semiconductor device 1 of the first embodiment includes the circuit configuration error detection unit 11 that evaluates whether or not the circuit configuration which is to be updated and is determined according to the commands transmitted from the MCU unit 200 include the configuration that satisfies the forbidden conditions that have not been originally expected. Then, in the semiconductor device 1, when the circuit configuration error detection unit 11 detects an error, the register control unit 183 stops updating the circuit configuration control values of the control register 181. This prevents a failure from being generated in an updated circuit caused by a bit error, for example, when the bit error is generated in data constituting the command in the memory 220 of the MCU unit 200, or when the bit error is generated in data constituting the command while the data is transferred.

Further, in the semiconductor 1 of the first embodiment, when the circuit configuration error detection unit 11 detects an error, the error value is set to the error code. Then, when there is an abnormality in the measurement result obtained from the AFE unit 100, the MCU unit 200 can be aware that the error is generated in the setting processing of the circuit configuration. The MCU unit 200 is also capable of performing appropriate error processing in response to a generation of an error.

As described so far, the reliability of the semiconductor device 1 can be improved by detecting an error generated while changing the circuit configuration. Also, by detecting an error generated while changing the circuit configuration, the semiconductor device 1 can prevent the AFE unit 100 from being continuously used with an incorrect circuit configuration. The semiconductor device 1 with the dynamically reconfigurable circuit configuration is more likely to generate an error while changing the circuit configuration than a circuit with a fixed circuit configuration. Accordingly, detecting an error while changing the circuit configuration achieves a great effect.

Moreover, in the semiconductor device 1 of the first embodiment, conditions for switches to which an input external terminal and an output of the analog circuit element (e.g., DAC output) are galvanically connected are set as one of the forbidden conditions. In the semiconductor device 1, the sensor is connected to the external input terminal. When a direct-current voltage is applied to this sensor, a failure such as deterioration in the characteristics of the sensor or destruction of the sensor occurs. However, in the semiconductor device 1 of the first embodiment, it is possible to prevent formation of a path that causes a direct-current voltage to be applied to the external input terminal, thereby protecting the sensor from malfunctioning due to a bit error in the commands.

Second Embodiment

In a second embodiment, a configuration for detecting an error in the circuit configuration of a summing amplifier is explained. In the second embodiment, the configuration of the SPI interface 180 is the same as that of the first embodiment, thus the explanation shall be omitted here. However, in the second embodiment, circuit format setting commands are different from those of the first embodiment. Hereinafter, a difference in the circuit setting commands (or circuit format setting values) is explained in detail.

As shown in FIG. 11, a summing amplifier further includes a switch 113d in the separate amplifier AMP1 that implements another circuit format. The circuit format setting values that specify the summing amplifier include, in four bits value, a circuit format setting value that specifies an open/closed state of the switch 113d. Here, FIG. 33 shows examples of the circuit format setting commands corresponding to the circuit configuration of the summing amplifier. Further, FIG. 34 shows an example of the circuit format database corresponding to the circuit configuration of the summing amplifier.

As shown in FIG. 33, in setting values specified by the circuit format setting commands according to the second embodiment, four MSBs specify the circuit format setting values, and five LSBs specify the circuit configuration setting values. Moreover, as shown in FIG. 34, the circuit format database has a four-bit expected value for the respective circuit formats. These expected values have the same number of bits as that of the circuit format setting values and indicate expected values of the switches 113a to 113d.

Figure 35:
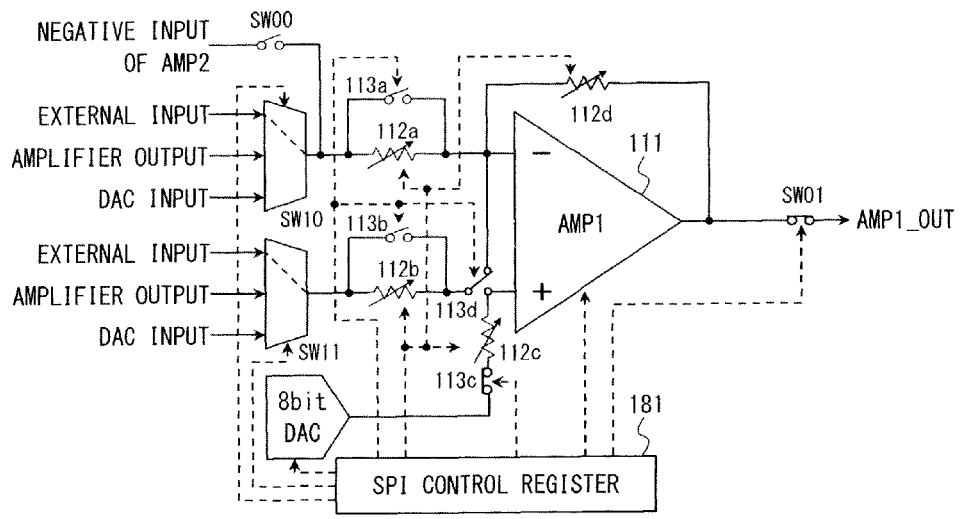
FIG. 35 is a circuit diagram and a table for explaining forbidden conditions for the semiconductor device according to the second embodiment.

Next, FIG. 35 is a circuit diagram and a table for explaining the forbidden conditions when the circuit format of the separate amplifier AMP1 is the summing amplifier. As shown in FIG. 35, when the circuit configuration is the summing amplifier, the switch 113d is further provided. When the circuit configuration is the summing amplifier, in the normal state, the multiplexers SW10 and SW11 select external inputs. Further, in the normal state, the switches 113a and 113b are turned off, the switch 113c is turned on, and the switch 113d is connected to a positive input.

The forbidden conditions describe the open/closed states of the switches that change from the normal state in which the switches are opened/closed to the abnormal state in the manner stated above. In the example shown in FIG. 35, three forbidden conditions are described. When five LSBs of the circuit format setting command are 1xxxx, the multiplexer SW00 is turned on, thereby generating a failure in which a signal from the separate amplifier AMP2 routes around. In this case, the error detection unit 14 outputs 40h as the error code. When five LSBs of the circuit format setting command are x11xx, the multiplexer SW10 selects a DAC input, thereby generating a failure of the circuit not functioning as a summing amplifier. In this case, the error detection circuit 14 outputs 41h as the error code. When five LSBs of the circuit format setting command are xxx11, the multiplexer SW11 selects a DAC input, thereby generating a failure of the circuit not functioning as a summing amplifier. In this case, the error detection circuit 14 outputs 41h as the error code.

As stated above in the second embodiment, the circuit format setting values for specifying the summing amplifier have been explained. By changing the circuit format setting commands and the circuit configuration of the separate amplifiers to those corresponding to the summing amplifier, it is possible to implement the summing amplifier.

Third Embodiment

In the third embodiment, the expected values of the circuit format database and the forbidden conditions of the forbidden connection database in the case of forming an instrumentation amplifier using the separate amplifiers AMP1 to AMP3 are explained. In the third embodiment, the configuration of the SPI interface 180 is the same as that of the first embodiment, thus the explanation shall be omitted. However, in the third embodiment, the expected values of the circuit format database and the forbidden conditions of the forbidden connection database are different from those the first embodiment. Hereinafter, the expected values of the circuit format database and the forbidden conditions are explained in detail.

Figure 37A:
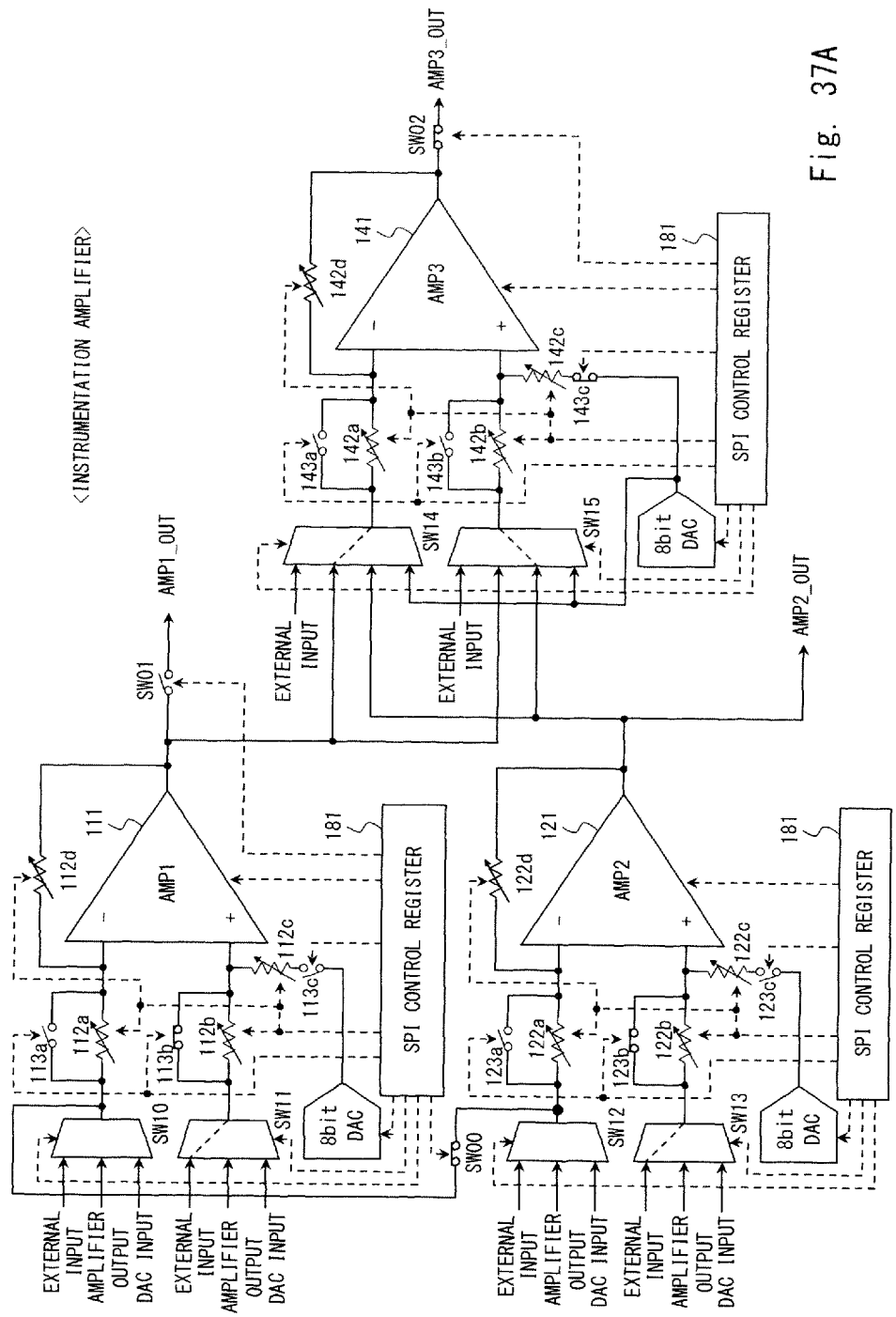
FIG. 37A is a circuit diagram for explaining prohibition conditions of the semiconductor device according to the third embodiment.

Firstly, FIG. 36 is a table for explaining the circuit format database according to the third embodiment. Further, FIG. 37A is a circuit diagram for explaining the forbidden conditions in the case of forming the instrumentation amplifier using the separate amplifiers AMP1 to AMP3. As shown in FIG. 37A, the instrumentation amplifier is composed of the separate amplifiers AMP1 to AMP3. In the instrumentation amplifier, the switch SW00 is turned on.

Therefore, as shown in FIG. 36, the expected values corresponding to the instrumentation amplifier include a setting value of the switch SW00 that is specified at the fourth bit of the circuit format setting command of the separate amplifier AMP1 as the circuit format setting value, in addition to the circuit format setting values (e.g., three MSBs of the circuit format setting command) of the separate amplifiers AMP1 to AMP3. Note that the circuit format analysis unit 12 refers to the setting value in the data stack 182 corresponding to the switch SW00 and determines whether or not to evaluate the circuit format setting values of the separate amplifiers AMP1 to AMP3 as an integrated circuit format setting value.

Therefore, in the circuit format database according to the third embodiment, the expected values for the instrumentation amplifier are: the switch SW00 is set to 1, the switches 113a and 113c are set to off, and the switch 113b is set to on in the separate amplifier AMP1, the switches 123a and 123c are set to off, and the switch 123b is set to on in the separate amplifier AMP2, and the switches 143a and 143b are set to off, and the switch 143c is set to on in the separate amplifier AMP3.

When the circuit configuration is determined according to the above expected values, as shown in FIG. 37A, in the configurable amplifier 110, in the normal state, the multiplexers SW10 and SW12 are closed, the multiplexers SW11 and SW13 select external inputs, the multiplexer SW14 selects an output of the amplifier 1, and the multiplexer SW15 selects an output of the amplifier 2. Further, in the normal state, the switches 113a, 113c, 123a, 123c, 143a, and 143b are turned off, and the switches 113b, 123b, and 143c are turned on. In the instrumentation amplifier, the switches SW00 and SW02 are turned on, and the switch SW01 is turned off.

FIG. 36 also illustrates the expected values corresponding to the circuit formats other than the instrumentation amplifier. For example, in order to use the separate amplifiers AMP1 to AMP3 as a 3ch inverting amplifier, the switch SW00 is set to 0, and the expected values for the three separate amplifiers are set to the same value. Further, the three separate amplifiers can be used to form a 2ch I/V amplifier and a 1ch inverting amplifier.

Next, the forbidden conditions for the instrumentation amplifier are explained. FIG. 37B is a table for explaining the forbidden conditions for the instrumentation amplifier. As shown in FIG. 37B, the forbidden conditions for the instrumentation amplifier describe the open/closed states of the switches that become abnormal from the normal state in which the switches are opened/closed in the manner stated above. In the example shown in FIG. 37B, eleven forbidden conditions are described. When values of five LSBs of the circuit format setting command corresponding to the separate amplifier AMP1 are 1xxxx, the multiplexer SW00 is turned on, thereby generating a failure of unstable output of the instrumentation amplifier. In this case, the error detection circuit 14 outputs 50h as the error code. When values of five LSBs of the circuit format setting command corresponding to the separate amplifier AMP1 are x01xx, the multiplexer SW10 selects an external input, thereby generating a failure of noise being mixed in an output. In this case, the error detection circuit 14 outputs 51h as the error code. When values of five LSBs of the circuit format setting command corresponding to the separate amplifier AMP1 are x11xx, the multiplexer SW10 selects a DAC input, thereby generating a failure of the circuit not operating as an instrumentation amplifier. In this case, the error detection circuit 14 outputs 52h as the error code. When values of five LSBs of the circuit format setting command corresponding to the separate amplifier AMP1 are xxx11, the multiplexer SW11 selects a DAC input, thereby generating a failure of the circuit not operating as an instrumentation amplifier. In this case, the error detection circuit 14 outputs 53h as the error code.

When values of five LSBs of the circuit format setting command corresponding to the separate amplifier AMP2 are x01xx, the multiplexer SW12 selects an external input, thereby generating a failure of noise being mixed in an output. In this case, the error detection circuit 14 outputs 54h as the error code. When values of five LSBs of the circuit format setting command corresponding to the separate amplifier AMP2 are x11xx, the multiplexer SW12 selects a DAC input, thereby generating a failure of the circuit not operating as an instrumentation amplifier. In this case, the error detection circuit 14 outputs 55h as the error code. When values of five LSBs of the circuit format setting command corresponding to the separate amplifier AMP2 are xxx11, the multiplexer SW13 selects a DAC input, thereby generating a failure of the circuit not operating as an instrumentation amplifier. In this case, the error detection circuit 14 outputs 56h as the error code.

When values of five LSBs of the circuit format setting command corresponding to the separate amplifier AMP3 are x11xx, the multiplexer SW14 selects a DAC input, thereby generating a failure of having no output. In this case, the error detection circuit 14 outputs 57h as the error code. When values of five LSBs of the circuit format setting command corresponding to the separate amplifier AMP3 are x01xx, the multiplexer SW14 selects an external input, thereby generating a failure of having no output. In this case, the error detection circuit 14 outputs 58h as the error code. When values of five LSBs of the circuit format setting command corresponding to the separate amplifier AMP3 are xxx11, the multiplexer SW15 selects a DAC input, thereby generating a failure of having no output. In this case, the error detection circuit 14 outputs 59h as the error code. When values of five LSBs of the circuit format setting command corresponding to the separate amplifier AMP3 are xxx01, the multiplexer SW15 selects an external input, thereby generating a failure of having no output. In this case, the error detection circuit 14 outputs 60h as the error code.

As stated above, the third embodiment is about a configuration that is capable of detecting an error in the circuit configuration only by the additions to the circuit format database and the additions of the forbidden conditions even when the plurality of separate amplifiers are used to form the instrumentation amplifier. As explained so far, the semiconductor device of the first embodiment can detect an error in various circuit formats without changing the circuit configuration such as the circuit configuration error detection unit 11.

Fourth Embodiment

In a fourth embodiment, the circuit format setting commands that do not individually specify the setting values of the switches for switching the circuit formats of the separate amplifiers (e.g., switches 113a to 113c, 123a to 123c, and 143a to 143c) but that include the circuit format setting values of less number of bits than the number of those switches are explained.

Figure 38:
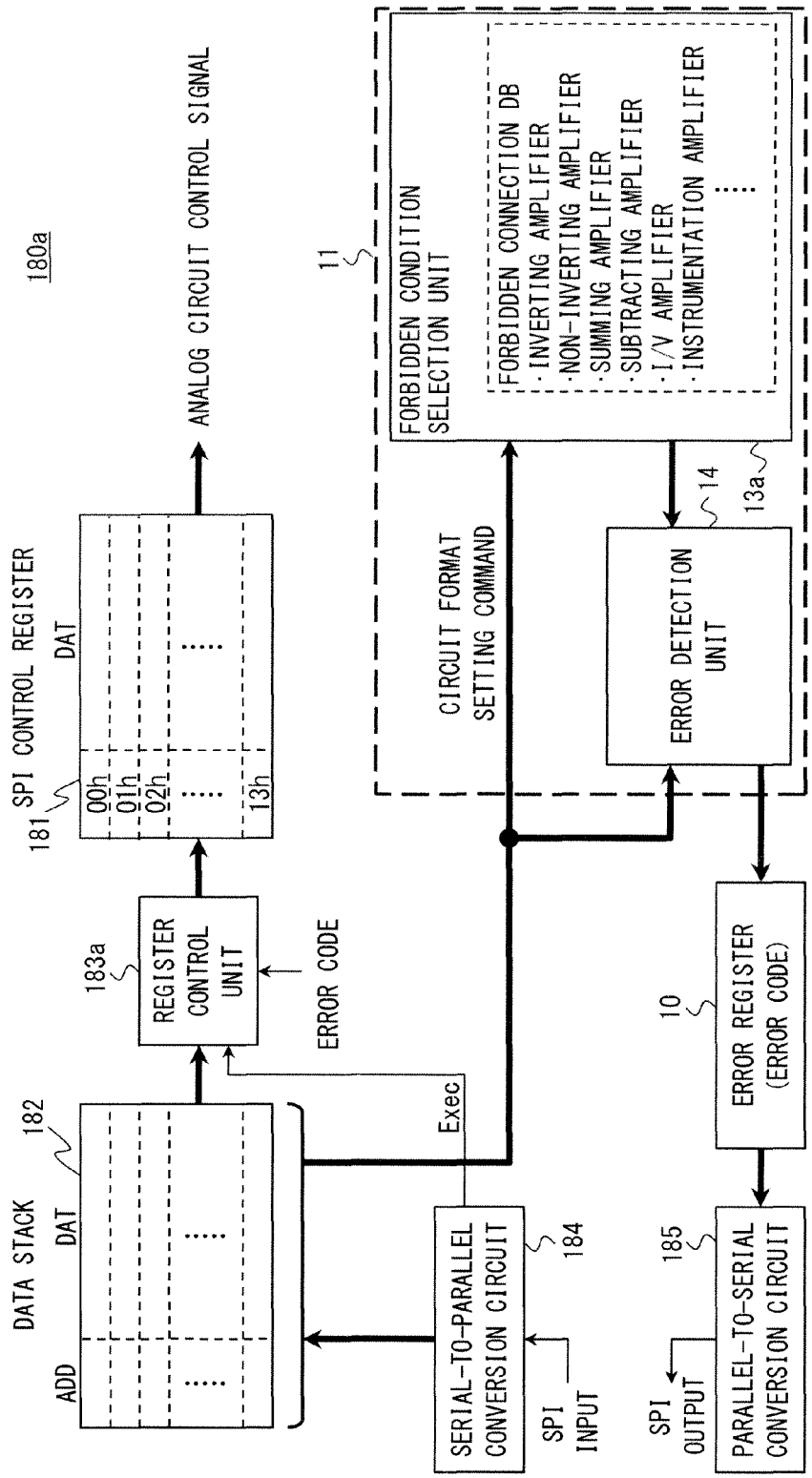
FIG. 38 is a block diagram showing an SPI interface of a semiconductor device according to a fourth embodiment.

FIG. 38 is a block diagram of an SPI interface 180a according to the fourth embodiment. As shown in FIG. 38, in the SPI interface 180a, the register control unit 183 is replaced with a register control unit 183a, the circuit configuration analysis unit 12 is removed from the circuit configuration error detection unit 11, and the forbidden condition selection unit 13 is replaced with a forbidden condition selection unit 13a.

The forbidden condition selection unit 13a selects the forbidden conditions from the forbidden connection database depending on which bit of the circuit setting values included in the circuit configuration command according to the fourth embodiment is 1.

When the register control unit 183a updates the circuit configuration control values of the control register 181 according to the circuit format setting commands of the fourth embodiment, the register control unit 183a decodes the circuit format setting values of the circuit format setting commands and rewrites the circuit configuration control values at addresses 00h to 02h of the control register 181.

Here, the circuit format setting commands used in the fourth embodiment are explained. FIG. 39 is a table for explaining the commands according to the fourth embodiment. Further, FIG. 40 is a table for explaining contents of the circuit format setting commands according to the fourth embodiment.

As shown in FIG. 39, in the fourth embodiment, the circuit format setting command and the circuit configuration setting commands that specify input signals to be selected by the multiplexers SW10 to SW15 are provided separately. The circuit format setting command specifies the address 00h and has three-bit circuit format setting values. Further, the circuit configuration setting commands specify the address 01h or the address 02h and specify the inputs signals selected by the multiplexers respectively by two-bit values.

Then, as shown in FIG. 40, in the fourth embodiment, the circuit format to be specified is identified depending on which bit of the circuit format setting values included in the circuit format setting command is 1. For example, when a circuit format setting value CONFIG is 001, an inverting amplifier is specified as the circuit format.

As stated above in the fourth embodiment, the circuit format can be specified without individually specifying the open/closed states of the switches by the circuit format setting commands. It is thus possible to identify the circuit configuration which is to be updated without using the circuit configuration analysis unit 12. Then, the semiconductor device of the fourth embodiment can select the forbidden conditions according to the circuit configuration which is to be updated in a short time without requiring circuit configuration identifying processing.

Fifth Embodiment

Figure 41:
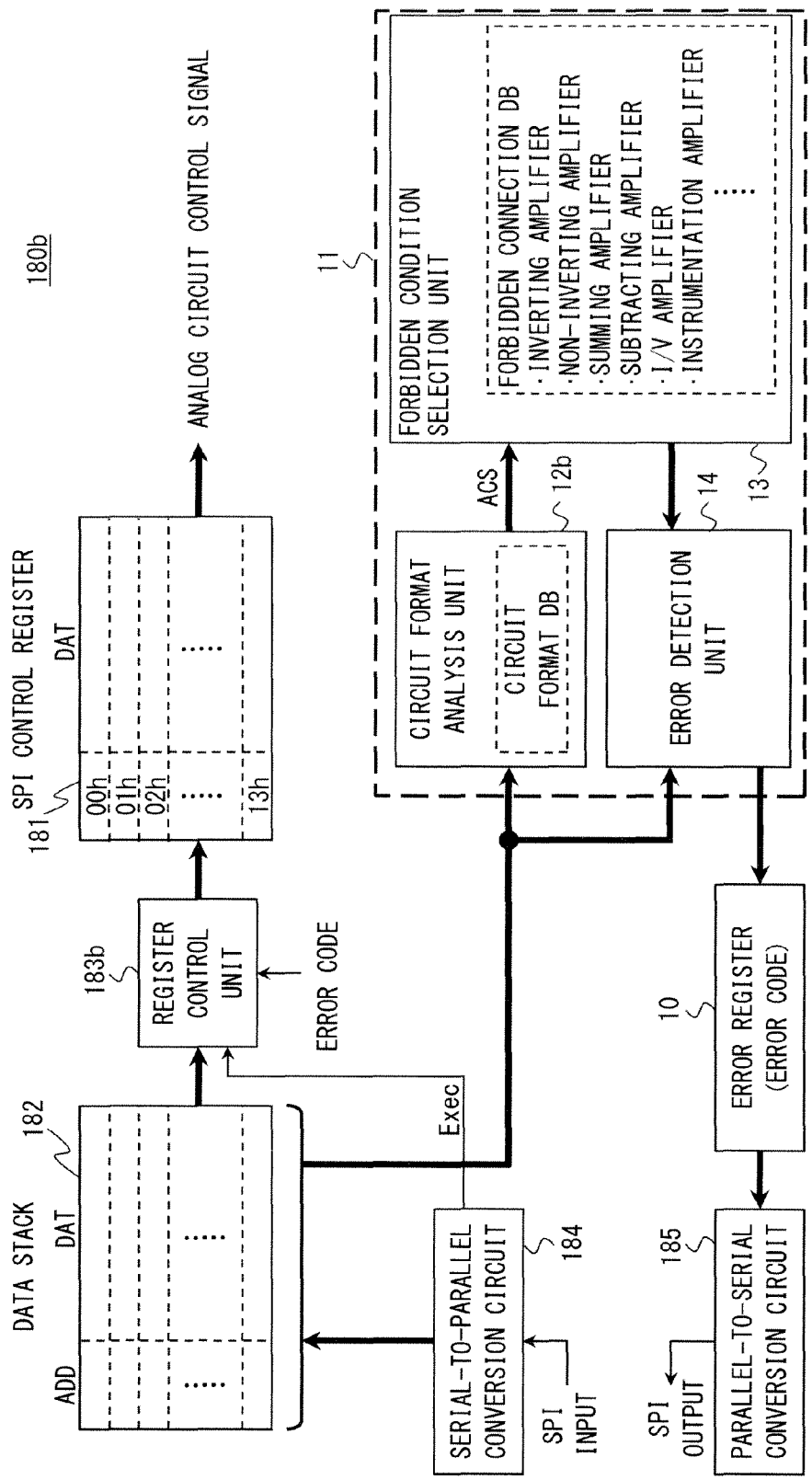
FIG. 41 is a block diagram showing an SPI interface of a semiconductor device according to a fifth embodiment.

In a fifth embodiment, a configuration for improving tolerance to an error in the circuit format setting values is explained. FIG. 41 is a block diagram showing an SPI interface 180b according to the fifth embodiment. Note that the components in the fifth embodiment same as those in the first embodiment are denoted by the same reference numerals therein, and repeated explanation thereof is omitted.

As shown in FIG. 41, in the SPI interface 180b, the register control unit 183 of the first embodiment is replaced with a register control unit 183b, and the circuit format analysis unit 12 of the circuit configuration error detection unit 11 is replaced with a circuit configuration analysis unit 12b. Further, the SPI interface 180b of the fifth embodiment uses a circuit format setting command including multi-bit circuit format setting values for improving error tolerance.

Prior to the specific explanation of the SPI interface 180b, the circuit format setting commands and the expected values of the circuit format setting values used by the semiconductor device of the fifth embodiment are explained.

FIG. 42 is a table for explaining the circuit format setting commands used by the semiconductor device of the fifth embodiment. In the example shown in FIG. 42, the value corresponding to the switch 113c among the circuit format setting values included in the circuit format setting command is extended from one bit to three bits. Identical values are set to the three bits values. That is, in the fifth embodiment, the circuit format setting values include a plurality of switching values corresponding to the respective circuit format control switches (e.g., switches 113a to 113c) that switch the circuit formats of the analog functional circuits, and at least one of the plurality of switching values is a redundant switching value including three or more consecutive identical values. In the example shown in FIG. 42, the circuit format setting values corresponding to the separate amplifier AMP1 include three switching values corresponding to the switches 113a to 113c, and among the switching values, the switching value for the switch 113c is the redundant switching value that includes three or more consecutive identical values.

FIG. 43 is a table for explaining the circuit format database used by the semiconductor device of the fifth embodiment. As shown in FIG. 43, the circuit format setting values with no error are set to the circuit format database. FIG. 43 shows two expected values, which are the circuit format setting values that specify an inverting amplifier and the circuit format setting values that specify a non-inverting amplifier. The circuit format analysis unit 12b calculates Hamming distances between the circuit format setting values stored to the data stack 182 and the expected values of the circuit format database, and identifies the circuit format which is to be updated according to the Hamming distances, the details of which are provided later. In the fifth embodiment, the circuit format setting values are specified such that the Hamming distance between the circuit format setting values that specify different formats is three or greater.

In the semiconductor device of the fifth embodiment, the circuit format is updated according to the above-mentioned circuit format setting values. The register control unit 183b and the circuit format analysis unit 12b have the following features.

The register control unit 183b performs majority processing on the redundant switching value (e.g., circuit format setting value that specifies the open/closed state of the switch 113c), and outputs a value evaluated to have the greatest number in the majority processing to the control register 181 as the switching value. The circuit format analysis unit 12b identifies the circuit format corresponding to the expected values having the shortest Hamming distance from the circuit format setting values as the circuit format of the analog functional circuit which is to be updated.

The Hamming distance is explained here. The Hamming distance indicates the number of different bits between two adjacent values. For example, in the state where the expected values shown in FIG. 43 are set, when the circuit format setting values in the data stack 182 are 01111, the Hamming distance between the expected values of an inverting amplifier and the circuit format setting values is zero, and the Hamming distance between the expected values of an non-inverting amplifier and the circuit format setting values is three. Meanwhile, when the circuit format setting values in the data stack 182 are 01101, the Hamming distance between the expected values of the inverting amplifier and the circuit format setting values is one, and the Hamming distance between the expected values of a non-inverting amplifier and the circuit format setting values is two.

In the above example, even when there is an incorrect bit in three LSBs of the circuit format setting values that specify an inverting amplifier, which is correctly 01111, according to the Hamming distances, the circuit format analysis unit 12b identifies an inverting amplifier that corresponds to the expected values with a small Hamming distance as the circuit format which is to be updated.

As stated above, in the semiconductor device according to the fifth embodiment, the circuit analysis unit 12b identifies the circuit format which is to be updated according to the Hamming distance. Accordingly, even when there is an error in received circuit format setting values, it is possible to correctly identify the circuit format. Further, in the semiconductor device according to the fifth embodiment, the register control unit 183b performs majority processing on the redundant switching value, so that a correct switching value can be set to the control register 181 even in case of error bit.

Note that in the above explanation, an example is explained in which a redundant bit is added to one circuit format setting value, however the redundant bits can be added to all bits. For example, when all the three circuit format setting values have three bits (nine bits in total), it is possible to improve error tolerance of all the bits. Moreover, under the condition that the Hamming distance between the circuit format setting values and ideal values is three or greater, it is possible to improve the error tolerance of the circuit format setting values that specify amplifiers of circuit formats other than an inverting amplifier and a non-inverting amplifier.

Sixth Embodiment

Figure 44:
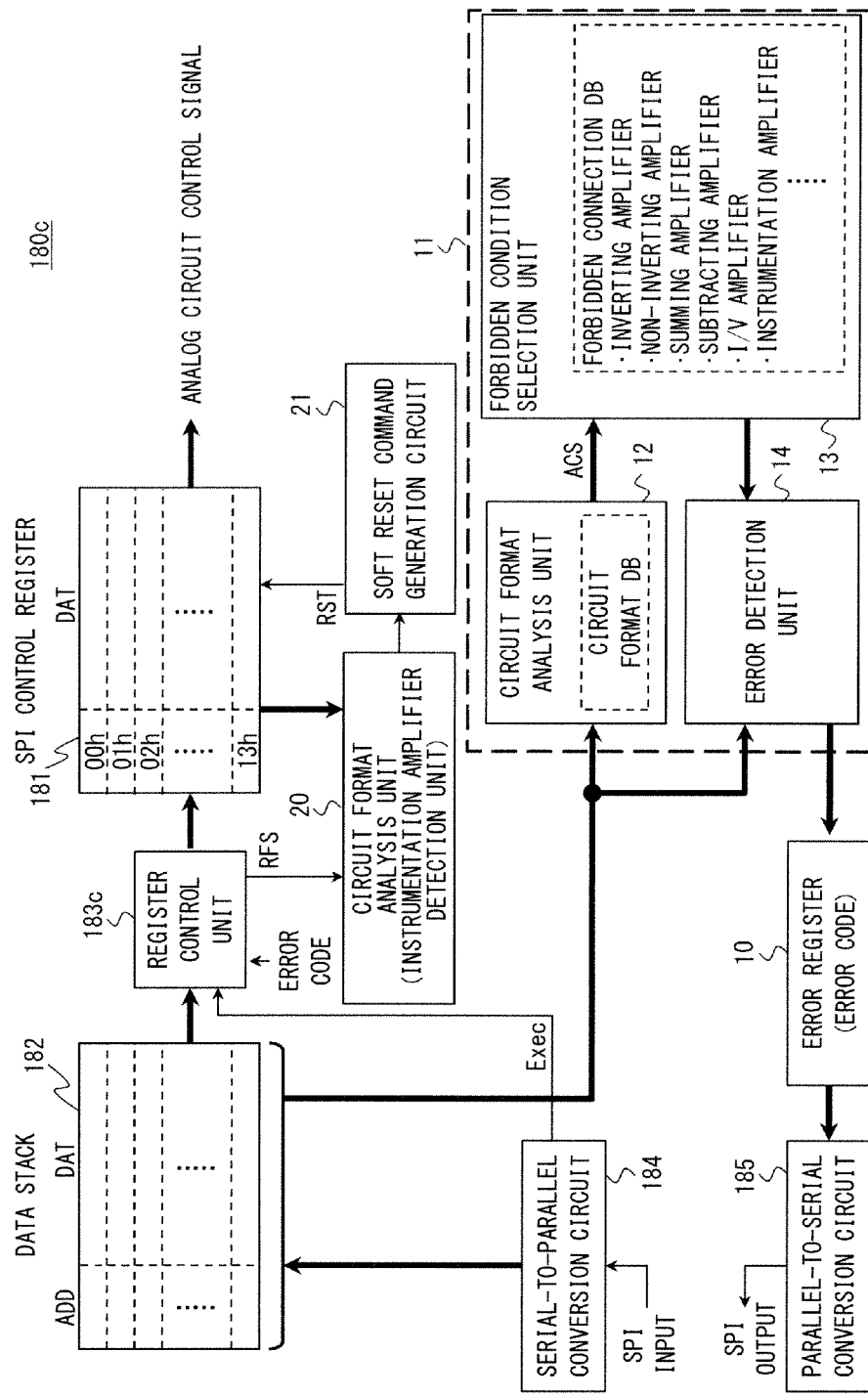
FIG. 44 is a block diagram showing an SPI interface of a semiconductor device according to a sixth embodiment.

FIG. 44 is a block diagram of an SPI interface 180c according to a sixth embodiment. As shown in FIG. 44, in the SPI interface 180c, a second circuit format analysis unit (e.g. circuit format analysis unit 20) and a soft reset command generation circuit 21 are further provided to the SPI interface 180 of the first embodiment. Further, in the SPI interface 180c, the register control unit 183 is replaced with a register control unit 183c.

The circuit format analysis unit 20 detects that the current circuit configuration specified according to the circuit configuration control values stored to the control register 181 is an instrumentation amplifier composed of the plurality of amplifiers, and outputs an instrumentation amplifier detection signal. Further, the circuit format analysis unit 20 starts an analysis according to an update notification signal RFS that is output at the timing when the register control unit 183c starts updating the circuit configuration control values of the control register 181.

According to the instrumentation amplifier detection signal, the soft reset command generation circuit 21 generates a soft reset command RST that initializes the circuit configuration control values stored to the control register 181 at the time of updating the current circuit configuration control values. The soft reset command is a command that initializes the circuit configuration control values stored to the control register 181 and is a command in which a field is set to a region of D0 at an address 13h. When the soft reset command is supplied to the control register 181, the characteristic values of the analog circuit elements and the open/closed states of the switching circuit group in the AFE unit 100 are initialized to the values that have been previously set.

Further, the SPI interface 180c of the sixth embodiment updates the circuit configuration control values of the control register 181 according to the plurality of commands stored to the data stack 182 after soft reset processing.

Figure 45:
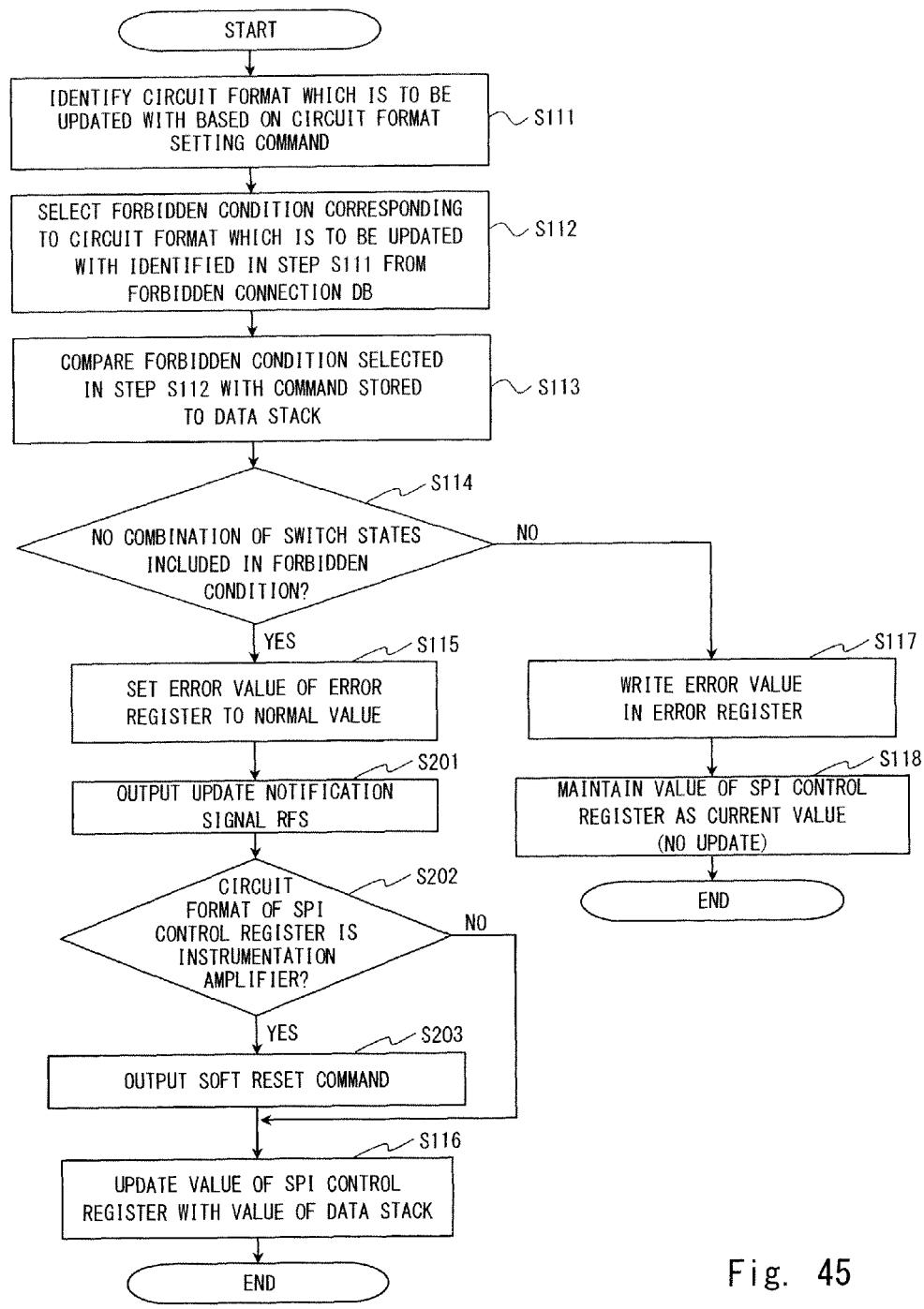
FIG. 45 is a flowchart showing an operation of the semiconductor device according to the sixth embodiment.

FIG. 45 is a timing chart showing an operation of the SPI interface 180c according to the sixth embodiment. As shown in FIG. 45, the operation of the SPI interface 180c of the sixth embodiment further includes processing of Steps S201 to S203 in the processing (FIG. 31) of the SPI interface 180 according to the first embodiment. Hereinafter, the operation of Steps S201 to S203 is explained especially in detail, and the explanation of the processing of other steps is omitted.

As shown in FIG. 45, in the SPI interface 180c of the sixth embodiment, when the normal value is written in the error value of the error register in Step S115, the register control unit 183c outputs the update notification signal RFS in Step S201. Then, in a second circuit format analysis step of Step S202, in response to the update notification signal RFS, the circuit format analysis unit 20 detects that the current circuit configuration specified according to the circuit configuration control values is an instrumentation amplifier composed of the plurality of amplifiers. In Step S202, when the current circuit configuration is evaluated as an instrumentation amplifier (YES in Step S202), the soft reset command generation circuit 21 executes a reset command generation step of Step S203. In the reset command generation step, the soft reset command generation circuit 21 generates the reset command that initializes the circuit configuration control values at the time of updating the current circuit configuration control values. This initializes the circuits of the AFE unit 100. Conversely, when the current circuit configuration is evaluated not to be an instrumentation amplifier (NO in Step S202), the reset command generation step of Step S203 is not executed, and the circuit configuration control values of the control register 181 are updated in Step S116.

As stated above, the semiconductor device of the sixth embodiment updates the circuit configuration control values of the control register 181 after initializing the circuit configuration when the circuit configuration of the configurable amplifier is switched from an instrumentation amplifier to other amplifier. When the circuit configuration is switched from an instrumentation amplifier to other circuit configuration (e.g., circuit configuration in which the separate amplifiers operate independently), a configuration of the circuit to operate may be changed by a command but configurations of other circuits are maintained in the state of an instrumentation amplifier. Therefore, paths of other circuits that are maintained to be in the state of an instrumentation amplifier will be opened, thereby destabilizing operations of other circuits. However, in the SPI interface 180c of the sixth embodiment, in order to switch the circuit configuration from an instrumentation amplifier to other circuit configuration, the circuit configuration is initialized once and set for target circuits. Thus, the operation of other circuits will not be unstable.

Further, the analysis processing by the circuit format analysis unit 20 of the SPI interface 180c can be performed by the circuit format analysis unit 12. Here, FIG. 46 is a block diagram of an SPI interface 180d, which is another mode of the SPI interface 180c of the sixth embodiment.

Figure 46:
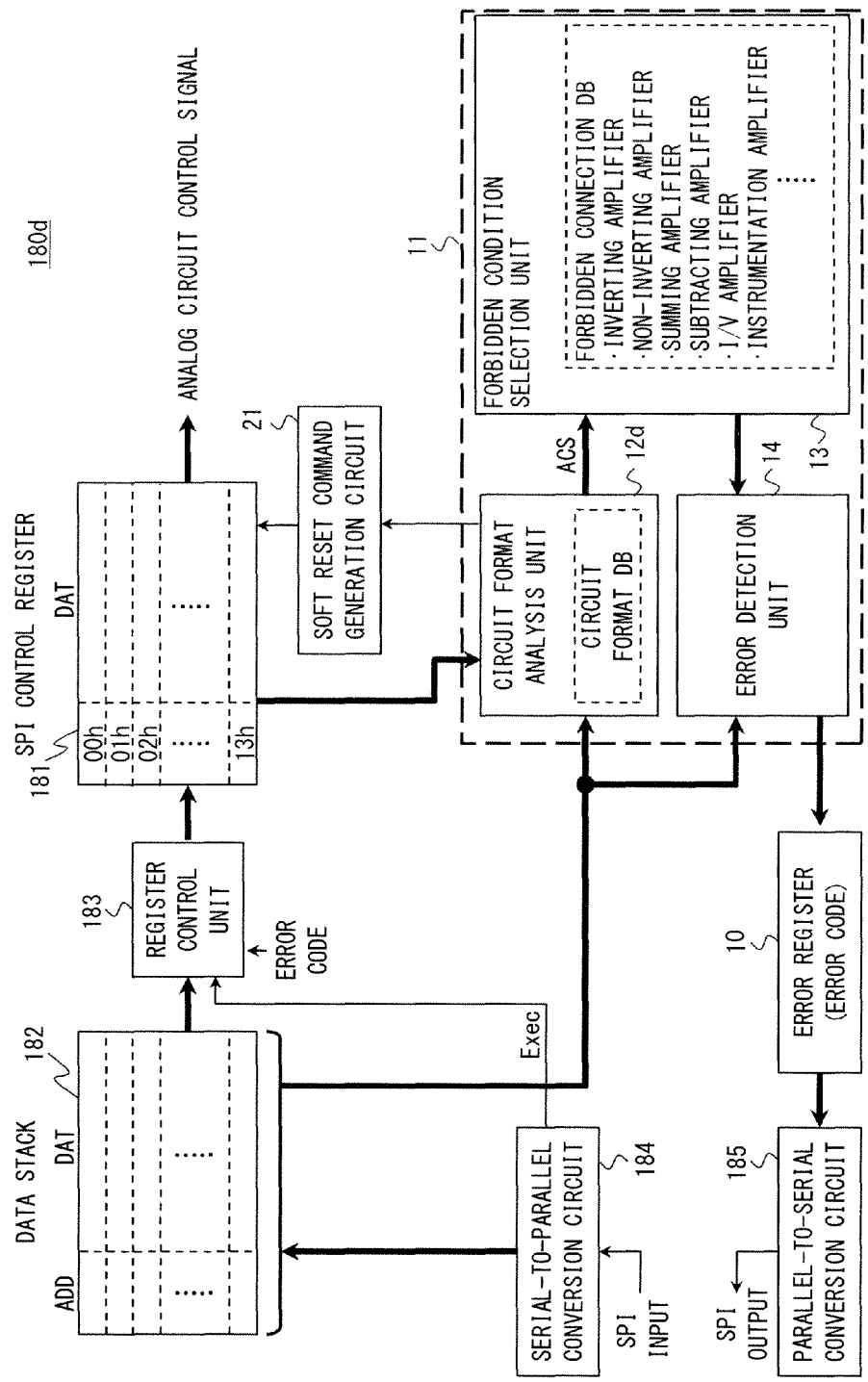
FIG. 46 is a block diagram showing another mode of the SPI interface of the semiconductor device according to the sixth embodiment.

As shown in FIG. 46, in the SPI interface 180d, which is a modified example, the circuit format analysis unit 12d performs processing of the circuit format analysis unit 20 in addition to the processing of the circuit format analysis unit 12. That is, when the circuit configuration analyzed according to the circuit configuration control values of the control register 181 is an instrumentation amplifier, the circuit format analysis unit 12d instructs the soft reset command generation circuit 21 to generate the reset command.

With such a configuration, the SPI interface 180d is capable of reducing the circuit size while performing equivalent operations to the SPI interface 180c.

Seventh Embodiment

Figure 47:
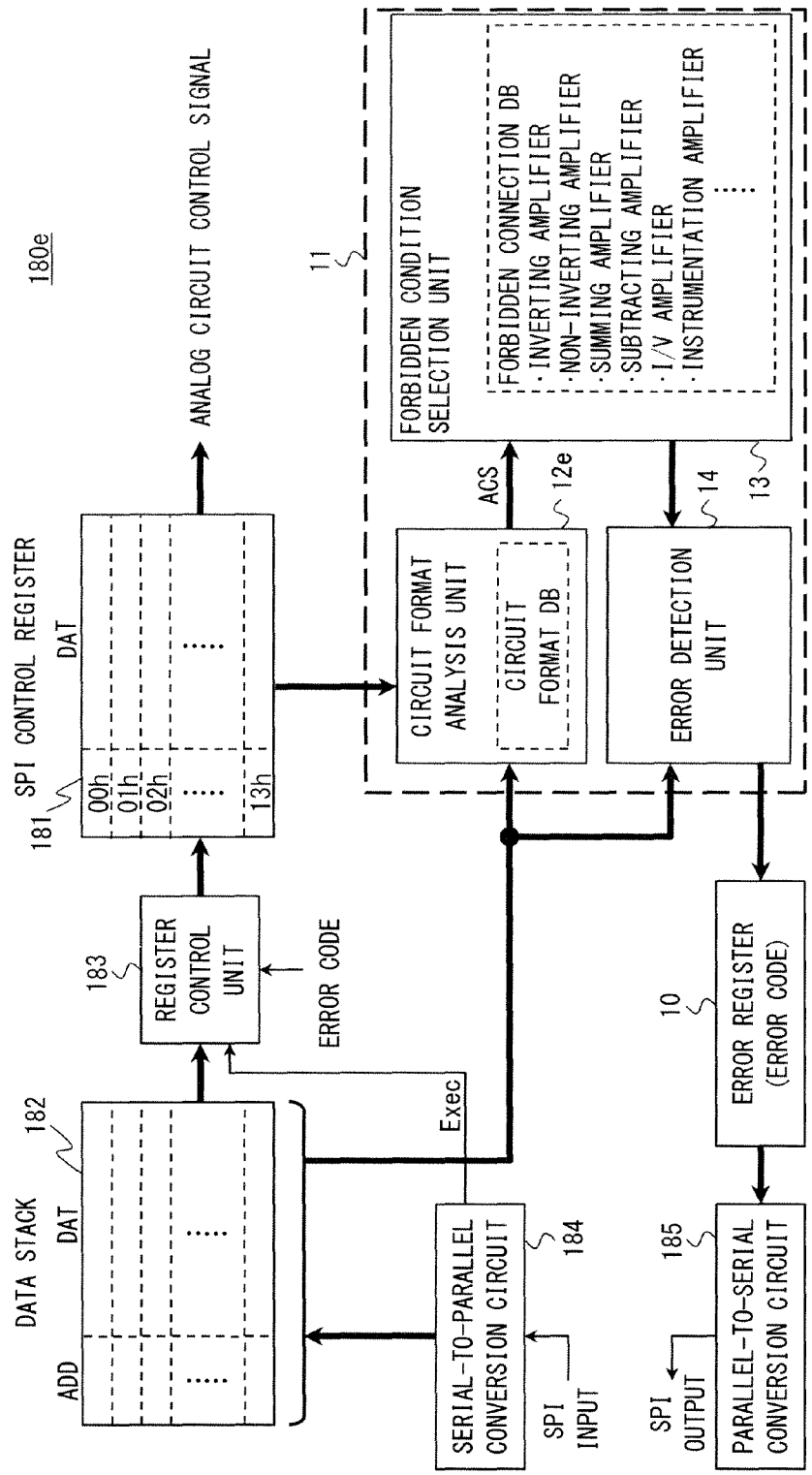
FIG. 47 is a block diagram showing an SPI interface of a semiconductor device according to a seventh embodiment.

FIG. 47 is a block diagram of an SPI interface 180e according to a seventh embodiment. As shown in FIG. 47, in the SPI interface 180e, the circuit format analysis unit 12 of the SPI interface 180 of the first embodiment is replaced with a circuit format analysis unit 12e.

When the circuit configuration command is not included in the plurality of commands stored to the data stack 182, the circuit format analysis unit 12e refers to the circuit configuration control values stored to the control register 181 and identifies the circuit configuration which is to be updated and is determined by the plurality of commands stored to the data stack 182.

Figure 48:
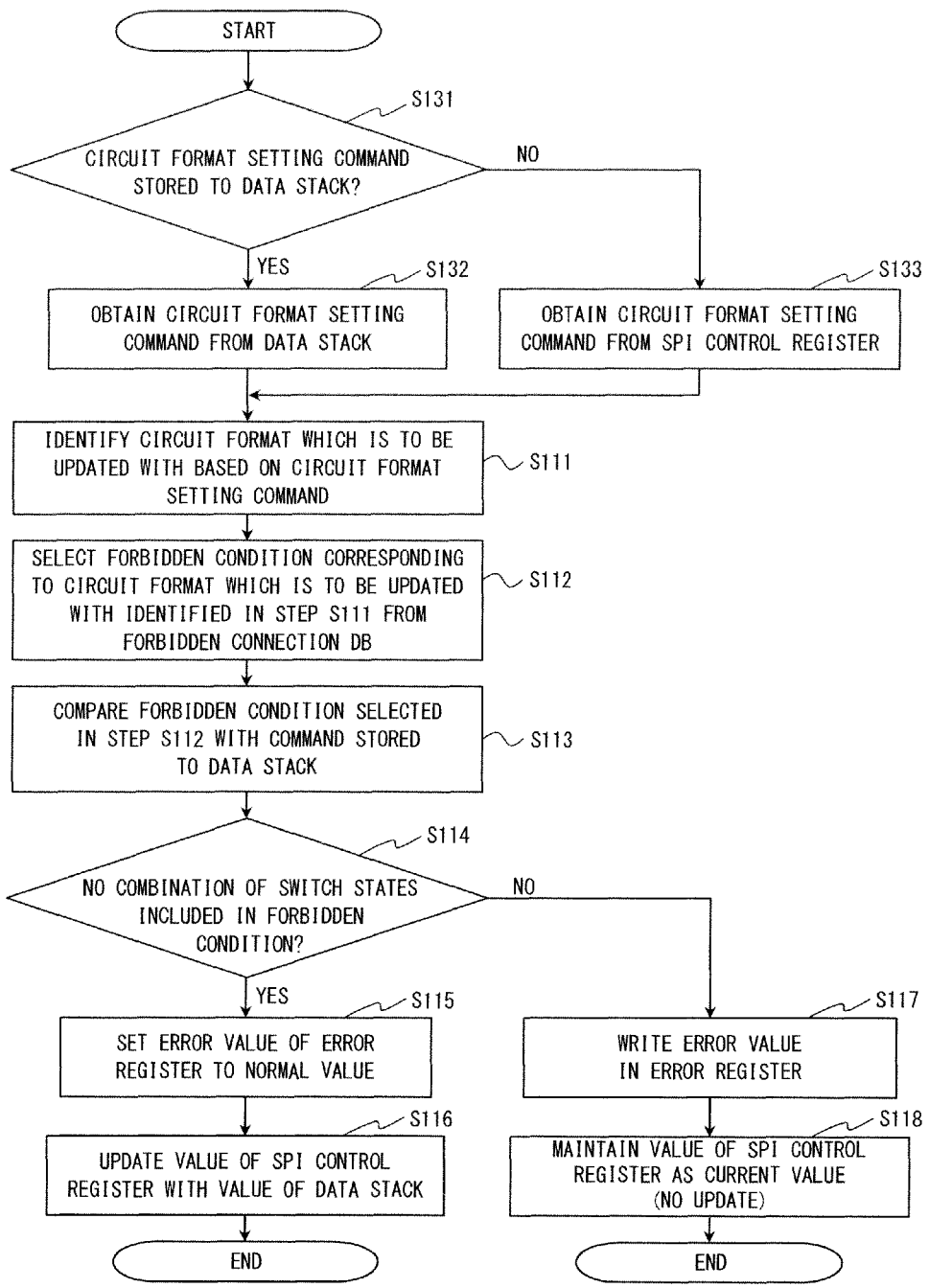
FIG. 48 is a flowchart showing an operation of the semiconductor device according to the seventh embodiment.

Here, an operation of the SPI interface 180e of the seventh embodiment is explained. FIG. 48 is a flowchart showing the operation of the SPI interface 180e of the seventh embodiment. As shown in FIG. 48, the operation by the circuit format analysis unit 12e of the seventh embodiment is performed prior to Step S111 that is the operation by the SPI interface 180 of the first embodiment (FIG. 31).

To be more specific, in the SPI interface 180e, an evaluation is performed to determine whether or not there is the circuit format setting command including the circuit format setting values in the data stack 182 in the processing of Step S131 that is performed prior to the circuit configuration identifying processing of Step S111. Then, when it is determined that there is the circuit format setting command in the data stack 182 (YES in Step S131), the circuit format setting command is obtained from the data stack 182 in Step S132. Conversely, when it is determined that there is no circuit format setting command in the data stack 182 (NO in Step S131), the circuit configuration control values corresponding to the circuit format setting values are obtained from the control register 181. In the seventh embodiment, the processing from Steps S131 to S111 is a first circuit format analysis step.

As stated above, in the semiconductor device of the seventh embodiment, even when at least one of the selection destinations of the multiplexers and the circuit characteristic values is updated without transmitting the circuit format setting values, it is possible to perform the error detection processing of the circuit configuration by the circuit configuration error detection unit 11.

Eighth Embodiment

Figure 49:
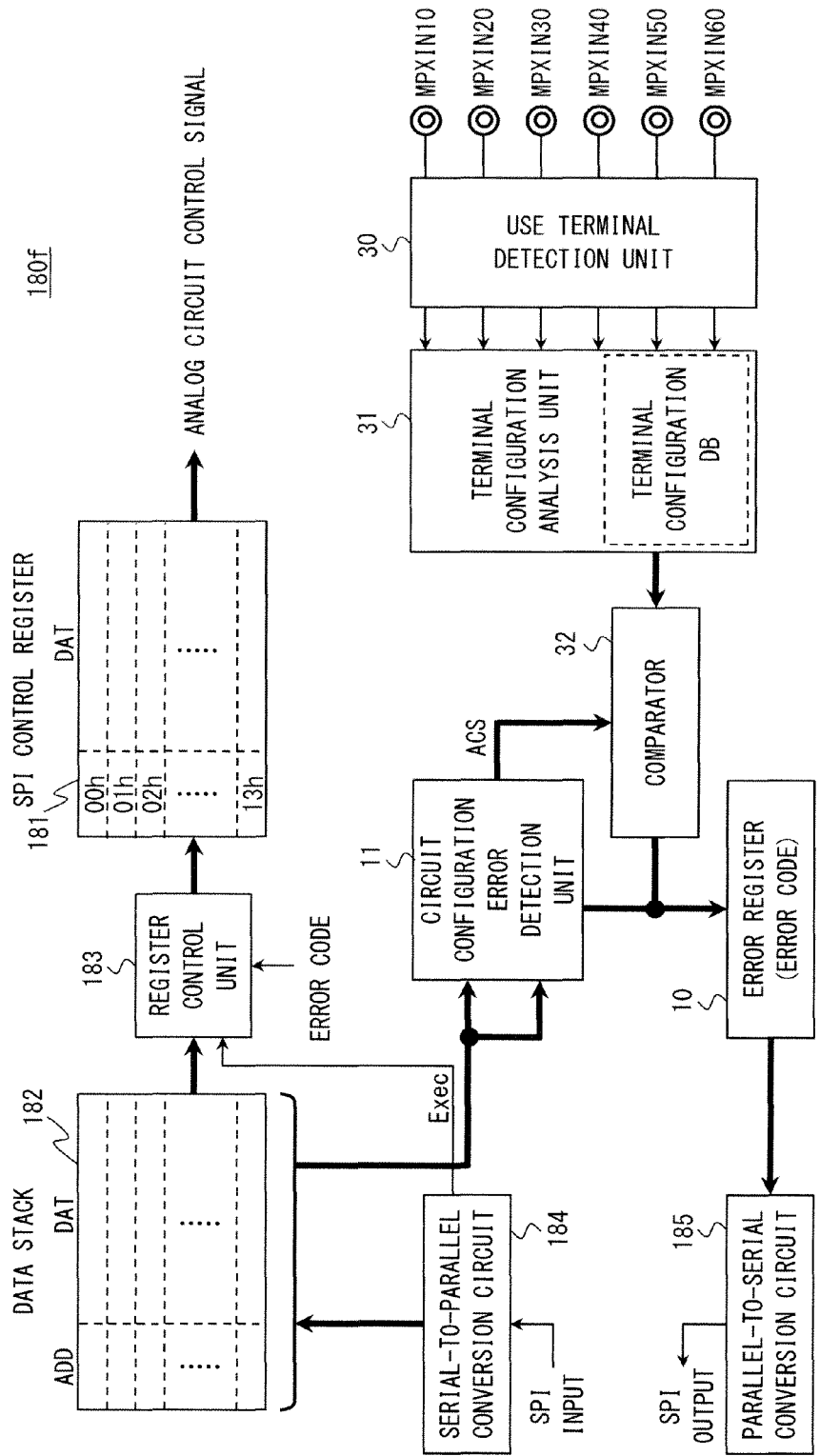
FIG. 49 is a block diagram showing an SPI interface of a semiconductor device according to an eighth embodiment.

FIG. 49 is a block diagram showing an SPI interface 180f according to an eighth embodiment. As shown in FIG. 49, the SPI interface 180f further includes a use terminal detection unit 30, a terminal configuration analysis unit 31, and a comparator 32 in the SPI interface 180 of the first embodiment. Further, FIG. 49 also shows a plurality of external input terminals (MPXIN10 to MPXIN60) that supply input signals to the AFE unit 100.

The use terminal detection unit 30 evaluates whether or not there is a sensor element connected to the external input terminals and outputs a terminal state notification signal. The terminal configuration analysis unit 31 is a third circuit format analysis unit and identifies available circuit formats according to the terminal state notification signal. When the circuit format which is to be updated and is identified by the circuit format analysis unit 12 is inconsistent with the circuit format identified by the terminal configuration analysis unit 31, the comparator 32 outputs an error code having an error value. This error code is stored to the error register 10. Further, the comparator 32 obtains the circuit format which is to be updated and is identified by the circuit format analysis unit 12 according to the circuit format signal ACS output from the circuit format analysis unit 12.

Figure 50:
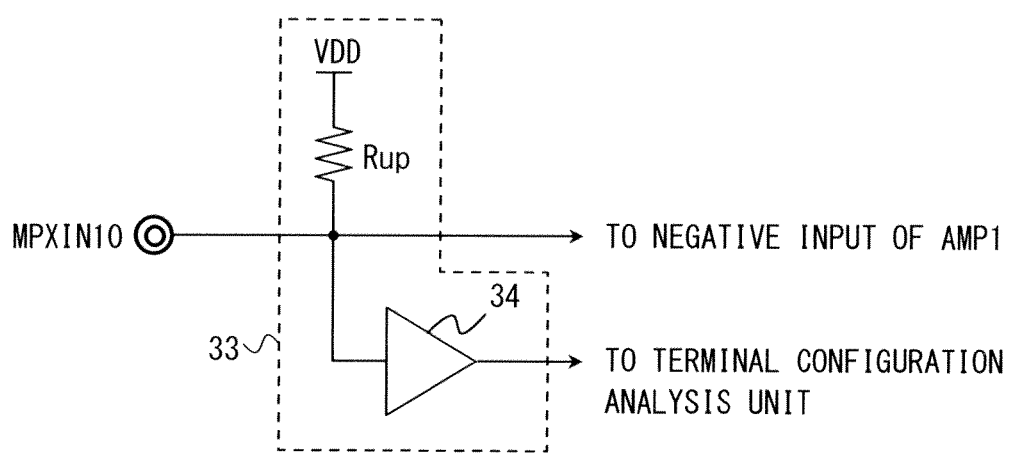
FIG. 50 is a circuit diagram showing a circuit of a use terminal detecting unit of the semiconductor device according to the eighth embodiment.

Here, the use terminal detection unit 30 includes a connection element detection circuit 33 for each external input terminal. A configuration of the connection element detection circuit 33 is explained here. FIG. 50 is a circuit diagram of the connection element detection unit.

As shown in FIG. 50, the connection element detection circuit 33 includes a pull-up resistor Rpu and a buffer 34. The pull-up register Rpu is connected between an input wire and a power supply terminal that connects the external input terminal and the internal circuit. The buffer 34 monitors a voltage of the input wire, and when the voltage of the input wire is at the level almost equivalent to the power supply voltage, the buffer 34 outputs the terminal state notification signal (e.g., low-level signal) indicating that a sensor is not connected to the corresponding external input terminal. Further, a threshold voltage is set the buffer 34 in advance, and when the voltage value of the input wire is lower than the threshold voltage, the buffer 34 outputs the terminal state notification signal (e.g., high-level signal) indicating that a sensor is connected to a corresponding external input terminal. In general, a sensor consumes some current, thus the voltage of the input wire is reduced when the sensor is connected to the external input terminal.

The terminal configuration analysis unit 31 includes a terminal configuration database that stores associations between terminal configurations and the circuit formats and identifies available circuit formats by comparing a logical level of the terminal state notification signal input from the use terminal detection unit 30 with the terminal configuration database. FIG. 51 is a table for explaining the terminal configuration database.

As shown in FIG. 51, the terminal configuration database describes, for each circuit format, the external input terminal to which the sensor should be connected. For example, when the terminal state notification signal output from the connection element detection circuit 33 corresponding to the external input terminals MPXIN20, MPXIN40, and MPXIN60 is at a high-level, the terminal configuration analysis unit 31 selects a non-inverting amplifier as the available circuit format. Then, the terminal configuration analysis unit 31 notifies the comparator 32 of the selected circuit format.

Figure 52:
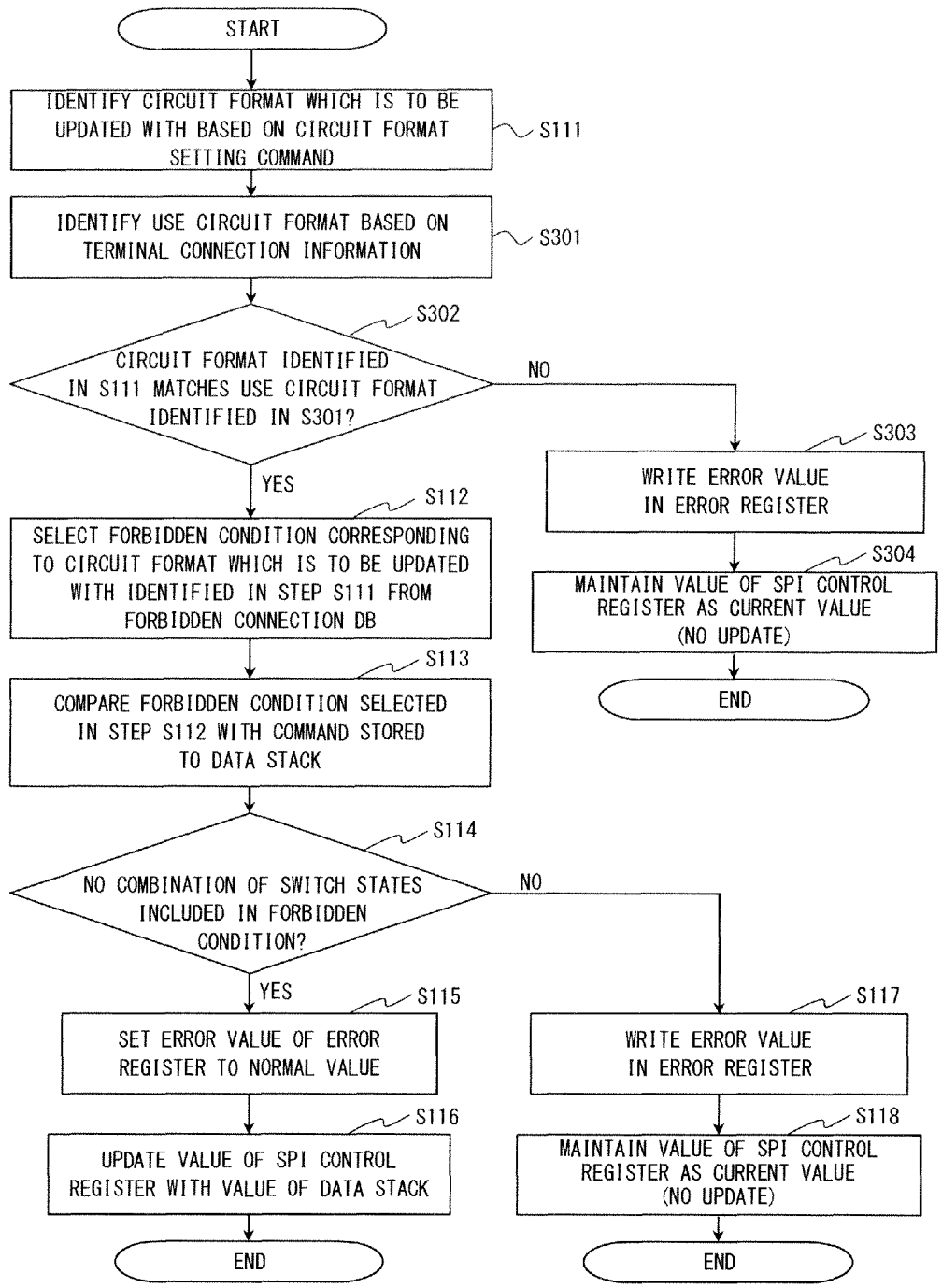
FIG. 52 is a flowchart showing an operation of the semiconductor device according to the eighth embodiment.

Next, an operation of the SPI interface 180f of the eighth embodiment is explained. FIG. 52 is a flowchart showing the operation of the SPI interface 180f according to the eighth embodiment.

As shown in FIG. 52, the operation of the SPI interface 180f of the eighth embodiment further includes processing of Steps S301 to S304 in the processing of the SPI interface 180 of the first embodiment.

In Step S301, the terminal configuration analysis unit 31 obtains terminal connection state information by the terminal state notification signal and identifies the available circuit format according to the terminal connection state information. To be more specific, Step S301 includes a use terminal detection step and a third circuit format analysis step. In the use terminal detection step, the use terminal detection unit 30 evaluates whether or not there is a sensor element connected to the external input terminal and outputs the terminal state notification signal. In the third circuit format analysis step, the terminal configuration analysis unit 31 identifies available circuit formats according to the terminal state notification signal.

Next, in Step S302, the comparator 32 evaluates whether or not the circuit format identified in the first circuit format analysis step (e.g., Step S111) matches the circuit format identified in Step S301. When the comparator 32 evaluates that the circuit format which is to be updated and is identified in the first circuit format analysis step is inconsistent with the circuit format identified in the third circuit format analysis step (NO in Step S302), the error code having the error value is output (Step S303). When an error flag turns into the error value in Step S303, the register control unit 183 stops updating the circuit configuration control values of the control register 181 (Step S304). Conversely, in Step S302, when the comparator 32 evaluates that the circuit format which is to be updated and is identified in the first circuit format analysis unit matches the circuit format identified in the third circuit format analysis step (YES in Step S302), the error code will have the normal value, and the processing of Step S112 and subsequent steps is performed in a similar manner to the first embodiment.

As stated in the eighth embodiment, it is possible to prevent a failure caused by a difference in the connection state of the sensors and a circuit format of the AFE unit 100. Further, in general, the sensors are fixedly connected, and the circuit format corresponds to the sensors. Therefore, an inconsistency between the circuit format derived from the terminal state and the circuit format derived from the plurality of commands stored to the data stack 182 could indicate an error in the plurality of commands stored to the data stack 182. In such a case, the SPI interface 180f of the eighth embodiment is capable of avoiding a failure caused by an error in the circuit configuration derived from the commands.

Ninth Embodiment

Figure 53:
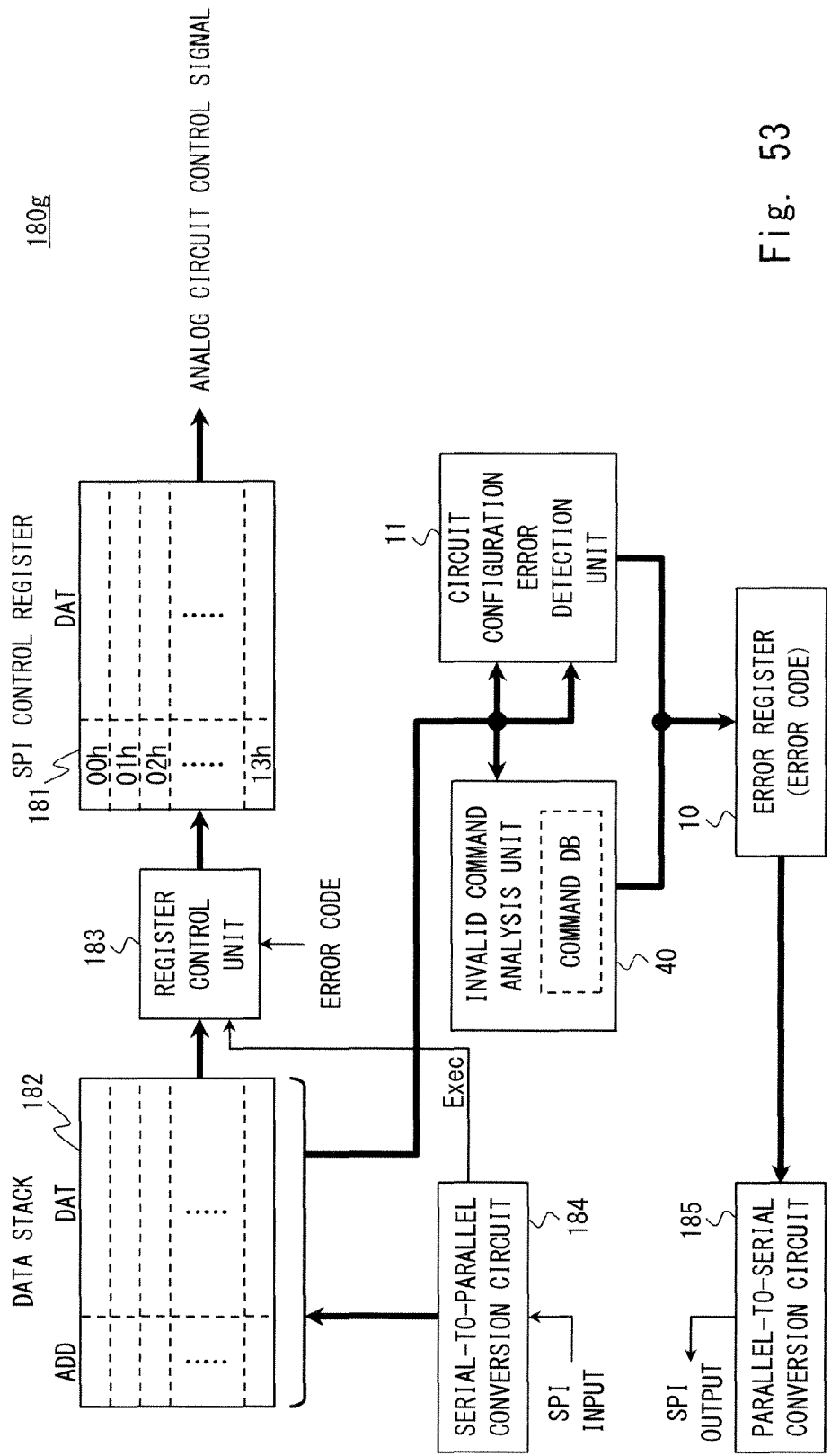
FIG. 53 is a block diagram showing an SPI interface of a semiconductor device according to a ninth embodiment.

FIG. 53 is a block diagram of an SPI interface 180g according to a ninth embodiment. As shown in FIG. 53, the SPI interface 180g of the ninth embodiment further includes an invalid command analysis unit 40 in the SPI interface 180 of the first embodiment.

When an invalid command that is different from predetermined commands is included in the plurality of commands stored to the data stack 182, the invalid command analysis unit 40 generates the error code having the error value. Further, the invalid command analysis unit 40 includes a command database that describes a list of commands to be transmitted. The invalid command analysis unit 40 compares the commands described in the command database with the commands stored to the data stack 182, and if there is a command in the data stack 182 that is inconsistent with the commands in the command database, the invalid command analysis unit 40 sets the error value to the error code. This error command is stored to the error register 10.

Figure 54:
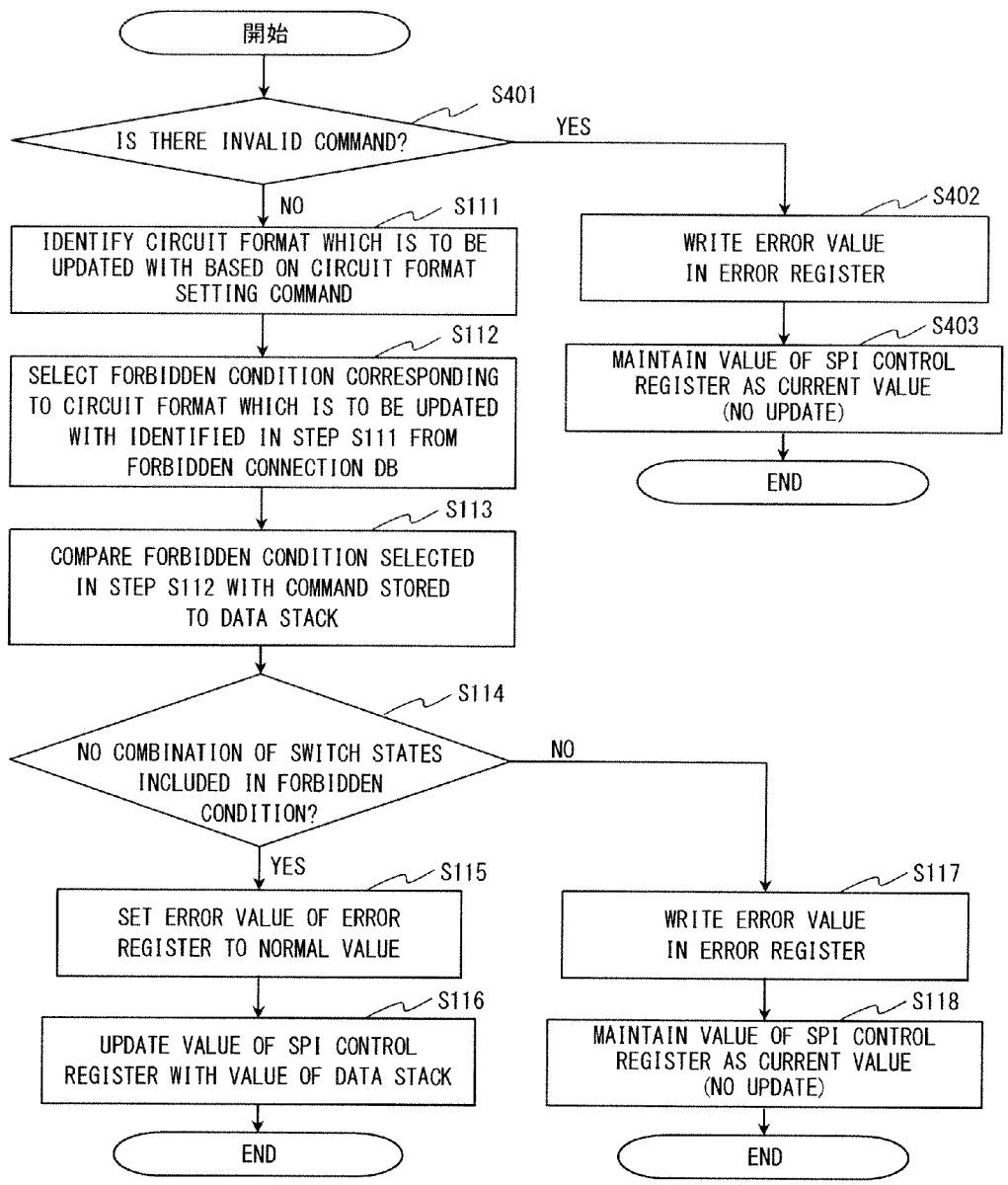
FIG. 54 is a flowchart showing an operation of the semiconductor device according to the ninth embodiment.

Next, an operation of the SPI interface 180g according to the ninth embodiment is explained. FIG. 54 is a flowchart showing the operation of the SPI interface 180g according to the ninth embodiment.

As shown in FIG. 54, the SPI interface 180g of the ninth embodiment further includes processing of Steps S401 to S403 in the processing of the SPI interface 180 of the first embodiment. In Step S401, an evaluation is performed to determine whether or not an invalid command different from predetermined commands is included in the plurality of received commands. When it is determined that there is an invalid command in the evaluation of Step S401 (YES in Step S401), the invalid command analysis unit 40 writes the error value in the error register in Step S402. The processing of Steps S401 and S402 is an invalid command analysis step. Then, when the error value is written in the error register 10, the register control unit 183 stops updating the circuit configuration control values of the control register 181 (Step S403).

As stated above, even when an invalid command that disables identification of the circuit configuration is input, the semiconductor device of the ninth embodiment is capable of detecting that the invalid command is input as an error.

Tenth Embodiment

Figure 55:
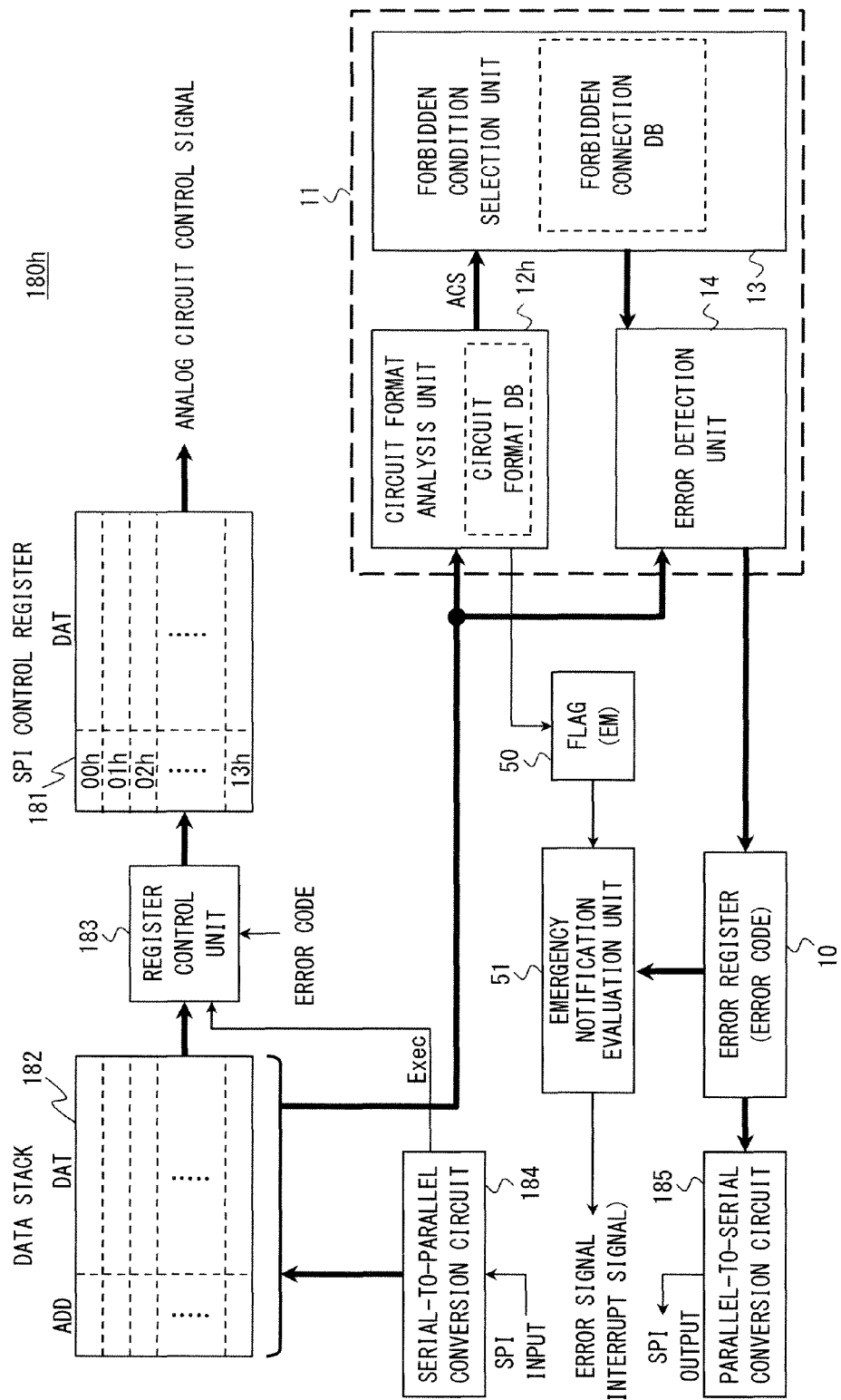
FIG. 55 is a block diagram showing an SPI interface of a semiconductor device according to a tenth embodiment.

FIG. 55 is a block diagram of an SPI interface 180h according to a tenth embodiment. As shown in FIG. 55, the SPI interface 180h of the tenth embodiment further includes an emergency notification flag register (hereinafter merely referred to as a flag register 50) and an emergency notification evaluation unit 51 in the SPI interface 180 of the first embodiment, and the circuit format analysis unit 12 of the SPI interface 180 of the first embodiment is replaced with a circuit format analysis unit 12h.

The flag register 50 stores an emergency notification flag EM. When the emergency notification flag has a first value, the emergency notification evaluation unit 51 outputs an error signal to the MCU unit 200 in response to a change in the error code from the normal value to the error value. This error signal is handled as an interrupt request in the MCU unit 200.

Further, the circuit format analysis unit 12h further includes generation processing of the emergency notification flag in the processing of the circuit format analysis unit 12 of the first embodiment. When the identified circuit format which is to be updated is a predetermined circuit format for emergency notification, the circuit format analysis unit 12h rewrites the emergency notification flag from a second value, which indicates a configuration in which the circuit format which is to be updated does not require an emergency notification, to a first value, which indicates a circuit format in which the circuit format which is to be updated requires an emergency notification.

Figure 56:
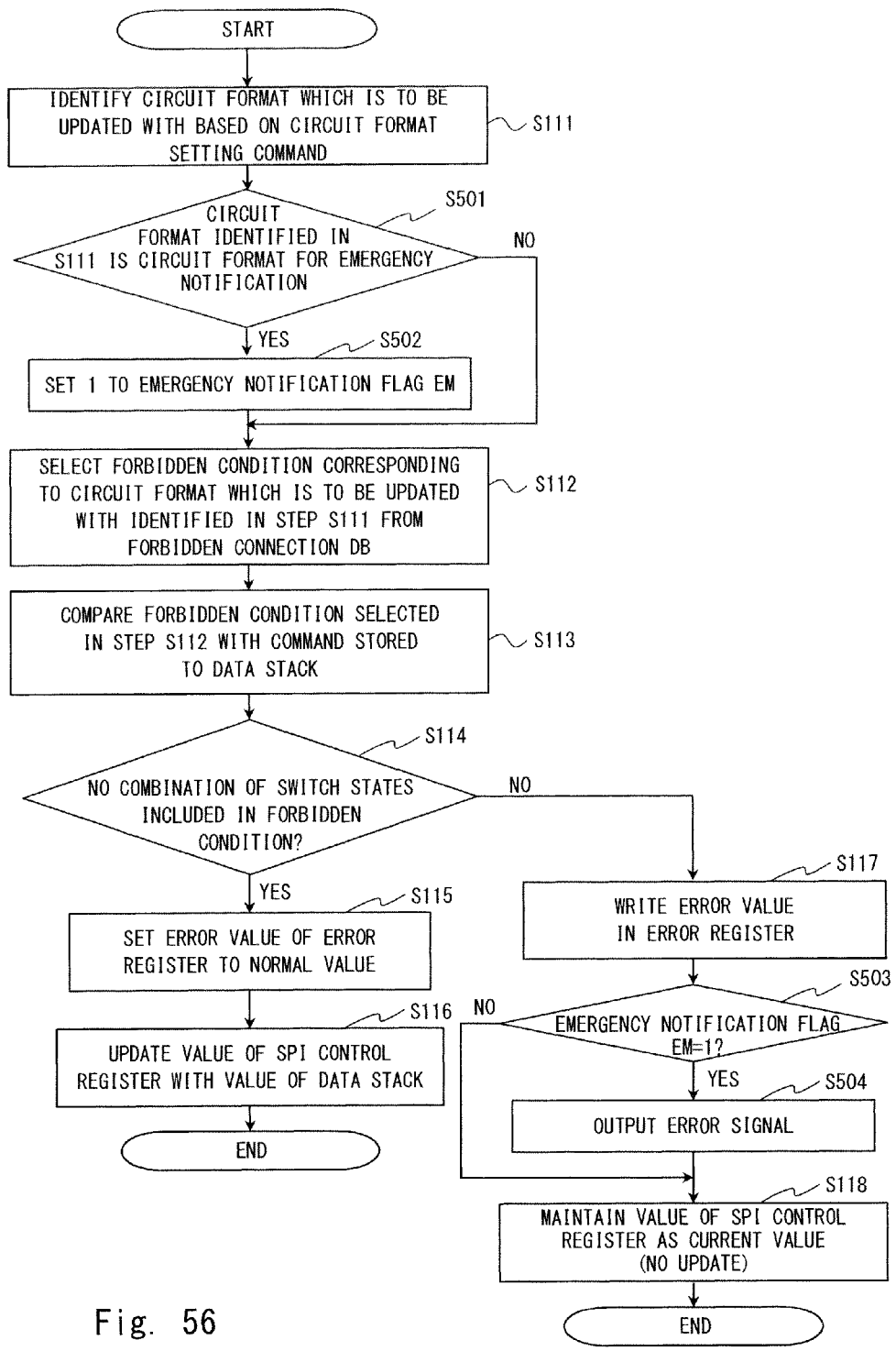
FIG. 56 is a flowchart showing an operation of the semiconductor device according to the tenth embodiment.

Next, an operation of the SPI interface 180h according to the tenth embodiment is explained. FIG. 56 is a flowchart showing the operation of the SPI interface 180h. As shown in FIG. 56, the operation of the SPI interface 180h of the tenth embodiment further includes processing of Steps S501 to S504 in the processing of the SPI interface 180 of the first embodiment.

Step S501 is processing performed after the circuit format analysis step of Step S111. In Step S501, an evaluation is performed to determine whether or not the circuit format which is to be updated and is identified in Step S111 is the circuit format for emergency notification. When it is determined that the identified circuit format which is to be updated is the circuit format for emergency notification in the evaluation of Step S501 (YES in Step S501), the circuit format analysis unit 12h sets the first value (e.g., 1) to the emergency notification flag EM in Step S502. After that, the SPI interface 180h executes the forbidden condition selection step of Step S112 in a similar manner to the operation of the SPI interface 180. Conversely, when it is determined that the identified circuit format which is to be updated is not the circuit format for emergency notification in the evaluation of Step S501 (NO in Step S501), the circuit configuration error detection unit 11 will not perform the processing of Step S502 and executes the processing of Step S112.

Then, when the error value is written in the error register 10 in Step S117, in the semiconductor device of the tenth embodiment, the emergency notification evaluation unit 51 evaluates whether or not the emergency notification flag EM is 1 (Step S503). Then, in Step S503, when the emergency notification evaluation unit 51 evaluates that the emergency notification flag EM is 1 (YES in Step S503), the emergency notification evaluation unit 51 outputs an error signal to the MCU unit 200 in Step S504, and then stops the updating processing of the control register 181 (Step S116). Conversely, when the emergency notification evaluation unit 51 evaluates that the emergency notification flag EM has the second value (e.g., 0) (NO in Step S503), the emergency notification evaluation unit 51 will not perform the processing of Step S504 and stops the updating processing of the control register 181 (Step S116).

Figure 57:
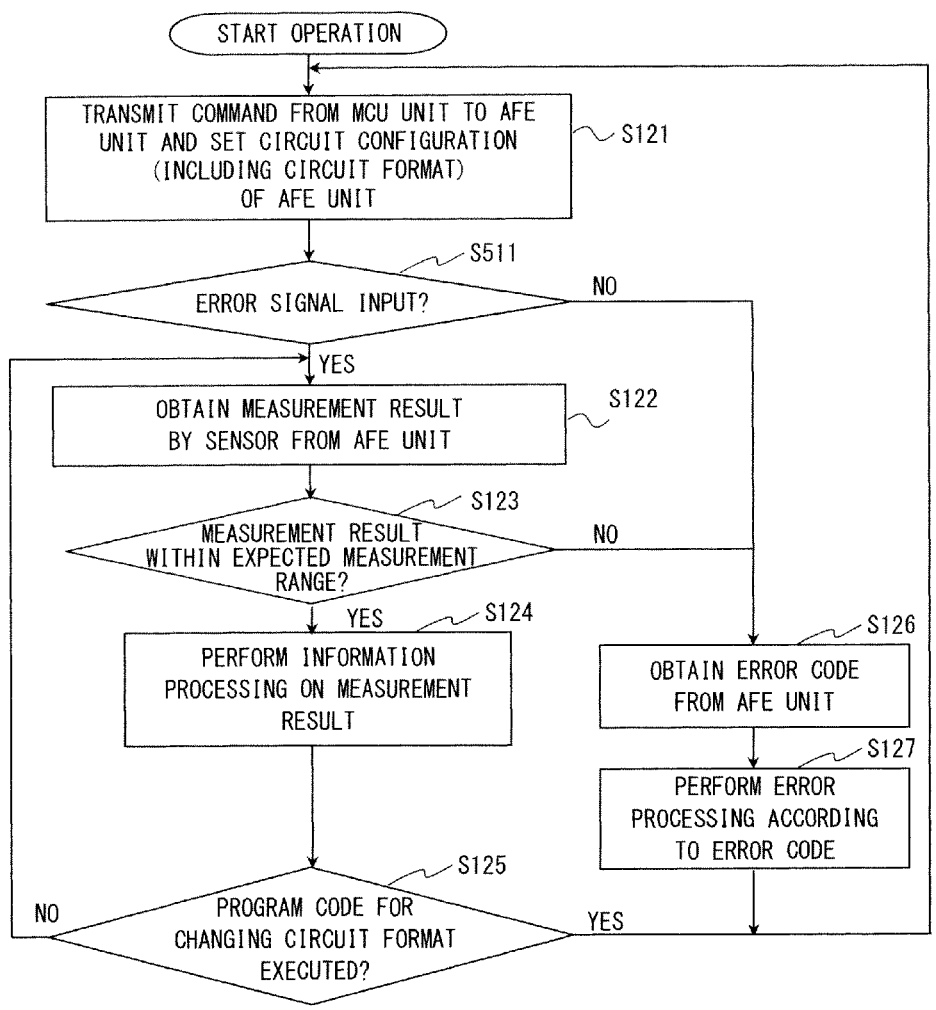
FIG. 57 is a flowchart showing an operation of the semiconductor device according to the tenth embodiment.

As stated above, the semiconductor device of the tenth embodiment is capable of selecting whether or not to notify an error by the emergency notification to the MCU unit 200 according to the circuit format. Further, the MCU unit 200 that has received the error signal can perform the error processing such as interrupt processing. Hereinafter, an entire operation of the semiconductor device of the tenth embodiment is explained. FIG. 57 is a flowchart showing the operation of the semiconductor device of the tenth embodiment.

As shown in FIG. 57, in the semiconductor device of the tenth embodiment, after commands are transmitted to the AFE unit 100 in Step S121 and circuit configuration is set, when the error signal is input to the MCU unit 200 (YES in Step S511), the MCU unit 200 performs interrupt processing and obtains the error code from the AFE unit 100 (Step S126). Then, the MCU unit 200 performs error processing according to the error code (Step S127).

Conversely, in the semiconductor device of the tenth embodiment, when the error signal is not input to the MCU unit 200 in Step S511 (NO in Step S511), a measurement result is obtained from the AFE unit 100 in similar manner to the first embodiment (Step S122).

As stated above, in the semiconductor device of the tenth embodiment, when the circuit format of the AFE unit 100 is the same as the circuit format for emergency notification that has been previously selected, the MCU unit 200 is capable of instantly recognizing generation of an error. Instantly recognizing generation of an error in this way enables the semiconductor device of the tenth embodiment to increase the speed of the error processing.

For example, when an acceleration sensor or a illuminance sensor is used as the sensor 2, a long check cycle by the illuminance sensor will not be a problem, however for the acceleration sensor, high-speed error processing (e.g., retransmission of a command) is necessary for the reason such that the acceleration sensor has to detect a drop of the device and perform shock resistance processing to the drop. In such a case, quick recovery processing by an emergency notification, for example, is required for the circuits in the AFE unit that obtains a measurement result from the acceleration sensor. The semiconductor device of the tenth embodiment can be used for such usage.

Eleventh Embodiment

In the above embodiments, a configuration for preventing a malfunction caused by an error in the commands transmitted from the MCU unit 200 to the AFE unit 100 has been explained. In an eleventh embodiment, a method for preventing an error from being generated in the commands stored to the memory 220 of the MCU unit 200 is explained. The commands used in the eleventh embodiment are generated in a part of generation processes of a program that is executed by a semiconductor device of the eleventh embodiment.

Figure 58:
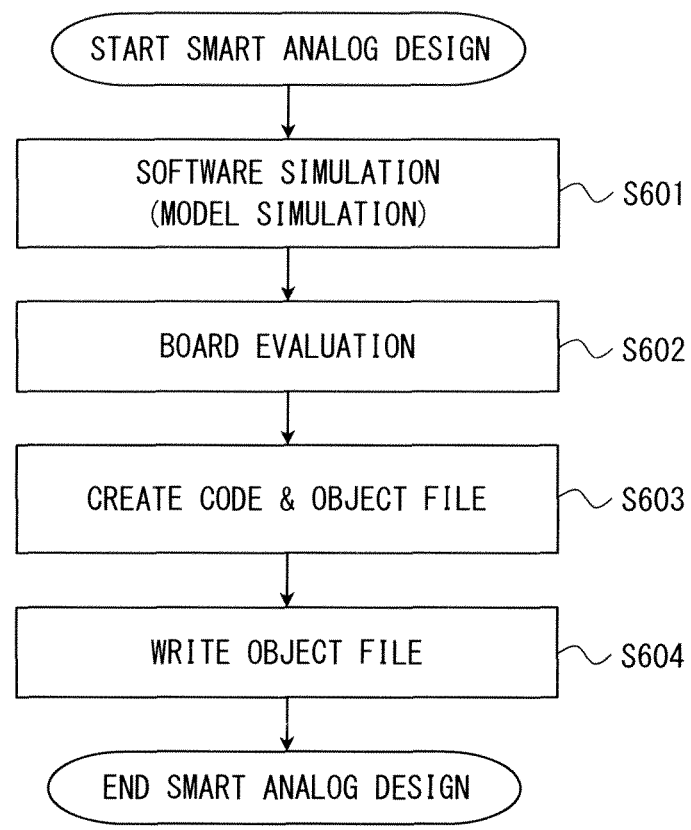
FIG. 58 is a flowchart showing a design flow of the semiconductor device according to the embodiments.

A design flow of the semiconductor device 1 is explained here. FIG. 58 is a flowchart showing the design flow of the semiconductor device 1. As shown in FIG. 58, in the design flow of the semiconductor device 1, firstly a software simulation using a model of the circuits included in the AFE unit 100 is performed (Step S601). This software simulation may be performed by an independent computer system or performed using a server disposed in a different place via a network. In this software simulation, it is possible to obtain a sensor planned to be used and rough values of the circuit configuration of the AFE unit 100 corresponding to the sensor.

Next, a board evaluation is performed (Step S602). In this board evaluation, a detailed circuit configuration is determined according to commands obtained in Step S601. In the board evaluation, the semiconductor device 1 and a sensor are actually placed on an evaluation board such as a PCB substrate, the semiconductor device 1 is controlled using an operation device such as a computer, and circuit characteristics are evaluated.

Next, a program code for operating a device including the semiconductor device 1 is created, and an object file is generated (Step S603). The program code includes the commands in a part of the source written in a programming language such as C language. The object file is a binary file created by compiling the program code and written in the memory 220 of the semiconductor device 1.

Next, the object file created in Step S603 is written in the semiconductor device 1, whereby the design of the semiconductor device 1 is completed.

Figure 59:
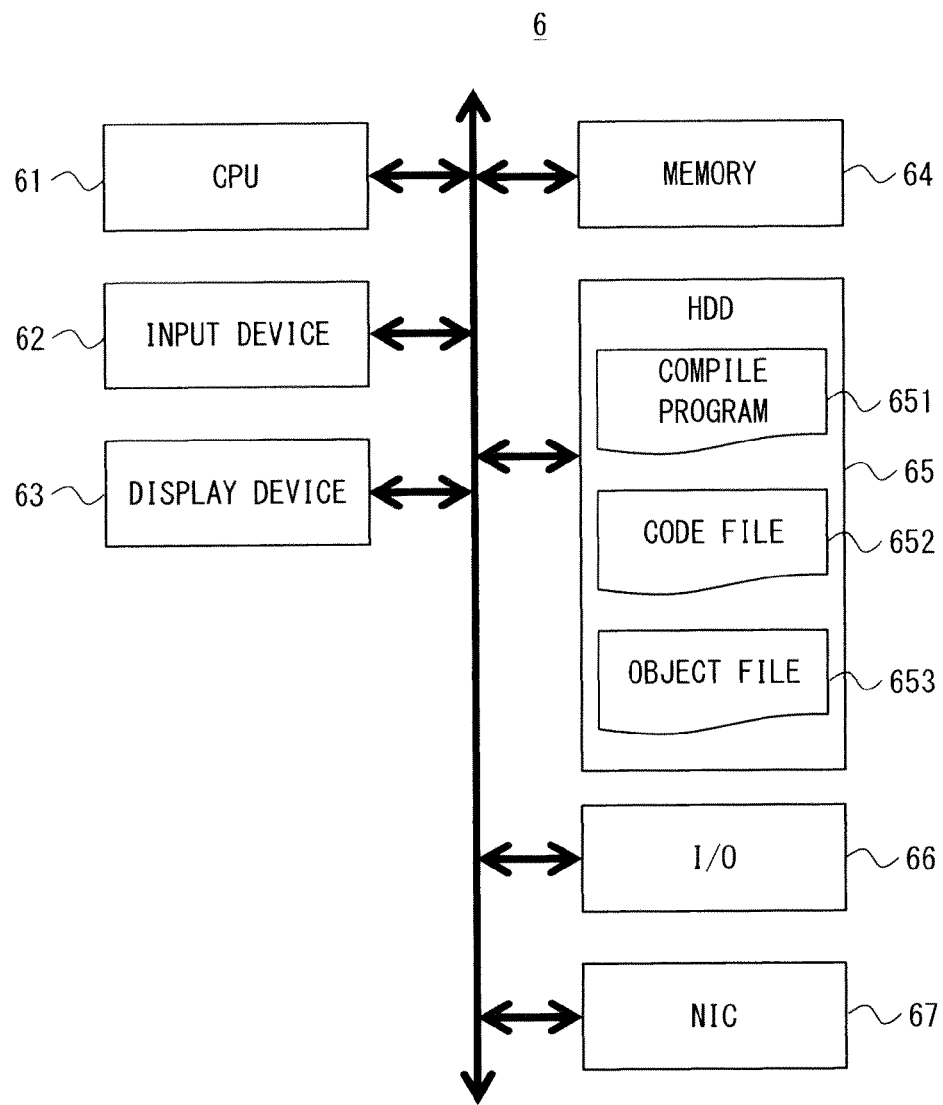
FIG. 59 is a configuration diagram of a compile device for generating an object file to be input to the semiconductor device according to the embodiments.

In the eleventh embodiment, a method for preventing a typo in the commands during the object file generation process of Step S603 is explained. An overview of a compile device for creating the program code and generating the object file is explained here. FIG. 59 is a block diagram showing an overview of the compile device 6.

As shown in FIG. 59, the compile device 6 includes a CPU 61, an input device 62, a display device 63, a memory 63, an HDD (Hard Disk Drive) 65, an input/output interface 66, and an NIC 67. A compile program 651 for performing compile processing in the compile device 6 is stored to the HDD 65. Further, the HDD 61 also stores a program code file 652 (hereinafter referred to as a code file 652) and an object file 653 to be generated.

The CPU 61 is an arithmetic unit that reads the compile program 651 and performs the compile processing. The input device 62 is an input interface that accepts operations from a user. The display device 63 is a device that displays a user interface screen or the like. The memory 64 stores intermediate data and the like that is used in the processing by the CPU 61. The input/output interface 66 is, for example, an external interface of the compile device 6 such as a USB interface. The NIC 67 is a network interface.

Figure 60:
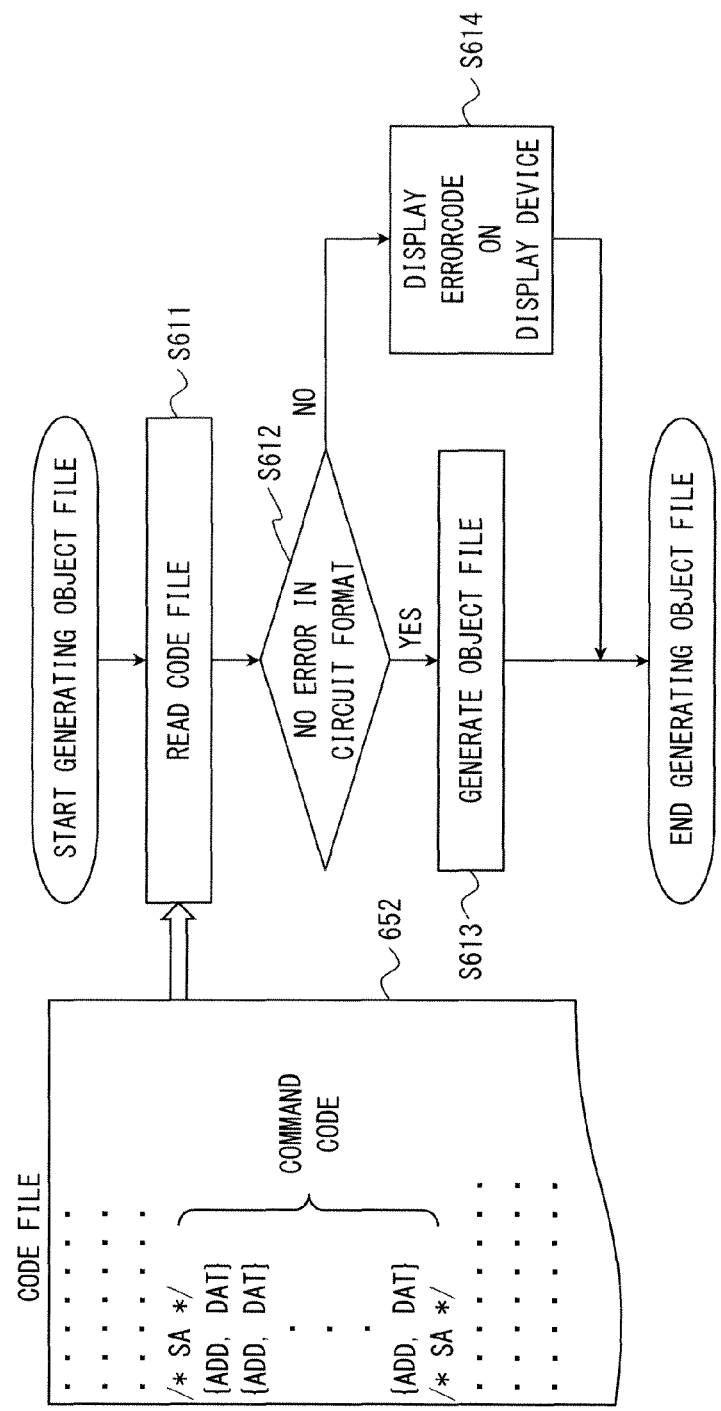
FIG. 60 is a flowchart showing a compiling method of the compile device according to the embodiments.

The compile device 6 is especially characterized in the processing by the compile program 651. FIG. 60 is a flowchart showing a procedure of the compile processing according to the compile program 651.

As shown in FIG. 60, the compile program 651 firstly performs read processing to read the code file 652 (Step S611). Next, the compile program 651 evaluates whether commands included in the code file 652 that has been read has a configuration violating the forbidden conditions explained in the above embodiments (Step S612). In Step S612, software executes the error detection processing that has been executed by hardware, which is the circuit configuration error detection unit 11, in the above embodiments.

Then, in the evaluation processing of Step S612, when an error in the circuit configuration is not found (YES in Step S612), the object file 653 is generated (Step S613). Conversely, when an error in the circuit configuration is found in the evaluation processing of Step S612 (NO in Step S612), the compile program 651 displays an error code (e.g., error code shown in FIG. 25 or the like) on the display device 63 and ends the processing (Step S614). Then, when an error is included in the circuit configuration realized by the commands in the code file 625, a user can correct the error and create the object file including a correct command.

As stated above, the compile program 651 of the eleventh embodiment is capable of preventing generation of the object file including a command with an error in a circuit configuration. As described so far, improving reliability of the object file to be written can improve reliability of a system including the semiconductor device 1.

The eleventh embodiment illustrated an example in which the error code is displayed and the processing is ended when an error is included in the command. However, a corrected command code may be automatically generated according to type of the error, and then the object file may be generated.

The above-mentioned program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Twelfth Embodiment

In a twelfth embodiment, an example of improving work efficiency by displaying an error in the software simulation of FIG. 58 is explained. Firstly, FIG. 61 is a block diagram of a simulation system (design support system) for simulating an operation of the semiconductor device 1 according to this embodiment.

Figure 61:
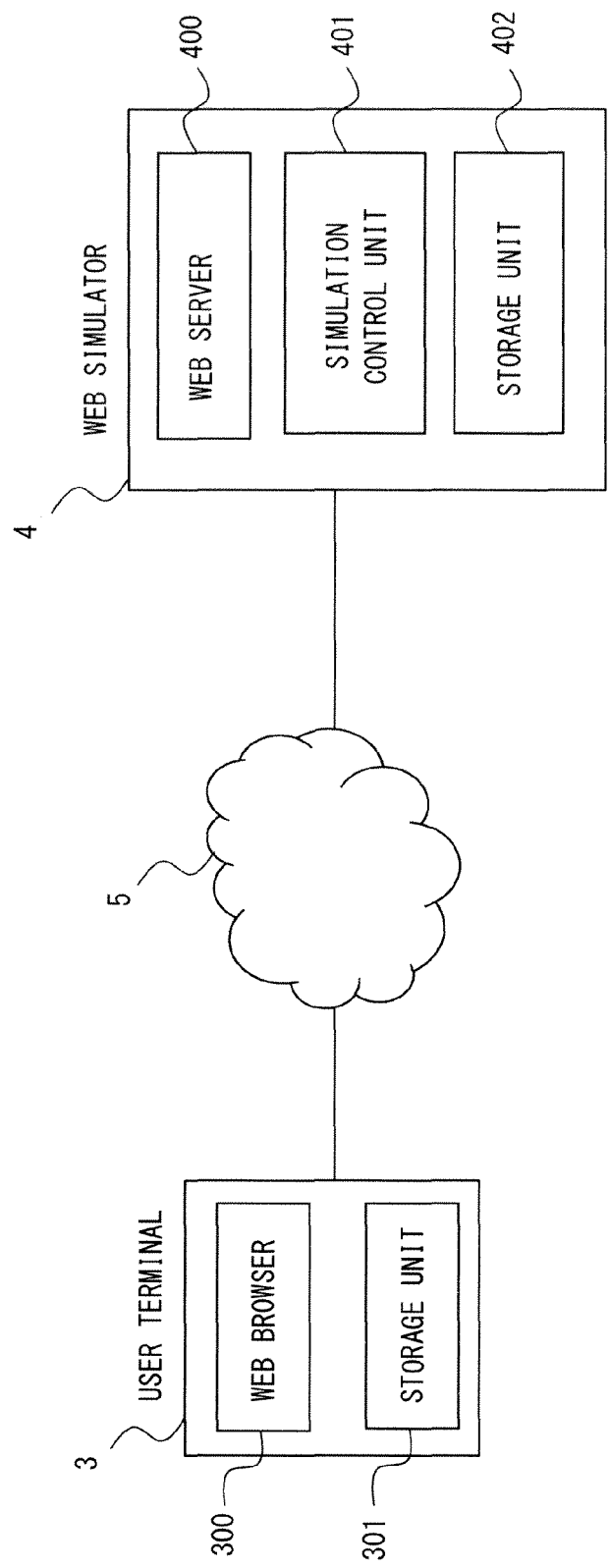
FIG. 61 is a configuration diagram of a simulation system according to the embodiments.

As shown in FIG. 61, the simulation system includes a user terminal 3 and a web simulator 4 that are connected to each other to enable communication via a network 5. The user terminal 3 mainly includes a web browser 300 and a storage unit 301. The web simulator 4 mainly includes a web server 400, a simulation control unit 401, and a storage unit 402.

The network 5 is the Internet, for example, and is a network capable of transmitting web page information between the user terminal 3 and the web simulator 4. The network 5 may either be a wired network or a wireless network.

The web browser 300 of the user terminal 3 displays a web page on a display device according to the web page information received from the web server 400. The web browser 300 is an interface that accepts an operation from a user, accesses the web server 400 in response to the operation from the user, and executes a simulation by the web simulator 4.

The storage unit 301 of the user terminal 3 stores various data and programs for realizing functions of the user terminal 3. As described later in detail, the storage unit 301 downloads register information to be set to the control register 181 of the semiconductor device 1 from the web simulator 4 and stores the register information.

The web server 400 of the web simulator 4 is a server that provides the web browser 300 with web services of the web simulator. The web server 400 accepts access from the web browser 300 and transmits web page information to be displayed on the web browser in response to the access.

The simulation control unit 401 of the web simulator 4 realizes a simulation function of the sensor and the semiconductor device 1. As described later in detail, the web simulator 4 sets the circuit configuration of the sensor and the semiconductor device 1, which are to be simulated, sets parameters necessary for the simulation, and executes the simulation.

The storage unit 402 of the web simulator 4 stores various data and programs for realizing functions of the web simulator. As described later in detail, the storage unit 402 stores information of selectable sensors and information of bias circuits suitable for the sensor, and information of the analog circuits suitable for the sensor and the bias circuit, for example.

Figure 62:
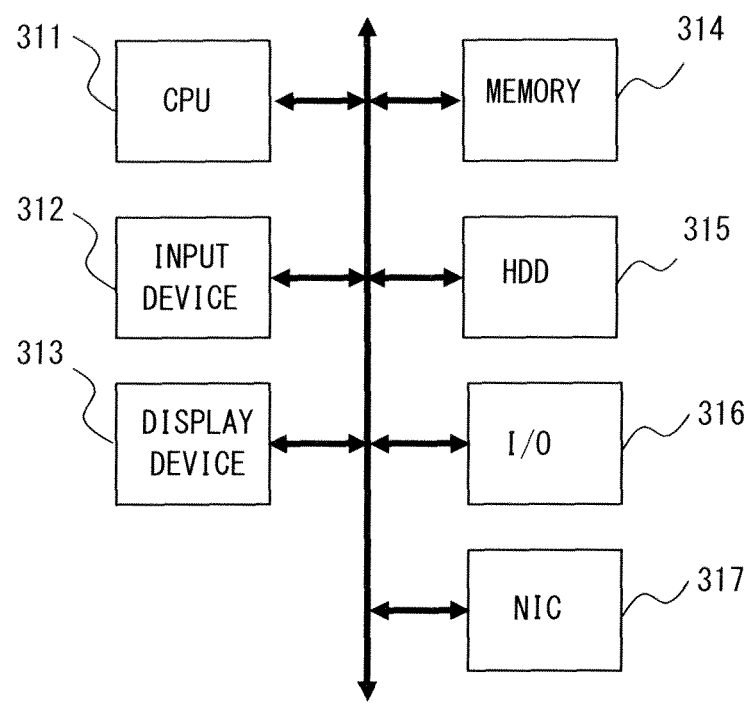
FIG. 62 is a hardware configuration diagram of a device constituting the simulation system according to the embodiments.

The user terminal 3 is a computer device such as a personal computer that operates as a client device. The web simulator 4 is a computer device such as a workstation that operates as a server device. FIG. 62 shows an example of a hardware configuration for realizing the user terminal 3 or the web simulator 4. Note that the user terminal 3 or the web simulator 4 may not be a single computer but may be composed of a plurality of computers.

As shown in FIG. 62, the user terminal 3 or the web simulator 4 are a common computer and include a central processing unit (CPU) 311 and a memory 314. The CPU 311 and the memory 314 are connected to a hard disk device (HDD) 315 via a bus, in which the HDD 315 is an auxiliary memory device. The user terminal 3 includes, for example, an input device 312 such as a pointing device (e.g., a mouse and a joystick) or a keyboard for a user input, and a display device 313 such as a CRT and a liquid crystal display for providing a user with visual data, for example, GUI. In a similar manner to the user terminal 3, the web simulator 4 may include user interface hardware.

The storage medium such as the HDD 315 supplies an instruction to the CPU 111 or the like in cooperation with an operation system and stores a browser program and a simulation program for performing the functions of the user terminal 3 or the web simulator 4. These programs are loaded to the memory 34 for execution.

Further, the user terminal 3 or the web simulator 4 includes an input/output (I/O) interface 316 and an NIC (Network Interface Card) 317 to be connected to an external device. For example, the user terminal 3 includes a USB or the like to be connected to the semiconductor device 1, for example, as the input/output interface 316. The user terminal 3 and the web simulator 4 include an Ethernet (registered trademark) card or the like as the NIC 317 to be connected to the network 5.

Figure 63A:
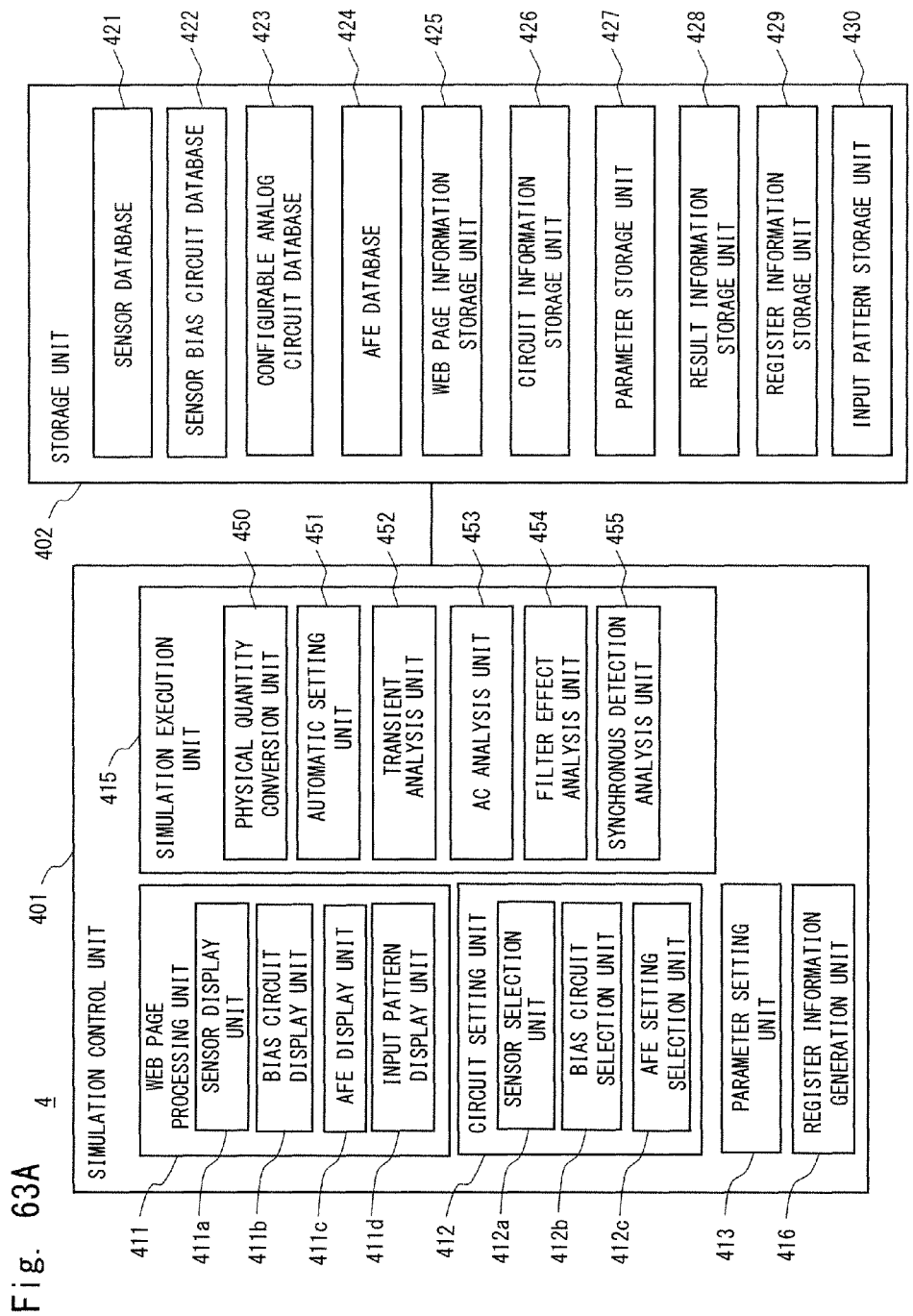
FIG. 63A is a functional block diagram of a web simulator according to the embodiments.

FIG. 63A shows functional blocks of the simulation control unit 401 of the web simulator 4 and various data stored to the storage unit 402. Note that FIG. 63A is merely an example, and other configuration can be employed as long as processing and screen display shown in FIG. 64, which are described later in detail, can be realized.

The simulation control unit 401 realizes functions of respective units for a simulation by execution of the simulation program using the CPU 311. As shown in FIG. 63A, the simulation control unit 401 mainly includes a web page processing unit 411, a circuit setting unit 412, a parameter setting unit 413, a simulation execution unit 415, and a register information generation unit 416. Further, the simulation execution unit 415 includes a physical quantity conversion unit (physical quantity-to-electrical characteristics conversion function) 450, an automatic setting unit 451, a transient analysis 452, an AC analysis unit 453, a filter effect analysis unit 454, and a synchronous detection analysis unit 455.

The storage unit 402 is realized by the HDD 315 and the memory 314. As shown in FIG. 63A, the storage unit 402 includes a sensor database 421, a sensor bias circuit database 422, a configurable analog circuit database 423, an AFE database 424, a web page information storage unit 425, a circuit information storage unit 426, a parameter storage unit 427, a result information storage unit 428, a register information storage unit 429, and an input pattern storage unit 430.

The sensor database 421 is a database that stores datasheets of various sensors. The datasheets of the sensors include information such as types and characteristics of the sensors. The sensor database 421 stores associations between the sensors and the types and the characteristics.

The sensor bias circuit database 422 is a database that stores bias circuits (bias methods) that can be used by the various sensors. The information of the bias circuits includes information of elements composing the bias circuit, connections between the elements, and output terminals. The sensor bias circuit database 422 stores associations between the sensors and the bias circuits.

The configurable analog circuit database 423 is a database for selecting an optimal analog circuit for the sensor and the sensor bias circuit. The information of the configurable analog circuit includes information of the configuration of the configurable amplifier 110 and input terminals of the semiconductor device 1, for example. The configurable analog circuit database 423 stores associations between the sensors and the bias circuits and the configuration of the configurable amplifier 110.

The AFE database 424 is a database that stores datasheets of the semiconductor devices 1. In particular, the datasheets include a configuration and characteristics and the like of the AFE unit 100 for a simulation of the AFE unit 100 of the semiconductor device 1. The AFE database 424 stores associations between the configuration of the semiconductor device 1 and the AFE unit 100. For example, the AFE database 424 stores datasheets of the semiconductor devices 1.

The web page information storage unit 425 stores web page information for displaying various screens on the web browser 300 of the user terminal 3. The web page information is information for displaying web pages (screens) including GUI to simulate the semiconductor device 1, as described later in detail.

The circuit information storage unit 426 stores circuit information of the circuits to be simulated. The circuit information includes information of connections between the sensors and the bias circuits, and the circuit elements and elements of the AF unit 100. The parameter storage unit 427 stores parameters necessary for executing a simulation as simulation conditions. The parameters include input information such as a physical quantity and circuit parameters, for example.

The result information storage unit 428 stores result information that is an execution result of the simulation. The result information includes input/output waveforms of the respective circuits of the AFE unit 100 as the simulation results of transient analysis, AC analysis, filter effect analysis, and synchronous detection analysis. The register information storage unit 429 stores register information (configuration information) to be set to the control register 181 of the semiconductor device 1. The input pattern storage unit 439 stores information of a plurality of waveform patterns of signals to be input to the sensors. The input pattern storage unit 439 stores patterns such as a sine wave, a square wave, a triangle ware, and a step response, as input patterns.

The web page processing unit (web page display unit) 411 transmits the web page information stored to the web page information storage unit 425 to the user terminal 3 via the web server 400 so as to display the web page (screen) including GUI on the web browser 300, and accepts an input operation from a user to the GUI on the web page via the user terminal 3.

The web page processing unit 411 includes a display unit for displaying the screens. That is, the web page processing unit 411 includes a sensor display unit 411*a*, a bias circuit display unit 411*b*, an AFE display unit 411*c*, and an input pattern display unit 411*d*. The sensor display unit 411*a* refers to the sensor database 421 and displays a plurality of sensors corresponding to a type of the sensor selected by the user. The bias circuit display unit 411*b* refers to the sensor bias circuit database 422 and displays a plurality of bias circuits corresponding to the selected sensor. The AFE display unit (semiconductor device display unit) 411*c* refers to the AFE database 424 and displays a plurality of semiconductor devices 1 including the configuration amplifier 110 having a set circuit configuration. The input pattern display unit 411*d* displays the plurality of waveform patterns stored to the input pattern storage unit 430.

In response to an input operation on the web page (screen) by the user, the circuit setting unit 412 generates the circuit information and stores the circuit information to the circuit information storage unit 426. The circuit setting unit 412 generates the circuit information according to the selection of the sensor, the bias circuit, and the semiconductor device 1. For example, the circuit setting unit 412 includes a sensor selection unit 412*a*, a bias circuit selection unit 412*b*, and an AFE setting selection unit 412*c*.

The sensor selection unit 412*a* generates the circuit information according to the information of the sensor selected by the user operation from the plurality of sensors included in the sensor database 421 that have been displayed on the sensor display unit 411*a*. The bias circuit selection unit 412*b* generates the circuit information according to the information of the bias circuit selected by the user operation from the plurality of bias circuits suitable for the selected sensor that have been displayed on the bias circuit display unit 411*b*. The AFE setting selection unit (circuit configuration setting unit) 412*c* refers to the configurable analog circuit database 423, identifies the configuration and the connection of the configurable amplifier 110 suitable for the selected sensor and the selected bias circuit, and generates the circuit information. Further, the AFE setting selection unit (semiconductor device selection unit) 412*c* generates the circuit information according to the information of the semiconductor device 1 selected by the user operation from the plurality of semiconductor devices 1 included in the AFE database 424 that have been displayed on the AFE display unit 411*c*.

In response to the input operation on the web page (screen) by the user, the parameter setting unit 413 generates parameters for executing the simulation and stores the parameters to the parameter storage unit 427. The parameter setting unit (input pattern selection unit) 413 generates information of the input pattern of the physical quantity to be input to the sensor, in which the input pattern have been selected by the user operation from the plurality of waveform patterns displayed on the input pattern display unit 411*d*.

The simulation execution unit 415 refers to the circuit information storage unit 426 and the parameter storage unit 427 and executes the simulation according to the stored circuit information and the stored parameters.

The physical quantity conversion unit 450 converts the physical quantity, which is input information of the sensor, into an electrical signal, which is to be output from the sensor. The physical quantity conversion unit 450 refers to the parameter storage unit 427 and generates an output signal of the sensor corresponding to the physical quantity that fluctuates in time series according to the set input pattern of the physical quantity.

The automatic setting unit (circuit characteristic setting unit) 451 automatically sets the circuit characteristic of the AFE unit 100 and stores the set parameters to the parameter storage unit 427. The automatic setting unit 451 refers to the circuit information storage unit 426 and automatically sets an optimal gain offset for the configurable amplifier 110 in the set circuit configuration of the sensor, the bias circuit, and the configurable amplifier 110. The automatic setting unit 451 simulates the operation of the configurable amplifier 110 and adjusts the parameters such as a DAC voltage and a gain of the configurable amplifier 110 to achieve an optimal gain offset.

The transient analysis unit 452 simulates input/output characteristics of the AFE unit 100 and stores a simulation result to the result information storage unit 428 in order to analyze transient characteristics. The transient analysis unit 452 refers to the circuit information storage unit 426 and the parameter storage unit 427, simulates a circuit operation of the configuration that has been set with the parameters as the simulation conditions, and generates waveforms indicating input/output characteristics. The transient analysis unit 452 simulates an operation of the AFE unit 100 using, as an input signal to the AFE unit 100, the sensor output signal that is obtained by the physical quantity conversion unit 450 in conversion of the input pattern of the physical quantity that is input in time series and generates time-series output signals of the respective circuits of the AFE unit 100.

The AC analysis unit 453 simulates frequency characteristics of the AFE unit 100 and stores a simulation result to the result information storage unit 428 in order to analyze AC characteristics. The AC analysis unit 453 refers to the circuit information storage unit 426 and the parameter storage unit 427, simulates a circuit operation of a configuration to which the parameters have been set as the simulation conditions, and generates waveforms indicating the frequency characteristics. The AC analysis unit 453 generates the input pattern of the physical quantity for every frequency, simulates an operation of the AFE unit 100 using the sensor output signal converted by the physical quantity conversion unit 450 as an input signal to the AFE unit 100, and generates an output signal for every frequency of the respective circuits of the AFE unit 100.

The filter effect analysis unit 454 simulates input/output characteristics of the AFE unit 100 in an environment where noise is generated and stores a simulation result to the result information storage unit 428 in order to analyze a filter effect. filter effect analysis unit 454 refers to the circuit information storage unit 426 and the parameter storage unit 427, simulates a circuit operation of a configuration to which the parameters have been set as the simulation conditions, and generates waveforms indicating the input/output characteristics in a noise environment. The filter effect analysis unit 454 simulates an operation of the AFE unit 100 using, as an input signal to the AFE unit 100, the sensor output signal that is obtained by adding noise to the input pattern of the physical quantity input in time series and converting the noise-added signal by the physical quantity conversion unit 450 and generates a time-series output signal of the respective circuits of the AFE unit 100.

The synchronous detection analysis unit 455 simulates a synchronous detection operation of the AFE unit 100 and stores a simulation result to the result information storage unit 428 in order to analyze the synchronous detection operation. The synchronous detection analysis unit 455 refers to the circuit information storage unit 426 and the parameter storage unit 427, simulates a circuit operation of a configuration to which the parameters have been set as the simulation conditions, and generates waveforms indicating a synchronous detection operation. The synchronous detection analysis unit 455 simulates an operation of the AFE unit 100 using the input pattern of the physical quantity input in time series and synchronous clocks as the ones shown in FIG. 16 as an input to the AFE unit 100 and generates a time-series output signal of the respective circuits of the AFE unit 100.

The register information generation unit 416 generates the register information to be set to the register 181 of the semiconductor device 1 and stores the register information to the register information storage unit 429. The register information generation unit 416 refers to the circuit information storage unit 426 and the parameter storage unit 427, and generates the register information according to the circuit configuration and the circuit characteristics of the AFE unit 100 that have been set as a unit to be simulated.

Figure 63B:
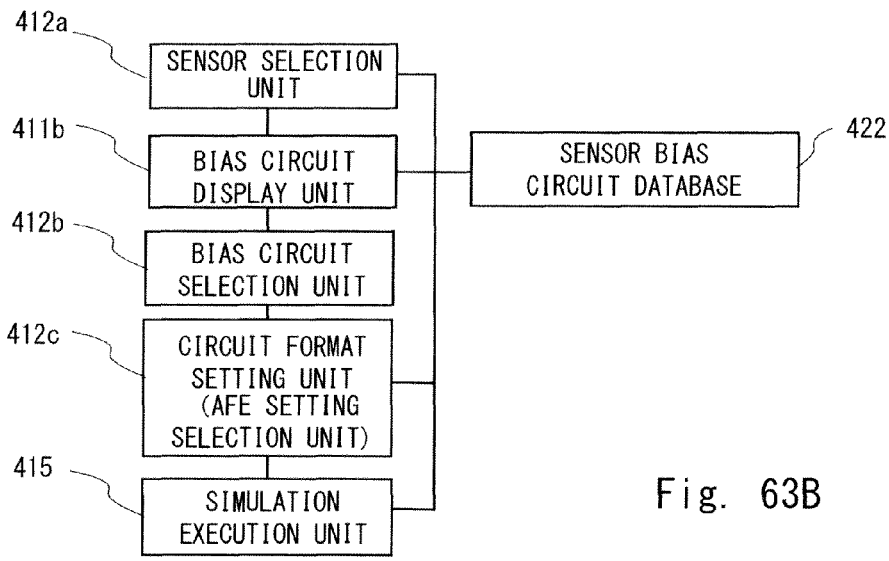
FIG. 63B is a functional block diagram of the web simulator according to the embodiments.
Figure 63C:
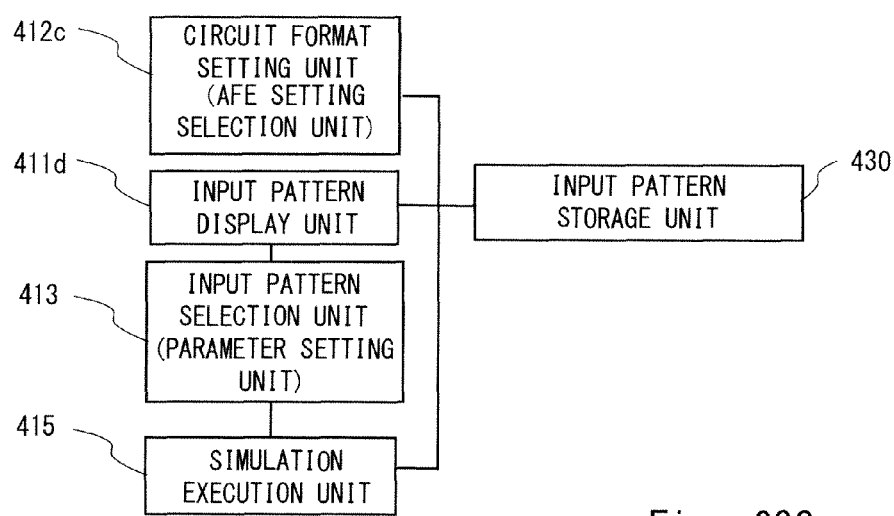
FIG. 63C is a functional block diagram of the web simulator according to the embodiments.

Further, as shown in FIGS. 63B and 63C, the web simulator 4 may be composed of a part of the blocks shown in FIG. 63A. For example, as shown in FIG. 63B, the web simulator 4 at least includes the sensor bias circuit database 422, the sensor selection unit 412*a*, the bias circuit display unit 412*b*, the bias circuit selection unit 412*b*, the circuit configuration setting unit (AFE setting selection unit) 412*c*, and the simulation execution unit 415 among the configuration of FIG. 63A.

That is, in FIG. 63B, the sensor selection unit 412*a* selects the sensor to be connected to the semiconductor device 1. The sensor bias circuit database 422 stores associations between the sensors and the plurality of bias circuits that supply a bias signal to the sensors. The bias circuit display unit 412*b* refers to the sensor bias circuit database 422 and displays the plurality of bias circuits corresponding to the selected sensor. The bias circuit selection unit 412*b* selects a bias circuit to be connected to the sensor selected by a user operation from the plurality of bias circuits displayed. The circuit configuration setting unit 412*c* sets the circuit configuration of the semiconductor device 1 to be connected to the selected sensor and the selected bias circuit. The simulation execution unit 415 executes a simulation of a connected circuit in which the selected sensor and the bias circuit are connected to the semiconductor device 1 with a set circuit configuration. By forming the web simulator 4 that includes at least the components shown in FIG. 63B, it is possible to select an optimal bias circuit from the plurality of bias circuits corresponding to the sensor and effectively perform a simulation.

Further, as shown in FIG. 63C, the web simulator 4 at least includes the input pattern storage unit 430, the circuit configuration setting unit (AFE setting unit) 412*c*, the input pattern display unit 411*d*, the input pattern selection unit (parameter setting unit) 413, and the simulation execution unit 415 among the configuration shown in FIG. 64A.

That is, in FIG. 63C, the circuit configuration setting unit 412*c* sets the circuit configuration of the semiconductor device 1 according to the sensor to be connected to the semiconductor device 1. The input pattern storage unit 430 stores the plurality of waveform patterns of the signal to be input to the sensor, and the input pattern display unit 411*d* displays the plurality of waveform patterns stored to the input pattern storage unit 430. The input pattern selection unit 413 selects a waveform pattern of the signal to be input to the sensor according to a user operation from the plurality of waveform patterns displayed. The simulation execution unit 415 receives the selected waveform pattern as an input condition and executes a simulation of a connected circuit in which the sensor and the analog front-end circuit with a set circuit configuration are connected. By forming the web simulator 4 that includes at least the components shown in FIG. 63C, it is possible to select a desired pattern from the waveform pattern input to the sensor and effectively perform a simulation.

Figure 64:
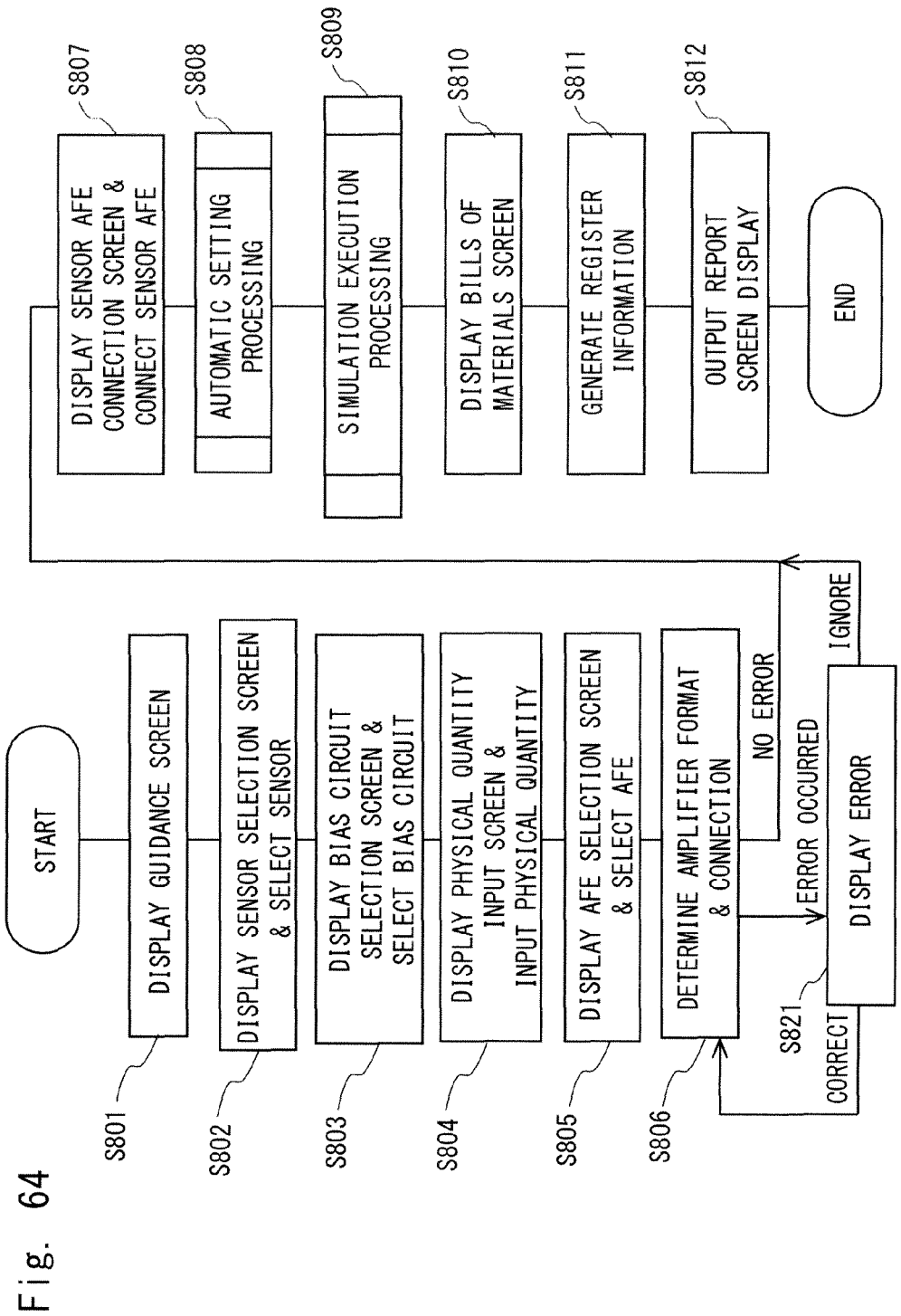
FIG. 64 is a flowchart showing a simulation method of the web simulator according to the embodiments.

Next, a simulation method executed by the simulation system according to this embodiment is explained using FIG. 64. This simulation method is realized by executing the respective processing using the web simulator 4 mainly shown in FIGS. 61 to 63C and by displaying screens on the display device of the user terminal 3. Thus, the processing executed by the web simulator 4 is explained below.

FIG. 64 is a flowchart showing an entire flow of simulation processing according to this embodiment. In this simulation processing, firstly the web page processing unit 411 displays a guidance screen on the user terminal 3 (Step S801). When a user specifies an URL of the web simulator 4 on the web browser 300 of the user terminal 3, the web browser 300 accesses the web server 400, and the simulation program starts on the web simulator 4. Then, the web page processing unit 411 transmits web page information of the guidance screen, which is a start page, to the user terminal 3, and displays the guidance screen on the web browser 300.

Next, the web page processing unit 411 displays a sensor selection screen on the user terminal 3, and the user selects a sensor (Step S802). On the guidance screen of Step S801, when the user performs an operation to select the sensor, the web page processing unit 411 transmits web page information of the sensor selection screen for selecting a sensor to the user terminal 3, and displays the sensor selection screen on the web browser 300. When the user specifies a refining condition (search condition or filter condition) such as a sensor type, the web page processing unit 411 extracts the sensors that match the refining condition from the sensor database 421, and displays a list of the extracted sensors on the sensor selection screen. When the user selects the sensor to be used from the sensor list displayed on the sensor selection screen, the circuit setting unit 412 (sensor selection unit 412a) stores the selected sensor to the circuit information storage unit 426 as a circuit to be simulated.

Next, the web page processing unit 411 displays a bias circuit selection screen on the user terminal 3, and the user selects a bias circuit (Step S803). On the sensor selection screen of Step S802, when the user performs an operation to select a bias circuit, the web page processing unit 411 transmits web page information of the bias circuit selection screen to the user terminal 3 and displays the bias circuit selection screen on the web browser 300. The web page processing unit 411 refers to the sensor bias circuit database 422, extracts a plurality of bias circuits suitable for the sensor selected in Step S802, and displays the plurality of bias circuits on the bias circuit selection screen. When the user selects a bias circuit from the plurality of bias circuits displayed on the bias circuit selection screen, the circuit setting unit 412 (bias circuit selection unit 412b) stores the selected bias circuit to the circuit information storage unit 426 as a circuit to be simulated.

Next, the web page processing unit 411 displays a physical quantity input screen on the user terminal 3, and the user inputs a physical quantity (Step S804). On the sensor selection screen of Step S802 and the bias circuit selection screen of Step S803, when the user performs an operation to input the physical quantity of a sensor, the web page processing unit 411 transmits web page information of the physical quantity input screen for the user to input the physical quantity of the sensor to the user terminal 3, and displays the physical quantity input screen on the web browser 300. The web page processing unit 411 displays the plurality of input patterns (input waveforms) for inputting the physical quantity to the sensor in time series on the physical quantity input screen, and the user selects an input pattern to be used in a simulation. Further, the web page processing unit 411 refers to the sensor database 421, displays an input range of the physical quantity corresponding to the selected sensor on the physical quantity input screen, and the user sets an input range of the physical quantity. On the physical quantity input screen, when the user inputs the input pattern and the input range of the physical quantity to be input to the sensor, the parameter setting unit 413 sets the parameter that has been input to the parameter storage unit 427.

Next, the web page processing unit 411 displays an AFE selection screen on the user terminal 3, and the user selects an AFE (semiconductor device) (Step S805). On the guidance screen of Step S801 and the sensor selection screen of Step S802, for example, when the user performs an operation to select the semiconductor device 1 (AFE unit 100), the web page processing unit 411 transmits web page information of the AFE selection screen for the user to select the semiconductor device 1 to the user terminal 3 and displays the AFE selection screen on the web browser 300.

The web page processing unit 411 refers to the AFE database 424 and extracts the semiconductor devices 1 having the configuration of the configurable amplifier 110 that is suitable for the selected sensor and the selected bias circuit. At this time, the web page processing unit 411 refers to the configurable analog circuit database 423, determines the configuration of the configurable amplifier 110 that is suitable for selected sensor and bias circuit, and extracts the semiconductor devices 1 including the determined configuration of the configurable amplifier 110. Further, when the user specifies the refining condition on the configuration or the like of the semiconductor device 1, the web page processing unit 411 extracts the semiconductor devices 1 that match the refining condition from the AFE database 424 and displays a list of the semiconductor devices 1 on the AFE selection screen. When the user selects the semiconductor device 1 (AFE unit 100) to be used from the list of the semiconductor devices 1 displayed on the AFE selection screen, the circuit setting unit 412 (AFE setting selection unit 412c) stores the AFE unit 100 of the selected semiconductor device 1 to the circuit information storage unit 426 as a circuit to be simulated.

Next, the circuit setting unit 412 determines the configuration and the connection of the configurable amplifier 110 (Step S806). When the sensor and the bias circuit are selected in Steps S802 and S803 and the semiconductor device 1 is selected in Step S805, the circuit setting unit 412 refers to the configurable analog circuit database 423, determines the configuration of the configurable amplifier 110 suitable for the selected sensor and the selected bias circuit, and determines the connection (connection terminal) between the sensor and the bias circuit and the configurable amplifier 110. The circuit setting unit 412 (AFE setting selection unit 412c) stores information of the determined configuration and connection of the configurable amplifier 110 to the circuit information storage unit 426.

Here, in Step S806, before the configuration and connection information of the configurable amplifier 110 is stored to the circuit information storage unit 426, the error detection processing that has been performed by the circuit configuration error detection unit 11 of the above embodiments is performed. When an error is found in this error detection processing, a GUI screen that specifies the error is displayed on the display device 312 (Step S821).

Figure 65:
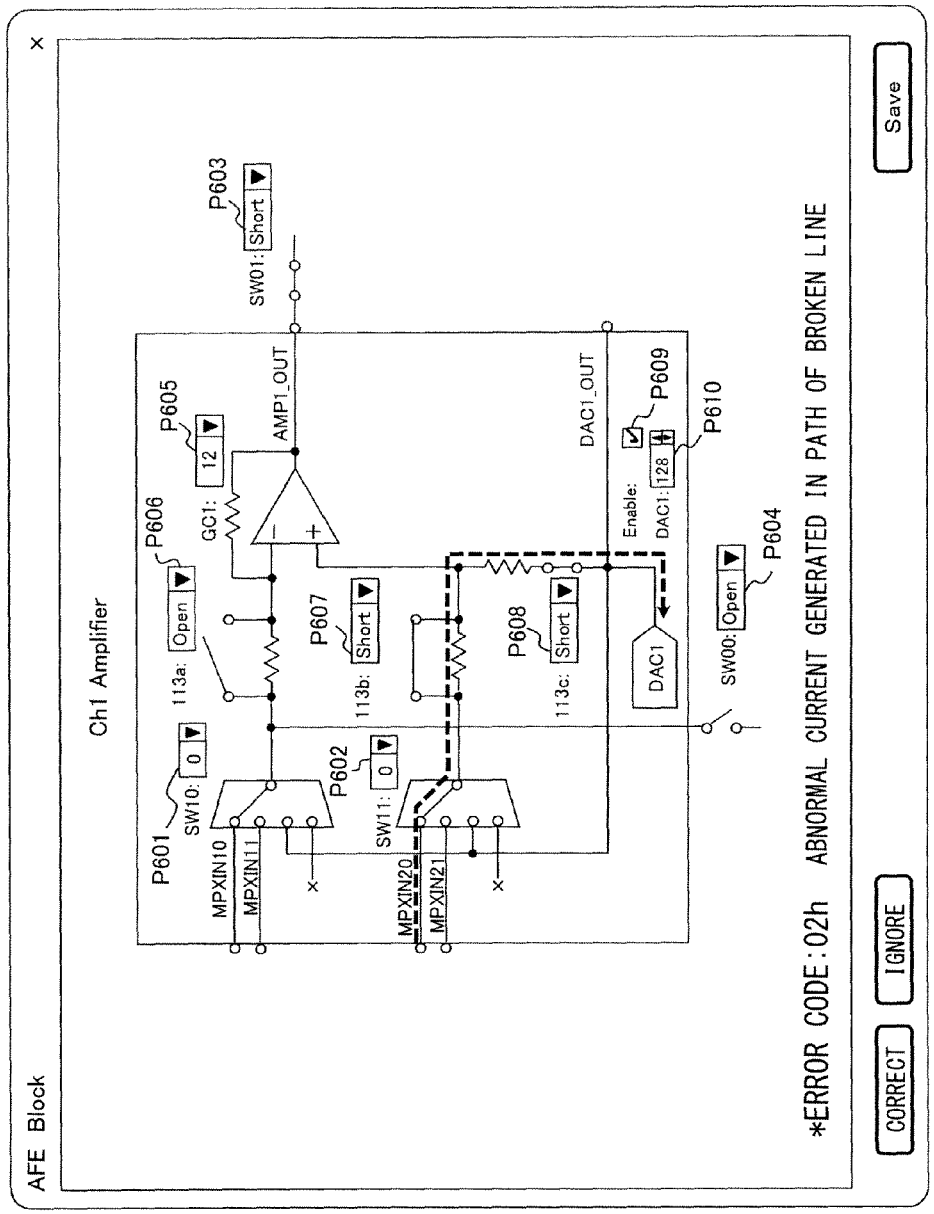
FIG. 65 is an image of an error display screen in the web simulator according to the embodiments.

FIG. 65 shows an example of the GUI screen. As shown in FIG. 65, the GUI screen highlights a signal path with an error and displays an error code and a content of the error on the bottom of the screen. Further, the GUI screen also has buttons for selecting either "Correct" or "Ignore" to handle the error. When the user selects "Correct" button, the error can be corrected. When the user selects "Ignore" button, the process can proceed to Step S807 even if there is an error.

Note that when an error is not detected in Step S806, the user is notified that there is no error and the process can proceed to Step S807.

Next, the web page processing unit 411 displays a sensor AFE connection screen on the user terminal 3, and the user connects the sensor to the AFE (semiconductor device 1) (Step S807). On the AFE selection screen of Step S805, when the user performs an operation to connect the sensor to the semiconductor device 1, the web page processing unit 411 transmits web page information of the sensor AFE connection screen for the user to connect the sensor to the semiconductor device 1 to the user terminal 3 and displays the sensor AFE connection screen on the web browser 300. The web page processing unit 411 displays an output terminal of the selected sensor and the selected bias circuit and an input terminal of the selected semiconductor device 1 (AFE unit 100) to enable the user to select the connection between the sensor and the bias circuit and the semiconductor device 1. Further, a default connection state that connects the sensor and the bias circuit to the semiconductor device 1 according to the connection determined in Step S806 is displayed. When the user selects a connection between the sensor and the semiconductor device 1 on the sensor AFE connection screen, the circuit setting unit 412 stores the selected connection to the circuit information storage unit 426 as a connection of circuits to be simulated.

Next, the automatic setting unit 451 executes automatic setting processing (Step S808). When the configuration and the connection of the sensor and the bias circuit and the configurable amplifier 110 are determined in Steps S802 to S807, the automatic setting unit 451 executes the automatic setting processing in order to automatically set default values of the configurable amplifier 110. The details of the automatic setting processing will be explained later. The automatic setting unit 451 stores the parameters of the configurable amplifier 110 that have been set in the automatic setting processing, such as a DAC output and a gain, to the parameter storage unit 427.

Next, the simulation execution unit 415 performs simulation execution processing (Step S809). When the configuration and the connection of the sensor and the bias circuit and the semiconductor device 1 (AFE unit 100) are determined in Steps S802 to S808, the simulation execution unit 415 executes an simulation for transient analysis, AC analysis, filter effect analysis, and synchronous detection analysis in response to an operation by the user. The details of the simulation execution processing will be explained later. The simulation execution unit 415 stores a simulation result obtained from the simulation execution processing to the result information storage unit 428.

Next, the web page processing unit 411 displays a bills of materials screen on the user terminal 3 (Step S810). On the guidance screen of Step S801 and the simulation screen of Step S809, when the user performs an operation to display Bills of Materials (BOM), the web page processing unit 411 transmits web page information of the bills of materials screen for displaying the BOM on the user terminal 3 to the user terminal 3 and displays the bills of materials screen on the web browser 300. The web page processing unit 411 refers to the circuit information storage unit 426 and displays the BOM including the sensor and the semiconductor device 1 selected as elements to be simulated on the bills of materials screen. The displayed BOM has links to the shopping website, and when the user selects a material on the bills of materials screen, the user can access the shopping website of the material and can purchase the material.

Next, the register information generation unit 416 generates register information (Step S811). When the circuit configuration and the parameters (circuit characteristics) of the semiconductor device 1 (AFE unit 100) are determined in Steps S802 to S809, the register information generation unit 416 generates the register information to be set to the register 181 of the semiconductor device 1. The register information generation unit 416 refers to the circuit information storage unit 426 and the parameter storage unit 427, generates the register information according to the circuit configuration and the parameters of the semiconductor device 1, and stores the generated register information to the register information storage unit 429. The register information is displayed on a report screen, thus the generation of the register information of Step S811 should be executed until the report screen is displayed.

Next, the web page processing unit 411 displays the report screen on the user terminal 3 (Step S812). On the guidance screen of Step S801 and the simulation screen of Step S809, for example, when the user performs an operation to output a simulation result, the web page processing unit 411 transmits web page information of the report screen including the simulation result to the user terminal 3 and displays the report screen on the web browser 300. The web page processing unit 411 refers to the result information storage unit 428 and displays the simulation result on the report screen. Further, the web page processing unit 411 refers to the circuit information storage unit 426, the parameter storage unit 427, and the register information storage unit 429, displays the circuit configuration, the connection, and the parameters of the sensor, the bias circuit, and the semiconductor device 1 to be simulated and also displays the register information of the semiconductor device 1. Furthermore, on the report screen, the user can download the register information to the user terminal 3 in response to a user operation.

As stated above, the simulator of the twelfth embodiment detects that the circuit configuration violates the forbidden conditions explained in the above embodiments and displays the error together with the error code on the GUI screen. The user thus will not execute a simulation with an incorrect circuit configuration, thereby shortening the time for design process.

The first to twelfth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A semiconductor device comprising:
an analog front-end unit that comprises a plurality of analog functional circuits and a switching circuit group for switching a circuit format and a circuit configuration of the plurality of analog functional circuits;
a processing unit that comprises an arithmetic unit for executing a program and a memory for storing the program and a plurality of commands, the plurality of commands specifying at least a circuit format setting value that specifies the circuit format of the plurality of analog functional circuits; and a communication interface that performs communication between the analog front-end unit and the processing unit, wherein the analog front-end unit comprises:
- a data stack that stores the plurality of commands transmitted from the processing unit;
- a control register that stores a circuit configuration control value that specifies current configurations of the plurality of analog functional circuits;
- a first circuit format analysis unit that refers to the plurality of commands stored to the data stack and identifies a circuit format of the analog functional circuit which is to be updated;
- a forbidden condition selection unit that selects, from a plurality of forbidden conditions describing a forbidden connection state for each circuit format, the forbidden condition corresponding to the circuit format identified by the first circuit format analysis unit;
- an error detection unit that refers to the plurality of commands stored to the data stack and, when a circuit configuration of the analog functional circuit which is to be updated includes the connection state satisfying the forbidden condition selected by the forbidden condition selection unit, generates an error code having an error value, the error value indicating that the circuit configuration which is to be updated satisfies the forbidden condition; and
- a register control unit that updates the circuit configuration control value of the control register by the plurality of commands stored to the data stack in response to a command execution instruction transmitted from the processing unit, and the register control unit stops updating the circuit configuration control value when the error code has the error value.

2. The semiconductor device according to claim 1, wherein the first circuit format analysis unit includes an expected value of the circuit format setting value, compares the expected value with the circuit format setting value obtained from the data stack, and identifies the circuit format of the analog functional circuit which is to be updated.

3. The semiconductor device according to claim 2, wherein in regard to the circuit format setting value, a Hamming distance between the setting values indicating a different circuit format is three or greater, and the first circuit format analysis unit identifies a circuit format corresponding to the expected value with a shortest Hamming distance from the circuit format setting value as the circuit format of the analog functional circuit which is to be updated.

4. The semiconductor device according to claim 3, wherein the circuit format setting value includes a plurality of switching values corresponding to respective circuit format control switches for switching the circuit format of the analog functional circuit, and at least one of the plurality of switching values is a redundant switching value including three or more consecutive identical values, and the register control unit performs majority processing on the redundant switching value and outputs a value evaluated to have the greatest number in the majority processing as the switching value.

5. The semiconductor device according to claim 1, wherein when the circuit format setting value is not included in the plurality of commands stored to the data stack, the first circuit format analysis unit refers to the circuit configuration control value stored to the control register and identifies the circuit format of the analog functional circuit which is to be updated.

6. The semiconductor device according to claim 1, further comprising:
- a second circuit format analysis unit that detects that the current circuit format of the analog functional circuit determined according to the circuit configuration control value stored to the control register is an instrumentation amplifier composed of a plurality of amplifiers and outputs an instrumentation amplifier detection signal; and
- a reset command generation circuit that generates a reset command for initializing the circuit configuration control value stored to the control register at the time of updating the current circuit configuration control value according to the instrumentation amplifier detection signal.

7. The semiconductor device according to claim 1, further comprising
- a plurality of external input terminals that supply an input signal to the analog front-end unit;
- a use terminal detection unit that evaluates whether or not there is a sensor element connected to the external input terminal and outputs a terminal state notification signal;
- a third circuit format analysis unit that identifies an available circuit format according to the terminal state notification signal; and
- a comparator that outputs the error code having the error value when the circuit format identified by the first circuit format analysis unit is inconsistent with the circuit format identified by the third circuit format analysis unit.

8. The semiconductor device according to claim 1, further comprising:
- an emergency notification flag register that stores an emergency notification flag; and
- an emergency notification evaluation unit that outputs an error signal to the processing unit in response to a change in the error code from a normal value to the error value when the emergency notification flag has a first value,
- wherein the first circuit format analysis unit rewrites the emergency notification flag from a second value to the first value when the identified circuit format is a circuit format for emergency notification that has been previously set.

9. The semiconductor device according to claim 1, further comprising an invalid command analysis unit that generates the error code having the error value when the plurality of commands stored to the data stack includes an invalid command that is different from a command that has been previously specified.

10. The semiconductor device according to claim 1, wherein the forbidden condition includes a direct current path condition that specifies a connection state of the switching circuit group having potentials that a direct current could flow through a signal path included in the analog functional circuit which is to be updated.

11. The semiconductor device according to claim 1, wherein the processing unit refers to the error code and executes processing that has been previously set.

12. A command control method for a semiconductor device comprising an analog front-end unit that comprises a plurality of analog functional circuits and a switching circuit group for switching a circuit format and a circuit configuration of the plurality of analog functional circuits, a processing unit that comprises an arithmetic unit for executing a program and a memory for storing the program and a plurality of commands specifying at least a circuit format setting value that specifies the circuit format of the plurality of analog functional circuits, and a communication interface that performs communication between the analog front-end unit and the processing unit, the command control method comprising the steps of:
- receiving the plurality of commands from the processing unit and storing the plurality of commands to a data stack;
- identifying a circuit format of the analog functional circuit which is to be updated according to the circuit format setting value included in the plurality of commands received by the analog front-end unit;
- selecting, from a plurality of forbidden conditions describing a forbidden connection state for each circuit format, the forbidden condition corresponding to the circuit format;
- referring to the plurality of commands stored to the data stack and, when a circuit configuration of the analog functional circuit which is to be updated includes the connection state satisfying the forbidden condition, generating an error code having an error value, the error value indicating that the circuit configuration which is to be updated satisfies the forbidden condition;
- updating, when the error code has a normal value, a circuit configuration control value specifying a current circuit configuration of the analog functional circuit by the plurality of commands, the normal value indicating that the circuit configuration of the analog functional circuit which is to be updated does not satisfy the forbidden condition; and
- maintaining, when the error code has the error value, the circuit configuration control value irrespective of the plurality of commands.

13. The command control method according to claim 12, wherein in the identifying, an expected value of the circuit format setting value is compared with the circuit format setting value obtained from the data stack so as to identify the circuit format of the analog functional circuit which is to be updated.

14. The command control method according to claim 13, wherein
- in regard to the circuit format setting value, a Hamming distance between the setting values indicating different circuit formats is three or greater, and
- in the identifying, a circuit format corresponding to the expected value with a shortest Hamming distance from the circuit format setting value is identified as the circuit format of the analog functional circuit which is to be updated.

15. The command control method according to claim 14, wherein
- the circuit format setting value includes a plurality of switching values corresponding to respective circuit format control switches for switching the circuit format of the analog functional circuit, and at least one of the plurality of switching values is a redundant switching value including three or more consecutive identical values, and
- in the updating, majority processing is performed on the redundant switching value, and a value evaluated to have the greatest number in the majority processing is output as the switching value.

16. The command control method according to claim 12, wherein when the circuit format setting value is not included in the received plurality of commands, in the identifying, the circuit configuration control value is referred to, and the circuit format of the analog functional circuit which is to be updated is identified.

17. The command control method according to claim 12, further comprising:
- detecting that a current circuit format of the analog functional circuit determined according to the circuit configuration control value is an instrumentation amplifier composed of a plurality of amplifiers; and
- generating, when the current circuit format is the instrumentation amplifier, a reset command for initializing the circuit configuration control value at the time of updating the current circuit configuration control value.

18. The command control method according to claim 12, wherein
- the semiconductor device has a plurality of external input terminals that supply an input signal to the analog front-end unit,
- the command control method further comprises the steps of:
    - evaluating whether or not there is a sensor element connected to the external input terminal and outputting a terminal state notification signal; and
    - identifying an available circuit format according to the terminal state notification signal, and
- when the circuit format is inconsistent with the identified available circuit format, the error code having the error value is output.

19. The command control method according to claim 12, wherein when the identified circuit format is a circuit format for emergency notification that has been previously set, an error signal is output from the analog front-end unit to the processing unit in response to a change in the error code having the error value.

20. The command control method according to claim 12, further comprising the step of generating, when an invalid command different from a command previously specified is included in the plurality of received commands, the error code having the error value.

* * * * *